United States Patent
Gotoh

(10) Patent No.: US 8,692,616 B2
(45) Date of Patent: Apr. 8, 2014

(54) OPERATIONAL AMPLIFIER, ANALOG ARITHMETIC CIRCUIT, AND ANALOG TO DIGITAL CONVERTER

(71) Applicant: Fujitsu Limited, Kawasaki (JP)

(72) Inventor: Kunihiko Gotoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/735,056

(22) Filed: Jan. 7, 2013

(65) Prior Publication Data
US 2013/0257637 A1 Oct. 3, 2013

(30) Foreign Application Priority Data
Mar. 30, 2012 (JP) ................. 2012-080531

(51) Int. Cl.
*H03F 3/45* (2006.01)
(52) U.S. Cl.
USPC ........... 330/253; 330/252; 330/258; 330/255; 330/259; 330/260; 330/261
(58) Field of Classification Search
USPC .......... 330/252, 253, 255, 258, 259, 160, 261
See application file for complete search history.

(56) References Cited

U.S. PATENT DOCUMENTS

| | | | | |
|---|---|---|---|---|
| 5,323,121 A | * | 6/1994 | Butler | 330/252 |
| 5,420,540 A | * | 5/1995 | Butler | 330/255 |
| 5,523,718 A | * | 6/1996 | Butler | 330/255 |
| 6,710,654 B2 | * | 3/2004 | Parkhurst et al. | 330/252 |
| 6,998,917 B2 | * | 2/2006 | Kudo et al. | 330/258 |
| 7,176,760 B2 | * | 2/2007 | Jones | 330/253 |
| 7,737,782 B1 | | 6/2010 | Sudou | |
| 7,907,011 B2 | * | 3/2011 | Chung | 330/255 |

FOREIGN PATENT DOCUMENTS

JP 2010-166540 7/2010

* cited by examiner

*Primary Examiner* — Lam T Mai
(74) *Attorney, Agent, or Firm* — Fujitsu Patent Center

(57) ABSTRACT

A folded cascode operational amplifier includes a constant current source to output a constant current; a differential input stage to output a part of the constant current as a differential current based on a voltage difference between voltages input to an inverting input terminal and a non-inverting input terminal, and connected to the constant current source; and an output stage to output a remaining current obtained by subtracting the differential current from the constant current as an output stage current, and connected parallel to the differential input stage facing the constant current source.

8 Claims, 45 Drawing Sheets

FIG.6A

| VIN (VR: REFERENCE VOLTAGE) | DO | DA1 | VDA1 | VO =2×VIN−DA1×VR |
|---|---|---|---|---|
| +1 ≧ VIN/VR ≧ +1/4 | +01 | +1 | +VR | 2×VIN−VR |
| +1/4 > VIN/VR ≧ −1/4 | 00 | 0 | 0 | 2×VIN |
| −1/4 > VIN/VR ≧ −1 | −01 | −1 | −VR | 2×VIN+VR |

FIG.8A

| VIN (VR: REFERENCE VOLTAGE) | DO | DA =2DA2+DA1 | VDA2 | VDA1 | VO =4×VIN−DA×VR |
|---|---|---|---|---|---|
| +1 ≧ VIN/VR ≧ +5/8 | +011 | +3 | +VR | +VR | 4×VIN−3×VR |
| +5/8 > VIN/VR ≧ +3/8 | +010 | +2 | +VR | 0 | 4×VIN−2×VR |
| +3/8 > VIN/VR ≧ +1/8 | +001 | +1 | 0 | +VR | 4×VIN−VR |
| +1/8 > VIN/VR ≧ −1/8 | 000 | 0 | 0 | 0 | 4×VIN |
| −1/8 > VIN/VR ≧ −3/8 | −001 | −1 | 0 | −VR | 4×VIN+VR |
| −3/8 > VIN/VR ≧ −5/8 | −010 | −2 | −VR | 0 | 4×VIN+2×VR |
| −5/8 > VIN/VR ≧ −1 | −011 | −3 | −VR | −VR | 4×VIN+3×VR |

CS=CMDAC+CH
m=CS/CH

FIG.11

| ITEM | COMPUTATIONAL FORMULA | GENERAL FORMULA | AT 1.5b | AT 2.5b | COMPARISON |
|---|---|---|---|---|---|
| SIGNAL AMPLIFICATION FACTOR(m) | CS/CH | m | 2 | 4 | ×2 |
| CMDAC | CS=C0 (CONSTANT) | C0 | C0 | C0 | ×1 |
| CH | C0(CONSTANT) | C0/m | C0/2 | C0/4 | ×(1/2) |
| FEEDBACK AMOUNT(β) | CH/(CH+CMDAC) | 1/(m+1) | 1/3 | 1/5 | 3/5 |
| CL1 | (CH×CMDAC)/(CH+CMDAC) | C0/(m+1) | C0/3 | C0/5 | 3/5 |
| AMP OUTPUT PARASITIC CAPACITANCE | Cpo(CONSTANT) | Cpo | Cpo | Cpo | ×1 |
| RETARDATION COEFFICIENT 1 | CL1/β | C0 | C0 | C0 | ×1 |
| RETARDATION COEFFICIENT 2 | Cpo/β | (m+1)×Cpo | 3×C0 | 5×C0 | ×(5/3) |

FIG.13B

| RELATED-ART FOLDED CASCADE OPERATIONAL AMPLIFIER($K_a \geq 1$) | | |
|---|---|---|
| DIFFERENTIAL-INPUT POTENTIAL DIFFERENCE($\Delta VIA$) | OUTPUT CURRENT(IOP,IOM) | OPERATIONAL MODE |
| $|\Delta VIA/2Vod| < 1$ | $\pm(I0/2Vod) \times (\Delta VIA/2)$ | LINEAR OPERATION |
| $|\Delta VIA/2Vod| \geq 1$ | $\pm Idiff/2$(CONSTANT) | SR AREA |

(*)Vod=Vgs−Vth

FIG.16A

| FOLDED CASCADE OPERATIONAL AMPLIFIER ACCORDING TO EMBODIMENT (Ka<1) | | |
|---|---|---|
| DIFFERENTIAL-INPUT POTENTIAL DIFFERENCE (ΔVIA) | OUTPUT CURRENT (IOP,IOM) | OPERATIONAL MODE |
| \|ΔVIA/2Vod\|<Ka | ±(I0/2Vod)×(ΔVIA/2) | LINEAR OPERATION |
| \|ΔVIA/2Vod\|≧Ka | CONSTANT(±Ka×Idiff/2) | SR AREA |

(*)Vod=Vgs−Vth

FIG.18A

| VIN (VR: REFERENCE VOLTAGE) | DO | DA | VDA2 | VDA1A | VDA1B | VO =4×VIN−DA×VR |
|---|---|---|---|---|---|---|
| +1 ≧ VIN/VR ≧ +7/8 | +100 | +4 | +VR | 0 | 0 | 4×VIN−4×VR |
| +7/8 > VIN/VR ≧ +5/8 | +011 | +3 | 0 | +VR | +VR | 4×VIN−3×VR |
| +5/8 > VIN/VR ≧ +3/8 | +010 | +2 | 0 | +VR | 0 | 4×VIN−2×VR |
| +3/8 > VIN/VR ≧ +1/8 | +001 | +1 | 0 | 0 | +VR | 4×VIN−VR |
| +1/8 > VIN/VR ≧ −1/8 | 000 | 0 | 0 | 0 | 0 | 4×VIN |
| −1/8 > VIN/VR ≧ −3/8 | −001 | −1 | 0 | 0 | −VR | 4×VIN+VR |
| −3/8 > VIN/VR ≧ −5/8 | −010 | −2 | 0 | −VR | 0 | 4×VIN+2×VR |
| −5/8 > VIN/VR ≧ −7/8 | −011 | −3 | 0 | −VR | −VR | 4×VIN+3×VR |
| −7/8 > VIN/VR ≧ −1 | −100 | −4 | −VR | 0 | 0 | 4×VIN+4×VR |

FIG.20A

| VIN (VR: REFERENCE VOLTAGE) | DO | DA | VDA4 | VDA2 | VDA1A | VDA1B | VO =4×VIN−DA×VR |
|---|---|---|---|---|---|---|---|
| +1 ≧ VIN/VR ≧ +15/16 | +100.0 | +4.0 | +VR | 0 | 0 | 0 | 4×VIN−4.0×VR |
| +15/16 > VIN/VR ≧ +13/16 | +011.1 | +3.5 | 0 | +VR | +VR | +VR | 4×VIN−3.5×VR |
| ... | ... | ... | | | | | ... |
| +3/16 > VIN/VR ≧ +1/16 | +000.1 | +0.5 | 0 | 0 | +VR | +VR | 4×VIN−0.5×VR |
| +1/16 > VIN/VR ≧ −1/16 | 000.0 | 0 | 0 | 0 | 0 | 0 | 4×VIN |
| −1/16 > VIN/VR ≧ −3/16 | −000.1 | −0.5 | 0 | 0 | 0 | −VR | 4×VIN+0.5×VR |
| ... | ... | ... | | | | | ... |
| −13/16 > VIN/VR ≧ −15/16 | −011.1 | −3.5 | 0 | −VR | −VR | −VR | 4×VIN+3.5×VR |
| −15/16 > VIN/VR ≧ −1 | −100.0 | −4.0 | −VR | 0 | 0 | 0 | 4×VIN+4.0×VR |

FIG.23

| SETTINGS OF MDAC (COMMON ITEM) | | MDAC HAVING FOLDED CASCADE OPERATIONAL AMPLIFIER | | | | | | | ADVANTAGES OF EMBODIMENTS | | |
|---|---|---|---|---|---|---|---|---|---|---|---|
| | | DIFFERENCE BETWEEN MDAC SYSTEMS | | | OUTPUT RANGE OF MDAC | INPUT RANGE OF AMP | DIFFERENCE BETWEEN AMPs | | | COMPARISON OF ANALOG COMPUTATIONAL SPEED | OTHER ADVANTAGES OF OPERATIONAL AMPLIFIER |
| SIGNAL AMPLIFI-CATION FACTOR m | FEEDBACK AMOUNT ($\beta$) | MDAC SYSTEM | NUMBER OF BITS sub-ADC·MDAC | $2^{nb}/m$ | $VO_{FS}/VI_{FS}$ | $\Delta V1A/2Vod$ | AMP | CURRENT RATIO Ka | $C_{po}$ RATIO $\propto Ka$ | DELAY TIME DUE TO $C_{po}$ $\propto (C_{po}/\beta)$ | AMP CURRENT (Iamp) AND AMP AREA $\propto (1+Ka)$ |
| 4 | 1/5 | COMPARATIVE EXAMPLE 90A | 2.5b | 1.4 | 1 | ≦1 | COMPARATIVE EXAMPLE 74 | Ka=1 | 1 (Ref.) | 1 (Ref.) | 1 (Ref.) |
| 4 | 1/5 | EMBODIMENT 310 | 3b | 2 | 1/2 | ≦1/2 | EMBODIMENT 200A | Ka=1/2 | 1/2 (50% REDUCTION) | 1/2 (50% REDUCTION) | 3/4 (25% REDUCTION) |
| 4 | 1/5 | EMBODIMENT 410 | 4b | 4 | 1/4 | ≦1/4 | EMBODIMENT 200A | Ka=1/4 | 1/4 (70% REDUCTION) | 1/4 (75% REDUCTION) | 5/8 (37% REDUCTION) |
| ×2 (REFERENCE) | 1/3 | COMPARATIVE EXAMPLE 70A | 1.5b | 1.4 | 1 | ≦2 | COMPARATIVE EXAMPLE 74 | Ka=1 | 1 (SAME) | 3/5 (40% LESS) | 1 (SAME) |

OPERATIONAL AMPLIFIER, ANALOG ARITHMETIC CIRCUIT, AND ANALOG TO DIGITAL CONVERTER

CROSS-REFERENCE TO RELATED APPLICATION

This patent application is based upon, and claims the benefit of priority of Japanese Patent Application No. 2012-080531 filed on Mar. 30, 2012, the entire contents of which are incorporated herein by reference.

FIELD

The embodiments discussed herein relate to an operational amplifier, an analog arithmetic circuit, and an analog to digital converter.

BACKGROUND

There is disclosed in the art a complementary metal oxide semiconductor (CMOS) operational amplifier circuit having a differential input circuit part and a folded cascode circuit part.

The differential input circuit part includes a p-type metal oxide semiconductor (p-type MOS) transistor differential pair and an n-type metal oxide semiconductor (n-type MOS) transistor differential pair that have common positive and negative input terminals, a first constant current circuit configured to supply an operating current to the two transistor differential pairs, and a current switching circuit configured to switch the supply of current of the first constant current circuit to the two transistor differential pairs.

The folded cascode circuit part includes a cascode current mirror circuit, second and third constant current circuits, each of which is connected to the cascode current mirror circuit in series, and a bias voltage source configured to apply a bias voltage to the cascode current mirror circuit.

The bias voltage source raises the bias voltage while the operating current flows in the n-type MOS transistor differential pair.

RELATED ART DOCUMENT

Patent Document

Patent Document 1: Japanese Laid-open Patent Publication No. 2010-166540

In general, a circuit of the CMOS operational amplifier circuit having a differential input stage such as the differential input circuit part and an output stage such as the folded cascode circuit part is designed such that a current ratio of an output current Iout to an output current Id of the differential input stage that is represented by Ka=Iout/Id satisfies Ka≥1.

That is, the sum of the output current Id of the differential input stage and the output current Iout of the output stage equates to a current I supplied from a constant current source. Hence, the output stage is configured to have a sufficient size (capacitance) such that the output current Iout (=I−Id) flows in the output stage even if the output current Id of the differential input stage is reduced.

Accordingly, the related art folded cascode operational amplifier generally has an output stage having a relatively large size (capacitance).

However, when the size of the output stage is large, the parasitic capacitance of the operational amplifier may be increased.

Accordingly, when the folded cascode operational amplifier is applied to an arithmetic circuit such as an analog to digital converter (ADC), an arithmetic operation speed may be lowered due to a large parasitic capacitance. The degraded arithmetic operation speed may be observed not only in the folded cascode operational amplifier but also be observed in all types of operational amplifiers. Further, the degraded arithmetic operation speed may be observed not only in the ADC. The degraded arithmetic operation speed may be observed in all the general operational amplifiers when the amplification factor is raised in an analog amplifier circuit. This is because the operational amplifier generally has a parasitic capacitance, and hence, an adverse effect of the parasitic capacitance is increased by raising the amplification factor.

The degraded arithmetic operation speed may be improved by reducing the size of the output stage. However, the output stage having a reduced size may fail to sufficiently absorb the current of the differential input stage, which may result in unstable operations of the operational amplifiers. There presently appears to be no operational amplifier that includes the reduced-sized output stage.

As described above, there seems to be no operational amplifier having a reduced-sized output stage and exhibiting stable operations among the related art operational amplifies.

SUMMARY

According to an aspect of the embodiments, there is provided a folded cascode operational amplifier that includes a constant current source configured to output constant current; a differential input stage connected to the constant current source, the differential input stage being configured to output a part of the constant current output from the constant current source as a differential current based on a voltage difference between a voltage input to an inverting input terminal and a voltage input to a non-inverting input terminal; and an output stage connected parallel to the differential input stage with respect to the constant current source, the output stage being configured to output a remaining current as an output stage current, the remaining current being obtained by subtracting the differential current from the constant current output from the constant current source.

The object and advantages of the invention will be realized and attained by means of the elements and combinations particularly pointed out in the appended claims.

It is to be understood that both the foregoing general description and the following detailed description are exemplary and explanatory and are not restrictive of the invention.

Additional objects and advantages of the embodiments will be set forth in part in the description which follows, and in part will be obvious from the description, or may be learned by practice of the invention.

BRIEF DESCRIPTION OF THE DRAWINGS

FIG. 6A is a diagram illustrating an operation of the ADC cell 60 in a table form.

FIG. 8A is a diagram illustrating an operation of the ADC cell 80 in a table form.

FIG. 11 is a diagram illustrating a comparison between a specification of a 1.5b-MDAC 70A and a specification of a 2.5b-MDAC 90A;

FIGS. 13A to 13D are diagrams illustrating a circuit configuration and an operating area of a full differential output type folded cascode operational amplifier 100C;

FIGS. 16A and 16B are diagrams illustrating an operating mode and an operating area of the folded cascode operational amplifier according to the embodiment;

FIG. 18A is a diagram illustrating an operation of the ADC cell 300 in a table form.

FIG. 20A is a diagram illustrating an operation of the ADC cell 400 in a table form.

FIG. 23 is a diagram illustrating comparison results of operational amplifiers 200A to 200D according to embodiments and MDACs 310 and 410 according to embodiments, and a comparative example of an operational amplifier 74 and comparative examples of the MDACs 70A and 90A in a table form.

DESCRIPTION OF EMBODIMENTS

According to one aspect of the invention, there is provided an operational amplifier, an analog arithmetic circuit, and an analog to digital converter that may be capable of reducing a size of an output stage.

A description is given, with reference to the accompanying drawings, of preferred embodiments to which an operational amplifier, an analog arithmetic circuit, and an analog to digital converter are applied.

Prior to illustration of the embodiments of the operational amplifier, the analog arithmetic circuit, and the analog to digital converter, comparative examples of an operational amplifier, an analog arithmetic circuit, and an analog to digital converter are described.

Comparative Example

Figure 1:
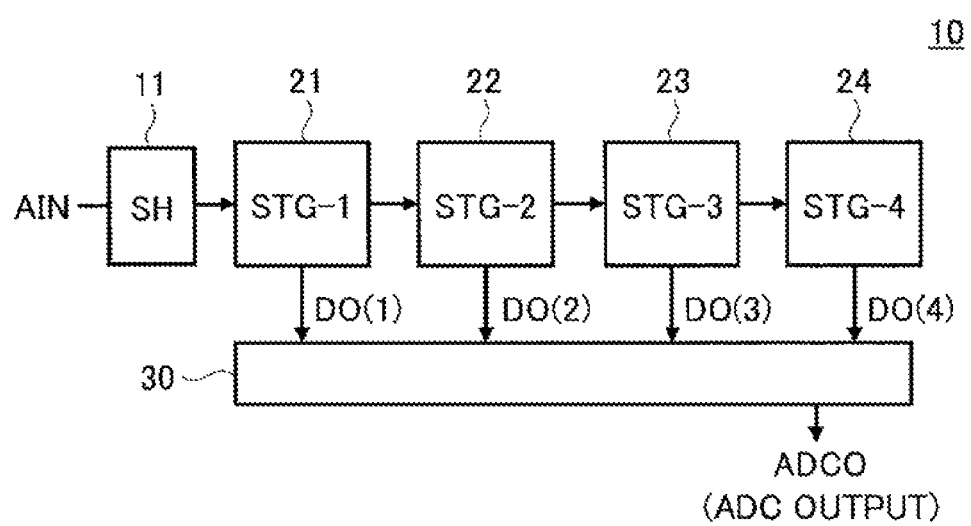
FIG. 1 is a diagram illustrating a comparative example of a pipeline analog to digital converter (ADC) 10.

FIG. 1 is a diagram illustrating a comparative example of a pipeline analog to digital converter (ADC).

The comparative example of the pipeline ADC 10 includes a sample and hold (SH) circuit 11, ADC cells 21 to 24, and a digital code generating circuit 30.

The SH circuit 11 is configured to sample analog input signals AIN to hold the sampled analog input signals AIN, and output the sampled analog input signals AIN to the ADC cell 21.

Each of the ADC cells 21 to 24 is formed of a 1.5-bit ADC cell, and the ADC cells 21 to 24 are connected in series. The ADC cells 21 to 24 are configured to form respective stages STG1 to 4 of a pipeline ADC 10.

The ADC cell 21 is configured to receive the analog signal AIN, convert the received analog input signal AIN into a three-valued (1.5 bits) digital code DO(1), and output the converted three-valued digital code DO(1) to the digital code generating circuit 30. The ADC cell 21 is further configured to output an analog output signal VO(1) representing a quantization error generated by the conversion.

Each of the ADC cells 22 to 24 includes a circuit configuration similar to that of the ADC cell 21. The ADC cells 22 and 23 utilize analog output signals output from the ADC cells 21 and 22 of the previous respective stages as analog input signals. That is, each of the ADC cells 22 and 23 includes a setting of VIN(N)=VO(N−1). The ADC cells 22 to 23 operate in a manner similar to the operation of the ADC cell 21. That is, the ADC cells 22 to 23 output digital codes DO(2) and DO(3) corresponding to analog input signals of the respective stages. Further, the ADC cells 22 and 23 are further configured to output analog output signals VO(2) and VO(3) representing respective quantization errors generated by the conversion. The output analog output signals VO(2) and VO(3) are utilized as respective input signals of the ADC cells 23 and 24 of subsequent stages.

The ADC cell 24 is configured to convert an analog output signal received from the ADC cell 23 of the previous stage into a digital code DO(4), and output the converted digital code DO(4) to the digital code generating circuit 30.

The digital code generating circuit 30 is configured to output respective digital output signals ADCO based on the digital codes DO(1) to DO(4) received from the ADC cells 21 to 24, respectively. The digital code generating circuit 30 is configured to output the digital output signals ADCO by generating the digital codes.

Figure 2:
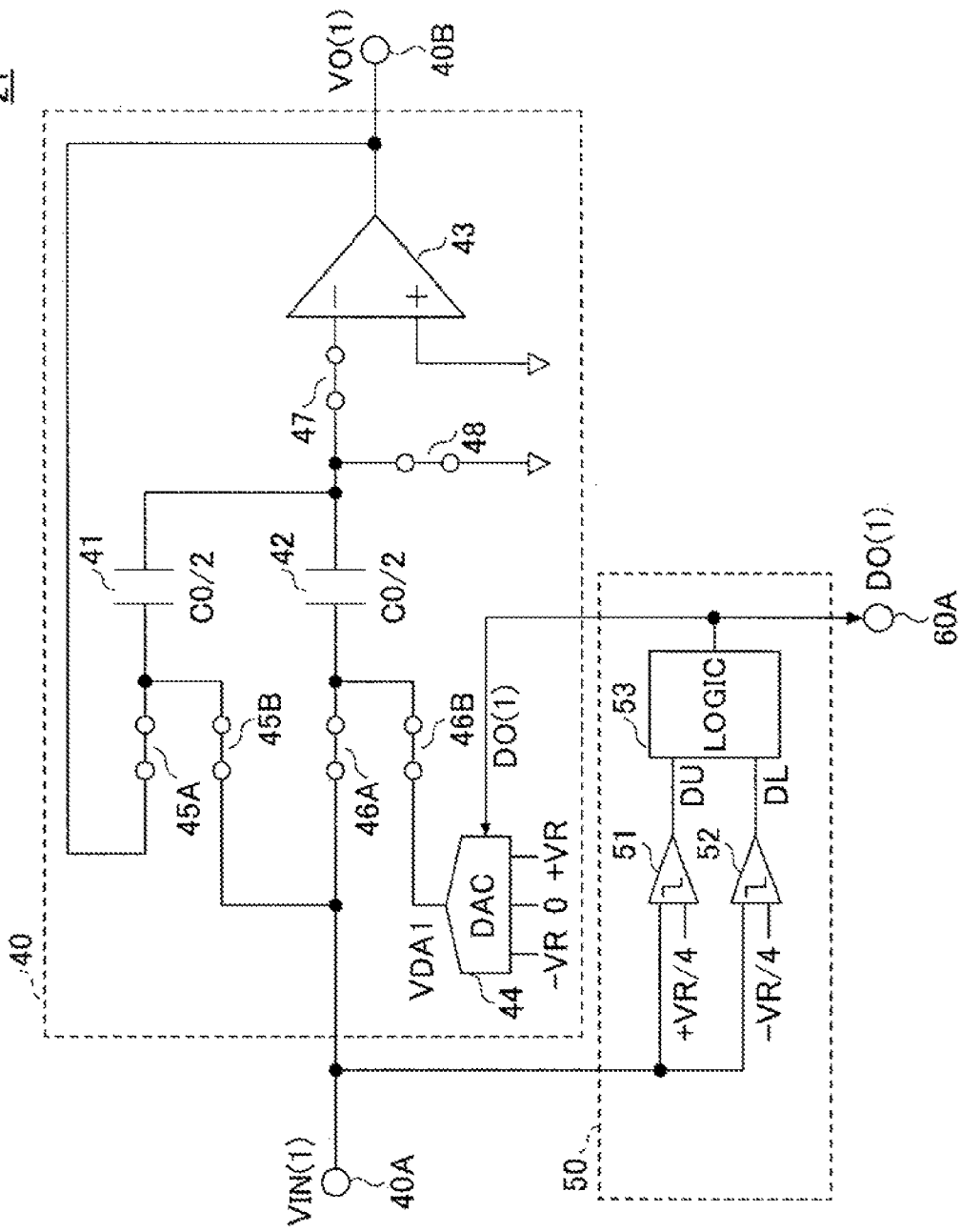
FIG. 2 is a diagram illustrating a circuit configuration of a 1.5b-ADC cell 21 having a signal amplification factor of 2 in the comparative example of the pipeline ADC 10.

FIG. 2 is a diagram illustrating a circuit configuration of the ADC cell 21 of the comparative example of the pipeline ADC 10. The ADC cells 22 to 24 include circuit configurations similar to that of the ADC cell 21, and hence, the circuit configuration of the ADC 21 is described as representative example of the ADC cells 21 to 24. Further, an analog signal supplied to the ADC cell 21 is expressed as an analog input signal VIN1.

The ADC cell 21 includes a multiplying digital to analog converter (MDAC) 40 and a sub-ADC 50. A signal amplification factor m of the ADC cell 21 is 2 (m=2).

The MDAC 40 is formed of a 1.5b-MDAC that includes capacitors 41 and 42, an operational amplifier 43, a digital to analog converter (DAC) 44, and switches 45A, 45B, 46A, 46B, 47, and 48.

First ends (terminals on the left side of FIG. 2) of the capacitors 41 and 42 are connected to an input terminal 40A of the MDAC 40 via the switches 45B and 46A. Second ends (terminals on the right side of FIG. 2) of the capacitors 41 and 42 are connected to each other at a connection point, which is then connected to the switches 47 and 48. Capacitances of the respective capacitors 41 and 42 are represented by C0/2. Note that C0 represents a predetermined standard capacitance.

The operational amplifier 43 includes an inverting input terminal that is connected to second ends (terminals on the right side of FIG. 2) of the capacitors 41 and 42 via the switch 47, a non-inverting input terminal that is grounded, and an output terminal that is connected to a first end (terminal on the left side of FIG. 2) of the switch 45A as well as being connected to an output terminal 40B of the MDAC 40. The operational amplifier 43 is configured to input a voltage at the connection point of the capacitors 41 and 42 to its inverting input terminal and output the analog output signal VO(1) to the output terminal 40B.

A digital to analog converter (DAC) 44 is configured to output an analog signal represented by m×DO(1)×VR/2 based on the digital code DO(1) output from the sub-ADC 50.

The switches 45A, 45B, 46A, 46B, 47, and 48 are connected as illustrated in FIG. 2.

The sub-ADC 50 is formed of a 1.5b-sub-ADC that includes comparators 51 and 52, and a logic circuit 53.

The sub-ADC 50 is configured to compare the analog input signal VIN1 based on a comparison voltage (+VR/4) and a comparison voltage (−VR/4), and output a three-valued digital code DO(1) according to a level of the analog input signal VIN1.

The comparator 51 switches an output signal DU to a high level (H) when the analog input signal VIN1 is higher than the comparison voltage (+VR/4), whereas the comparator 51 switches the output signal DU to a low level (L) when the analog input signal VIN1 is lower than the comparison voltage (+VR/4).

The comparator 52 switches an output signal DL to a high level (H) when the analog input signal VIN1 is higher than a comparison voltage (−VR/4), whereas the comparator 52 switches the output signal DL to a low level (L) when the analog input signal VIN1 is lower than the comparison voltage (−VR/4).

The logic circuit 53 is configured to output "+1" as the digital code DO(1) when the signal DU and the signal DL are both at a high level (H), and output "0" as the digital code DO(1) when the signal DU is at a low level (L) and the signal DL is at a high level (H). Further, the logic circuit 53 is configured to output "−1" as the digital code DO(1) when the signal DU and the signal DL are both at a low level (L). The digital code DO(1) is expressed by a three-value representation composed of "+1", "0" and "−1".

The DAC 44 is configured to receive a reference voltage (−VR, 0, +VR) and the digital code DO(1), and output an analog signal represented by m×DO(1)×(VR/2). When the amplification factor m is 2, and the digital code DO(1) is one of +1, 0, and −1, the analog signal becomes a corresponding one of +VR, 0, and −VR.

Next, operations of the MDAC 40 are described. Initially, the input terminal 40A is connected to the first end (terminal on the left side of FIG. 2) of the capacitor 41 by switching OFF (open) the switch 45A and switching ON (close) the switch 45B. Likewise, the input terminal 40A is connected to the first end (terminal on the left side of FIG. 2) of the capacitor 42 by switching ON (close) the switch 46A and switching OFF (open) the switch 46B. Moreover, a reference potential is set as a voltage at the connection point of second ends of the capacitors 41 and 42 that are connected to each other by switching ON the switch 48. Accordingly, the first ends (terminals on the left side in FIG. 2) of the capacitors 41 and 42 are charged with the analog input signal VIN1 supplied to the input terminal 40A.

Subsequently, an output terminal of the operational amplifier 43 is connected to a first end (terminal on the left side of FIG. 2) of the capacitor 41 by switching ON (close) the switch 45A and switching OFF (open) the switch 45B. Likewise, an output terminal of the DAC 44 is connected to a first end (terminal on the left side of FIG. 2) of the capacitor 42 by switching OFF (open) the switch 46A and switching ON (close) the switch 46B. As a result, a connection between the connection point of second ends of the capacitors 41 and 42 and the reference potential is disconnected by switching OFF (open) the switch 48. The analog output signal VO(1) of the operational amplifier 43 is represented by the following formula.

$$VO(1)=2\times VIN(1)-DO(1)\times VR$$

As described above, the ADC cell 21 is configured to perform an analog to digital conversion corresponding to a signal level of the analog input signal VIN1 supplied within a reference voltage range of +VR and −VR.

Initially, the analog input signal VIN1 is divided into three areas (i.e., three values) by utilizing the two comparators 51 and 52, and a first digital code for the analog input signal VIN1 having the three areas (three values) is determined as DO(1)=(−1, 0, 1). Note that comparison levels of the comparators 51 and 52 are set as +VR/4 and −VR/4.

The MDAC 40 outputs an analog output signal VO(1) by adding the DO(1)×VR to or subtracting DO(1)×VR from a result of a doubled analog input signal VIN1 (=2×VI). The analog output signal VO(1) is represented by the following formula. Note that the digital code DO(1) is any one of −1, 0 and 1.

$$VO(1)=2\times VIN(1)-DO(1)\times VR$$

The above operation may also be performed by the ADC cells 22 to 24. Each of the ADC cells 22 to 24 is configured to output digital codes DO(2), DO(3), and DO(4)=(−1, 0, 1). The digital codes DO(1) to DO(4) output from the ADC cells 21 to 24 are supplied to the digital code generating circuit 30.

Figure 3:
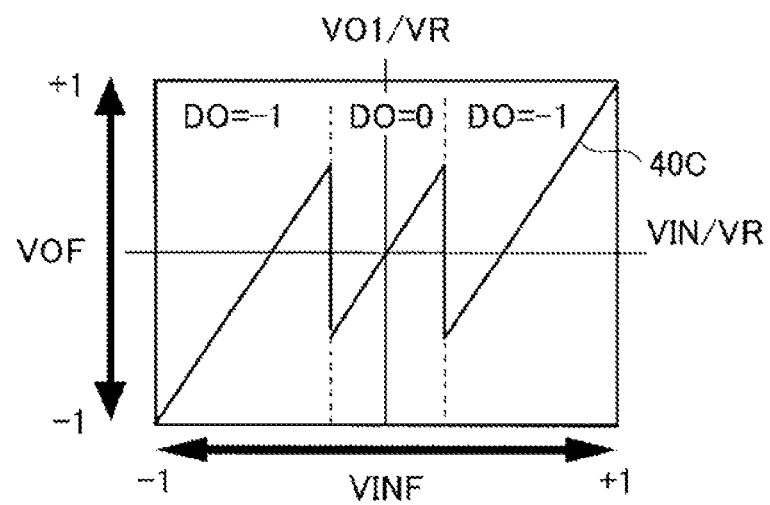
FIG. 3 is a graph illustrating input-output properties of the ADC cell 21.

FIG. 3 is a graph illustrating input-output properties of the ADC cell 21.

In FIG. 3, a horizontal axis indicates an analog input signal represented by VIN/VR, and a vertical axis indicates an analog output signal represented by VO(1)/VR. FIG. 3 illustrates the following properties of the analog output signal VO(1).

That is, VO(1)=2×VIN+VR when −1≤VIN/VR<−¼; VO(1)=2×VIN when −¼≤VIN/VR≤+¼; and VO(1)=2×VIN−VR when +¼≤VIN/VR≤1. An input range VINF in the horizontal direction is ±1, and an output range in the vertical direction is ±1.

Figure 4:
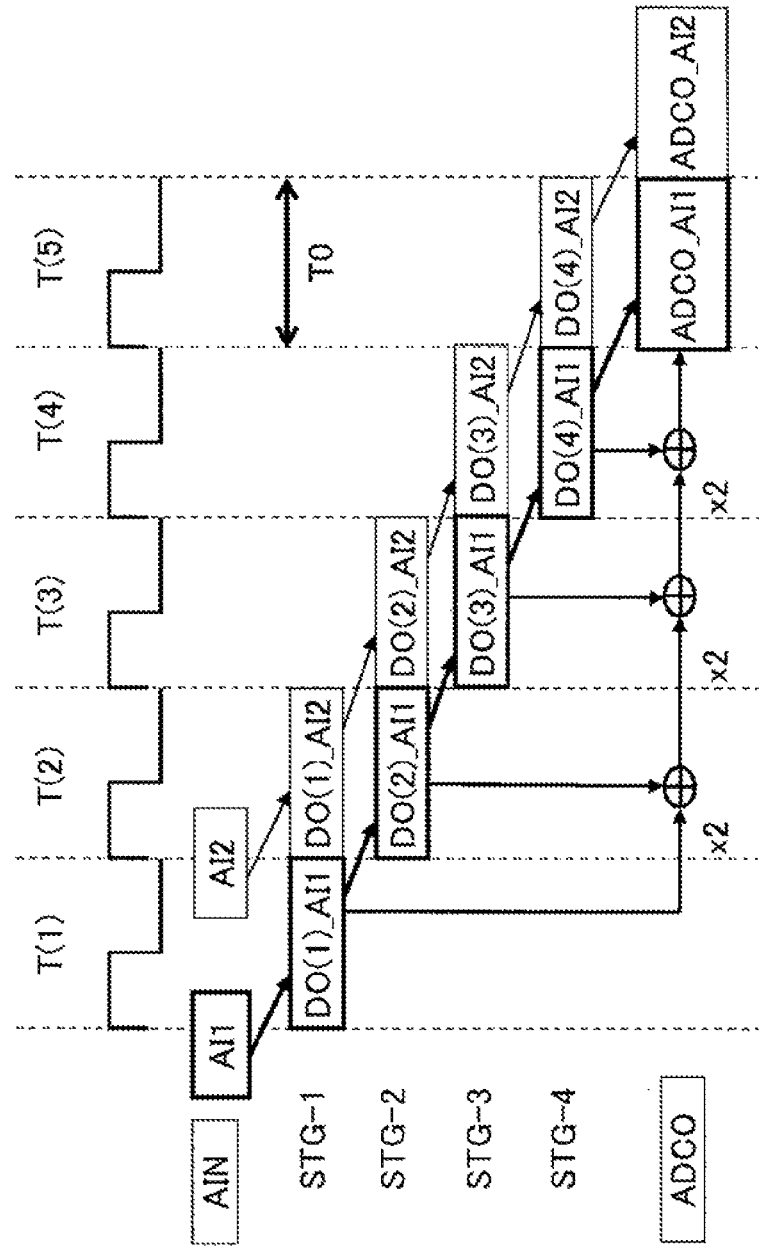
FIG. 4 is a timing chart illustrating a data flow in the comparative example of the pipeline ADC 10.

FIG. 4 is a timing chart illustrating a data flow in the comparative example of the pipeline ADC 10. FIG. 4 illustrates a data transition process when data AI1 and AI2 are chronologically input in series to the ADC cells 21 to 24 of respective stages STG1 to STG4.

In FIG. 4, periods T(1) to T(5) represent five sequential periods where arithmetic operations are carried out in the ADC cells 21 to 24 of the respective stages STG1 to STG4. All the periods T(1) to T(5) have a constant period T0.

The arithmetic operation is performed on data AI1 in the stage STG1 of the period T(1) to obtain a digital code DO(1)_AI1. Subsequently, the digital codes DO(2)_AI1 to DO(4)_AI1 are obtained in the stages STG2 to STG4 of the periods T(2) to T(4). The digital codes DO(1)_AI1 to DO(4)_AI1 are respectively obtained by doubling the digital codes of the previous stages, respectively, and the obtained digital codes DO(1)_AI1 to DO(4)_AI1 are added to the digital codes of the subsequent stages. Accordingly, a digital output signal ADCO_AI1 may be obtained in the period T(5).

Similarly, the digital codes DO(1)_AI2 to DO(4)_AI2 are obtained in the stages STG1 to STG4 of the periods T(2) to T(5), and a digital output signal ADCO_AI2 is obtained in a period subsequent to the period T(5).

Figure 5A:
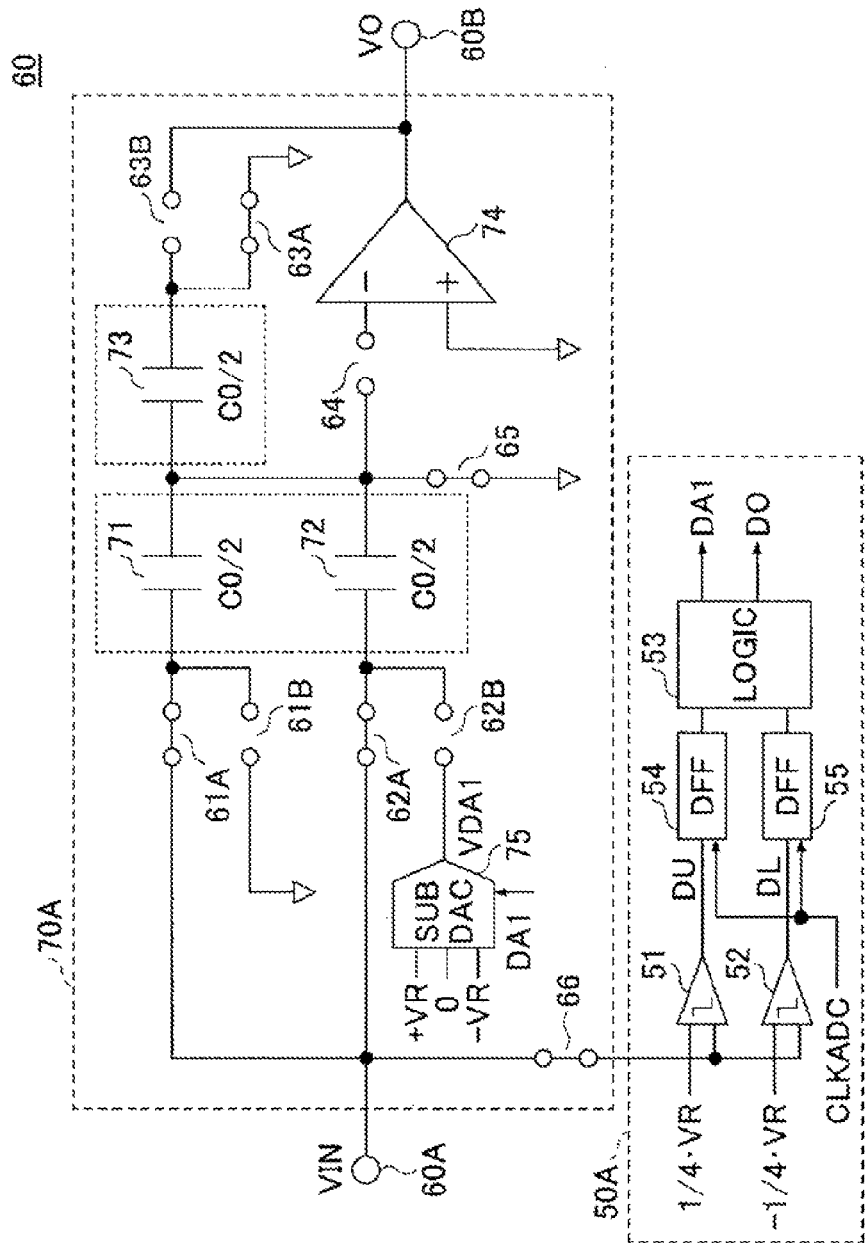
FIGS. 5A and 5B are diagrams illustrating a circuit configuration of a 1.5b-ADC cell 60 having a signal amplification factor of 2 in the comparative example of the pipeline ADC 10.
Figure 5B:
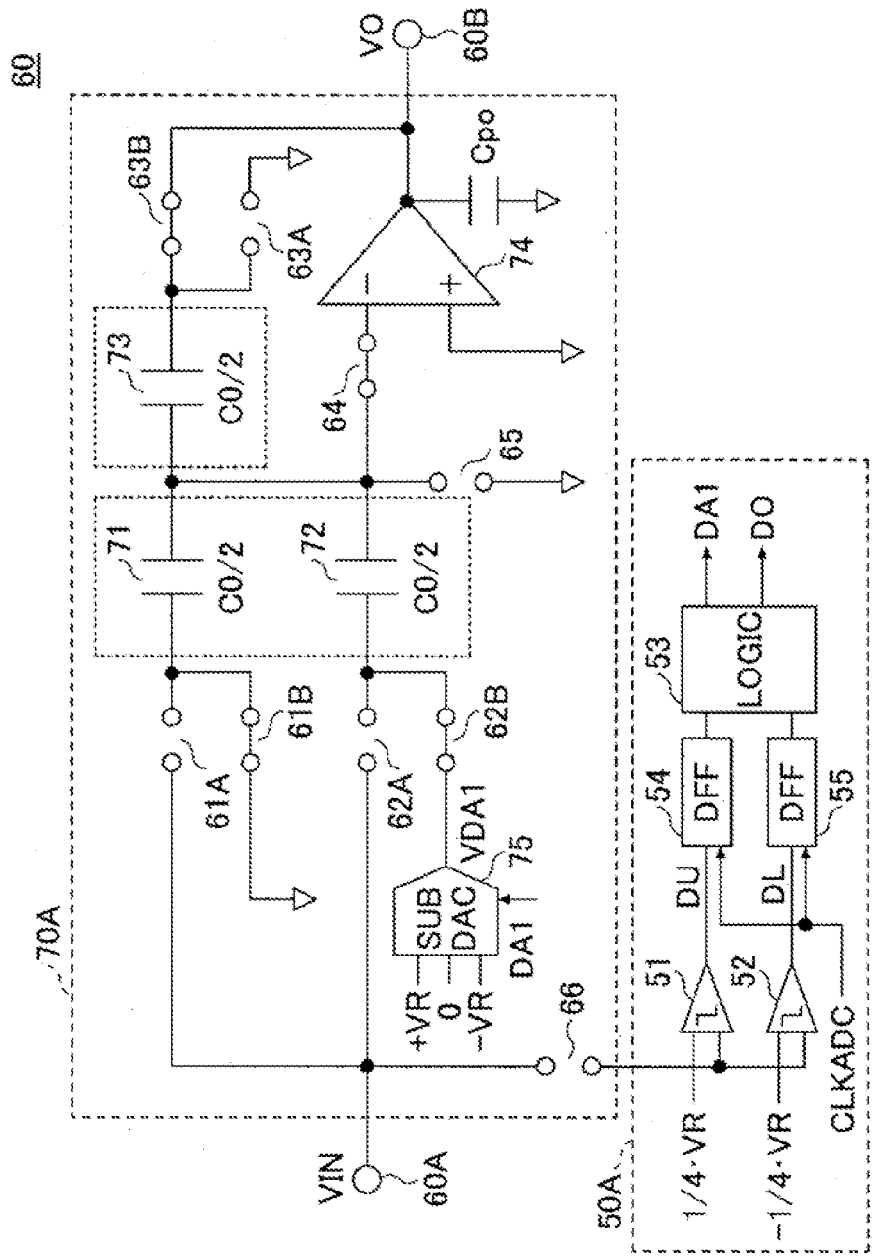

FIGS. 5A and 5B are diagrams illustrating a circuit configuration of an ADC cell 60 according to a comparative example. More specifically, FIG. 5A illustrates a connection status of the ADC cell 60 in a sampling operation, and FIG. 5B illustrates a connection status of the ADC cell 60 in an analog arithmetic operation. The ADC cell 60 of the comparative example 21 is a 1.5b-ADC cell 60, which is obtained by modifying the ADC cell 21 illustrated in FIG. 2.

The ADC cell 60 includes a multiplying digital to analog converter (MDAC) 70A and a sub-ADC 50A. A signal amplification factor m of the ADC cell 60 is 2 (m=2).

The MDAC 70A is a 1.5b-MDAC that includes capacitors 71, 72, and 73, an operational amplifier 74, a digital to analog converter (DAC) 75, and switches 61A, 61B, 62A, 62B, 63A, 63B, 64, 65, and 66.

First ends (terminals on the left side of FIGS. 5A and 5B) of the capacitors 71 and 72 are connected to an input terminal 60A of the ADC cell 60 via the respective switches 61A and 62A. Second ends (terminals on the right side of FIGS. 5A and 5B) of the capacitors 71 and 72 are connected to each other, and are then connected to a first end (a terminal on the left side of FIGS. 5A and 5B) of the capacitor 73, and also to the switches 64 and 65.

The first end (a terminal on the left side of FIGS. 5A and 5B) of the capacitor 73 is connected to second ends (terminals on the right side of FIGS. 5A and 5B) of the capacitors 71 and 72, and second end (a terminal on the right side of FIGS. 5A and 5B) of the capacitor 73 is connected to the switches 63A and 63B. The second end (a terminal on the right side of FIGS. 5A and 5B) of the capacitor 73 is connected to an output terminal of the operational amplifier 74 via the switch 63B. A second end of a switch 63A is grounded.

Note that capacitances of the capacitors 71, 72 and 73 are C0/2. Note that C0 represents a predetermined standard capacitance.

The operational amplifier 74 includes an inverting input terminal that is connected to a connection point of the first end (a terminal on the left side of FIGS. 5A and 5B) of the capacitor 73 and second ends (terminals on the right side of FIGS. 5A and 5B) of the capacitors 71 and 72 via the switch 64. Further, the operational amplifier 74 includes a non-inverting input terminal that is grounded, and an output terminal that is connected to the output terminal 60B of the ADC cell 60 as well as being connected to the second end (a terminal on the right side of FIGS. 5A and 5B) of the capacitor 73 via the switch 63B. The operational amplifier 74 is configured to input a voltage at the connection point of the capacitors 71, 72 and 73 to its inverting input terminal, and output the analog output signal VO to the output terminal 60B.

A digital to analog converter (DAC) 75 is configured to output an analog signal represented by m×DA1×VR/2 based on the add-subtract count DA1 output from the sub-ADC 50.

The switches 61A, 61B, 62A, 62B, 63A, 63B, 64, 65, and 66 are connected as illustrated in FIGS. 5A and 5B.

The sub-ADC 50A is formed of a 1.5b sub-ADC circuit that includes comparators 51 and 52, a logic circuit 53, and data flip-flops (DFFs) 54 and 55. The DFFs 54 and 55 are respectively connected between output terminals of the comparators 51 and 52 and input terminals of the logic circuit 53. Hence, the DFFs 54 and 55 output, when a clock CLKADC is at a high (H) level, output signals of the comparators 51 and 52 to the logic circuit 53.

The sub-ADC 50A is the same as the sub-ADC 50 illustrated in FIG. 2. The sub-ADC 50A is configured to compare an analog input signal VIN based on a comparison voltage (+VR/4) and a comparison voltage (−VR/4), and output a three-valued digital code DO and the add-subtract count DA1 according to a level of the analog input signal VIN.

The comparator 51 switches an output signal DU to a high level (H) when the analog input signal VIN is higher than the comparison voltage (+VR/4), whereas the comparator 51 switches an output signal DU to a low level (L) when the analog input signal VIN is lower than the comparison voltage (+VR/4).

The comparator 52 switches an output signal DL to a high level (H) when the analog input signal VIN is higher than a comparison voltage (−VR/4), whereas the comparator 52 switches an output signal DL to a low level (L) when the analog input signal VIN is lower than the comparison voltage (−VR/4).

The logic circuit 53 is configured to output "+01" as the digital code DO(1) as well as outputting "+1" as the add-subtract count DA1 when the signal DU and the signal DL are both at a high level (H).

The logic circuit 53 is configured to output "0" as the digital code DO(1) as well as outputting "0" as the add-subtract count DA1 when the signal DU is at a low level (L) and the signal DL is at a high level (H).

Further, the logic circuit 53 is configured to output "−01" as the digital code DO(1) as well as outputting "−1" as the add-subtract count DA1 when the signal DU and the signal DL are both at a low level (L).

The digital code DO(1) is expressed by a three-value representation composed of "+01", "0", and "−1", and the add-subtract count DA1 is expressed by a three-value representation composed of "+1", "0", and "−1".

The DAC 75 is the same as the DAC 44 illustrated in FIG. 2. The DAC 75 is configured to receive a reference voltage (−VR, 0, +VR) and the add-subtract count DA1, and output an analog signal VDA1 represented by m×DA1×(VR/2). When the amplification factor m is 2, and the add-subtract count DA1 is one of +1, 0, and −1, the analog signal VDA1 becomes a corresponding one of +VR, 0, and −VR. The add-subtract count DA1 is supplied from the logic circuit 53 to the DAC 75.

Next, operations of the MDAC 70A are described. Initially, the switches 61A, 62A, 63A, 65, and 66 are switched ON (close) while the switches 61B, 62B, 63B, and 64 are switched OFF (open) in an sampling operation illustrated in FIG. 5A. As a result, an input terminal 60A is connected to the first ends (terminals on the left side of FIG. 5A) of the capacitors 71 and 72.

Further, a reference potential is set as a voltage at the connection point of the capacitors 71, 72, and 73. Thus, the capacitor 73 is reset by discharging electric charges.

Accordingly, the first ends (terminals on the left side in FIG. 5A) of the capacitors 71 and 72 are charged with the analog input signal VIN supplied to the input terminal 60A.

Subsequently, the switches 61A, 62A, 63A, 65, and 66 are switched OFF (open) while the switches 61B, 62B, 63B, and 64 are switched ON (close) in an analog arithmetic operation illustrated in FIG. 5B.

As a result, the inverting input terminal of the operational amplifier 74 is connected to the connection point of the capacitors 71, 72, and 73. Further, the first end (a terminal on the left side of FIG. 5B) of the capacitor 71 is grounded via the switch 61B, the first end (a terminal on the left side of FIG. 5B) of the capacitor 72 is connected to the output terminal of the DAC 75 via the switch 62B, and second end (a terminal on the right side of FIG. 5B) of the capacitor 73 is connected to the output terminal of the operational amplifier 74 via the switch 63B. The analog output signal VO of the operational amplifier 74 is represented by the following formula.

$$VO(1) = 2 \times VIN - DA1 \times VR$$

A general formula of the above formula is $VO(1) = m \times VIN - DA1 \times VR$, where m represents a signal amplification factor. The signal amplification factor m of the ADC cell 60 illustrated in FIGS. 5A and 5B is 2 (m=2). The signal amplification factor is determined by a ratio of a synthetic capacitance (C0/2+C0/2=C0) of the capacitors 71 and 72 and a capacitance (C0/2) of the capacitor 73.

The signal amplification factor is determined by the above ratio because the first end (a terminal on the left side of FIGS. 5A and 5B) of the capacitor 73 acquires the amount of charges having an opposite sign that equates to a total amount of charges generated in the second ends (terminals on the right side of FIGS. 5A and 5B) of the capacitors 71 and 72 while performing a sampling operation.

As described above, the ADC cell 60 is configured to perform an analog to digital conversion corresponding to a signal level of the analog input signal VIN supplied within a reference voltage range of +VR and −VR.

Initially, the analog input signal VIN is divided into three areas (i.e., three values) by utilizing the two comparators 51 and 52, and an add-subtract count for the analog input signal VIN having the three areas (i.e., three values) is determined as DA1=(−1, 0, 1). Note that comparison levels of the comparators 51 and 52 are set as +VR/4 and −VR/4.

The MDAC 70A outputs an analog output signal VO by adding the DA1×VR to or subtracting the DA1×VR from a result of a doubled analog input signal VIN (=2×VIN). The analog output signal VO is represented by the following formula. Note that the add-subtract count DA1 is any one of −1, 0 and −1.

$$VO = 2 \times VIN - DA1 \times VR$$

Figure 6B:
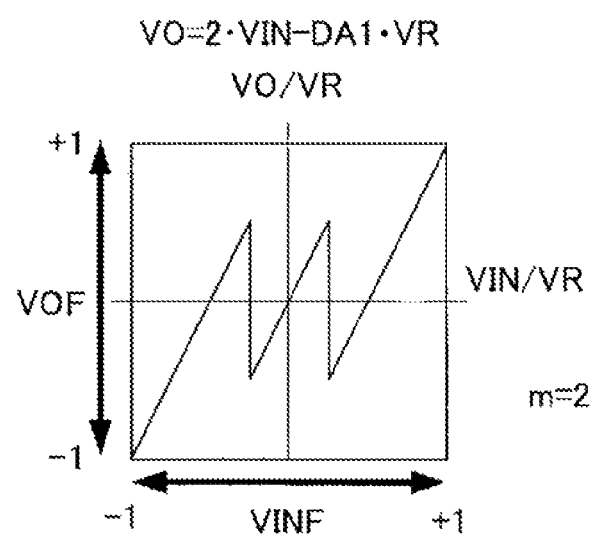
FIG. 6B is a diagram illustrating input-output properties of the ADC cell 60.

FIG. 6A is a diagram illustrating an operation of the ADC cell 60 in a table form, and FIG. 6B is a diagram illustrating input-output properties of the ADC cell 60. In FIG. 6B, a horizontal axis indicates an analog input signal represented by VIN/VR, and a vertical axis indicates an analog output signal represented by VO/VR.

FIG. 6A illustrates an analog input signal VIN(Vcmp), a digital code DO, an add-subtract count DA1, an analog signal VDA1, and an analog output signal VO. Note that the analog input signal VIN supplied to the comparators 51 and 52 is expressed as an "analog input signal VIN(Vcmp)".

The digital code DO is "+01", the add-subtract count DA1 is "+1", the analog signal VDA1 is "+VR", and the analog output signal VO is VO=2×VIN−VR when the analog input signal VIN(Vcmp) is +¼<VIN/VR≤+1.

The digital code DO is "00", the add-subtract count DA1 is "0", the analog signal VDA1 is "0", and the analog output signal VO is VO=2×VIN when the analog input signal VIN (Vcmp) is −¼ VIN/VR≤+¼.

The digital code DO is "−01", the add-subtract count DA1 is "−1", the analog signal VDA1 is "−VR", and the analog output signal VO is VO=2×VIN+VR when the analog input signal VIN(Vcmp) is −1≤VIN/VR<−¼.

Accordingly, the input-output properties of the ADC cell 60 are, as illustrated in FIG. 6B, VO=2×VIN+VR when −1≤VIN/VR<−¼; VO=2×VIN when −¼≤VIN/VR≤+¼; and VO=2×VIN−VR when +¼<VIN/VR≤1.

Note that an input range VINF in the horizontal direction is ±1, and an output range in the vertical direction is ±1.

Figure 7A:
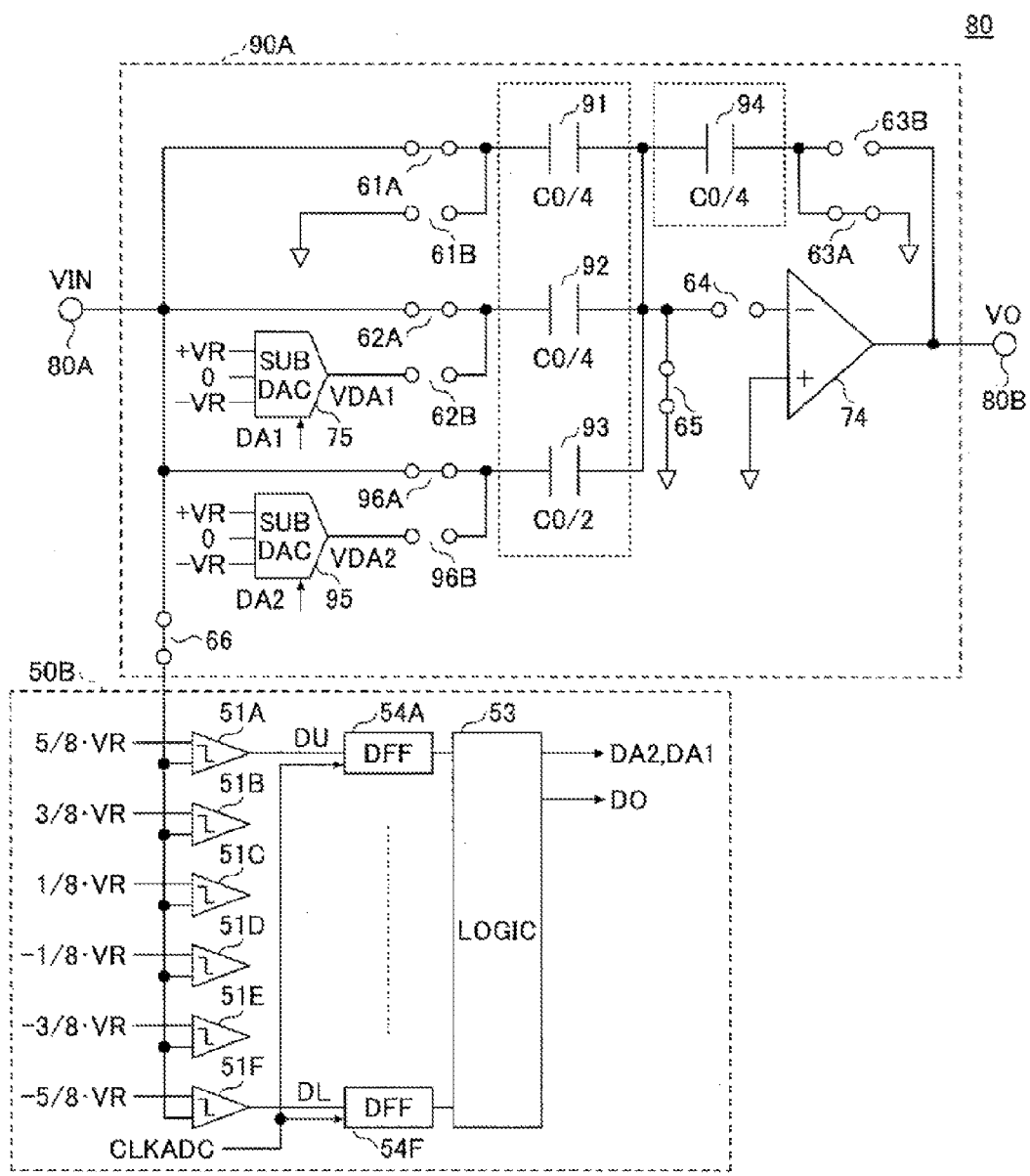
FIGS. 7A and 7B are diagrams illustrating a circuit configuration of a 2.5b-ADC cell 80 having a signal amplification factor of 4 in the comparative example of the pipeline ADC 10.
Figure 7B:
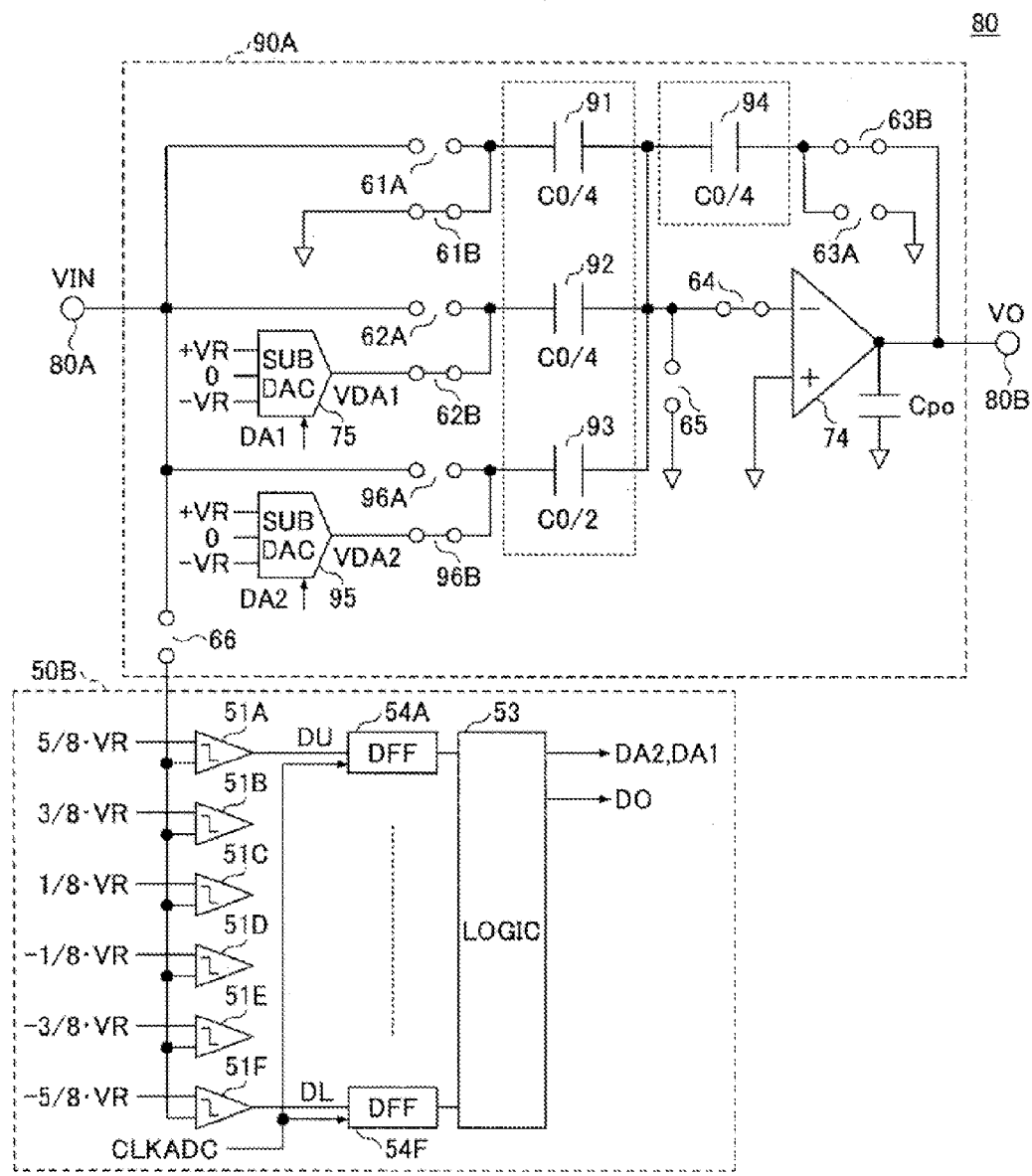

FIGS. 7A and 7B are diagrams illustrating a circuit configuration of a comparative example of an ADC cell 80. More specifically, FIG. 7A illustrates a connection status of the ADC cell 80 in a sampling operation, and FIG. 7B illustrates a connection status of the ADC cell 80 in an analog arithmetic operation. The ADC cell 80 of the comparative example is a 2.5b-ADC cell.

The ADC cell 80 includes a multiplying digital to analog converter (MDAC) 90A and a sub-ADC 50B. A signal amplification factor m of the ADC cell 80 is 4 (m=4).

The MDAC 90A is a 2.5b-MDAC that includes capacitors 91, 92, 93 and 94, an operational amplifier 74, digital to analog converters (DAC) 75 and 95, and switches 61A, 61B, 62A, 62B, 63A, 63B, 64, 65, 66, 96A, and 96B.

First ends (terminals on the left side of FIGS. 7A and 7B) of the capacitors 91, 92 and 93 are connected to an input terminal 80A of the ADC cell 80 via the switches 61A, 62A and 96A. Second ends (terminals on the right side of FIGS. 7A and 7B) of the capacitors 91, 92 and 93 are connected to one another, which are then connected to a first end (a terminal on the left side of FIGS. 7A and 7B) of the capacitor 94, and to the switches 64 and 65.

The first end (a terminal on the left side of FIGS. 7A and 7B) of the capacitor 94 is connected to second ends (terminals on the right side of FIGS. 7A and 17B) of the capacitors 91, 92 and 93, and a second end (a terminal on the right side of FIGS. 7A and 7B) of the capacitor 94 is connected to the switches 63A and 63B. The second end (a terminal on the right side of FIGS. 7A and 7B) of the capacitor 94 is connected to an output terminal of the operational amplifier 74 via the switch 63B. The second end (a terminal on the right side of FIGS. 7A and 7B) of the switch 63A is grounded.

Note that capacitances of the capacitors 91, 92 and 94 are C0/4, and a capacitance of the capacitor 93 is C0/2. Note that C0 represents a predetermined standard capacitance.

The operational amplifier 74 includes an inverting input terminal that is connected to a connection point of the first end (a terminal on the left side of FIGS. 7A and 7B) of the capacitor 94 and the second ends (terminals on the right side of FIGS. 7A and 7B) of the capacitors 91, 92 and 93 via the switch 64. Further, the operational amplifier 74 includes a non-inverting input terminal that is grounded, and an output terminal that is connected to an output terminal 80B of the ADC cell 80 as well as being connected to the second end (a terminal on the right side of FIGS. 7A and 7B) of the capacitor 94 via the switch 63B. The operational amplifier 74 is configured to input a voltage at the connection point of the capacitors 91, 92, 93 and 94 to its inverting input terminal, and output the analog output signal VO to the output terminal 80B.

A digital to analog converter (DAC) 75 is configured to output an analog signal represented by m×DA1×VR/4 based on an add-subtract count DA1 output from the sub-ADC 50B.

A digital to analog converter (DAC) 95 is configured to output an analog signal represented by m×DA1×VR/2 based on an add-subtract count DA2 output from the sub-ADC 50B.

The switches 61A, 61B, 62A, 62B, 63A, 63B, 64, 65, 66, 96A, and 96B are connected as illustrated in FIG. 7A.

The sub-ADC 50B is formed of a 2.5b sub-ADC circuit that includes comparators 51A to 51F, a logic circuit 53, and data flip-flops (DFFs) 54A to 54F. The DFFs 54A to 54F are respectively connected between output terminals of the comparators 51A and 51F and input terminals of the logic circuit 53. Hence, the DFFs 54A to 54F output, when a clock CLKADC is at a high (H) level, output signals of the comparators 51A to 51F to the logic circuit 53.

The sub-ADC 50B is configured to compare an analog input signal VIN based on comparison voltages (+5VR/8, +3VR/8, +VR/8, −VR/8, −3VR/8, and −5VR/8), and output a seven-valued digital code DO and the add-subtract counts DA1 and DA2 according to a level of the analog input signal VIN.

The comparator 51A switches an output signal to a high level (H) when the analog input signal VIN is higher than the comparison voltage (+5VR/8), whereas the comparator 51A switches an output signal to a low level (L) when the analog input signal VIN is lower than the comparison voltage (+5VR/8).

The comparator 51B switches an output signal to a high level (H) when the analog input signal VIN is higher than the comparison voltage (+3VR/8), whereas the comparator 51B switches an output signal to a low level (L) when the analog input signal VIN is lower than the comparison voltage (+3VR/8).

The comparator 51C switches an output signal to a high level (H) when the analog input signal VIN is higher than the comparison voltage (+VR/8), whereas the comparator 51C switches an output signal to a low level (L) when the analog input signal VIN is lower than the comparison voltage (+VR/8).

The comparator 51D switches an output signal to a high level (H) when the analog input signal VIN is higher than the comparison voltage (−VR/8), whereas the comparator 51D switches an output signal to a low level (L) when the analog input signal VIN is lower than the comparison voltage (−VR/8).

The comparator 51E switches an output signal to a high level (H) when the analog input signal VIN is higher than the comparison voltage (−3VR/8), whereas the comparator 51E switches an output signal to a low level (L) when the analog input signal VIN is lower than the comparison voltage (−3VR/8).

The comparator 51F switches an output signal to a high level (H) when the analog input signal VIN is higher than the comparison voltage (−5VR/8), whereas the comparator 51F switches an output signal to a low level (L) when the analog input signal VIN is lower than the comparison voltage (−5VR/8).

The logic circuit 53 is configured to output the digital codes DO and the add-subtract counts DA1 and DA2 based on the output signals of the comparators 51A to 51F. Note that an add-subtract count DA represented by 2×DA2+DA1 is applied in this comparative example. The DA1 of the add-subtract count DA corresponds to the first bit of the digital code DO, and the DA2 of the add-subtract count DA corresponds to the second bit of the digital code DO.

The logic circuit 53 is configured to output "+011" as the digital code DO, output "+1" as the add-subtract count DA2, and output "+1" as the add-subtract count DA1 when the output signals of the comparators 51A to 51F are all at a high level (H).

The logic circuit 53 is configured to output "+010" as the digital code DO, output "+1" as the add-subtract count DA2, and output "0" as the add-subtract count DA1 when the output signal of the comparator 51A is at a low level (L), and the output signals of the comparators 51B to 51F are all at a high level (H).

The logic circuit 53 is configured to output "+001" as the digital code DO, output "0" as the add-subtract count DA2, and output "+1" as the add-subtract count DA1 when the output signals of the comparators 51A and 51B are both at a low level (L), and the output signals of the comparators 51C to 51F are all at a high level (H).

The logic circuit 53 is configured to output "000" as the digital code DO, output "0" as the add-subtract count DA2, and output "0" as the add-subtract count DA1 when the output signals of the comparators 51A to 51C are all at a low level (L), and the output signals of the comparators 51D to 51F are all at a high level (H).

The logic circuit 53 is configured to output "−010" as the digital code DO, output "−1" as the add-subtract count DA2, and output "0" as the add-subtract count DA1 when the output signals of the comparators 51A to 51D are all at a low level (L), and the output signals of the comparators 51E and 51F are both at a high level (H).

The logic circuit 53 is configured to output "−011" as the digital code DO, output "−1" as the add-subtract count DA2, and output "−1" as the add-subtract count DA1 when the output signals of the comparators 51A to 51E are all at a low level (L), and the output signal of the comparator 51F is at a high level (H).

The digital code DO is expressed by a seven-value representation composed of "+011", "+010", "+001", "0", "−001", "−010", and "−011", and each of the add-subtract counts DA1 and DA2 is expressed by a three-value representation composed of "+1", "0" and "−1".

The DAC 75 is the same as the DAC 44 illustrated in FIG. 2. The DAC 75 is configured to receive a reference voltage (−VR, 0, +VR) and the add-subtract count DA1, and output an analog signal VDA1 represented by m×DA1×(VR/4). When the amplification factor m is 4, and the add-subtract count DA1 is one of +1, 0, and −1, the analog signal VDA1 becomes a corresponding one of +VR, 0, and −VR. The add-subtract count DA1 is supplied from the logic circuit 53 to the DAC 75.

The DAC 95 is configured to receive a reference voltage (−VR, 0, +VR) and the add-subtract count DA2, and output an analog signal VDA2 represented by m×DA2×(VR/4). When the amplification factor m is 4, and the add-subtract count DA2 is one of +1, 0, and −1, the analog signal VDA2 becomes a corresponding one of +VR, 0, and −VR. The add-subtract count DA2 is supplied from the logic circuit 53 to the DAC 95.

Next, operations of the MDAC 90A are described. Initially, the switches 61A, 62A, 63A, 65, 66, and 96A are switched ON (close) while the switches 61B, 62B, 63B, 64, and 96B are switched OFF (open) in an sampling operation illustrated in FIG. 7A. As a result, an input terminal 80A is connected to the first ends (terminals on the left side of FIG. 7A) of the capacitors 91, 92 and 93.

Further, a reference potential is set as a voltage at the connection point of the capacitors 91, 92, 93, and 94. Thus, the capacitor 94 is reset by discharging electric charges.

Accordingly, first ends (terminals on the left side in FIG. 7A) of the capacitors 91, 92 and 93 are charged with the analog input signal VIN supplied to the input terminal 80A.

Subsequently, the switches 61A, 62A, 63A, 65, 66, and 96A are switched OFF (open) while the switches 61B, 62B, 63B, 64, and 96B are switched ON (close) in an analog arithmetic operation illustrated in FIG. 7B.

As a result, the inverting input terminal of the operational amplifier 74 is connected to the connection point of the capacitors 91, 92, 93, and 94. Further, the first end (a terminal on the left side of FIG. 7B) of the capacitor 91 is grounded via the switch 61B, and the first end (a terminal on the left side of FIG. 7B) of the capacitor 92 is connected to the output terminal of the DAC 75 via the switch 62B. Further, the first end (a terminal on the left side of FIG. 7B) of the capacitor 93 is connected to the output terminal of the DAC 75 via the switch 96B, and the second end (a terminal on the right side of FIG. 7B) of the capacitor 94 is connected to the output terminal of the operational amplifier 74 via the switch 63B.

The analog output signal VO of the operational amplifier 74 is represented by the following formula.

$$VO = 4 \times VIN - DA \times VR$$

The signal amplification factor m of the ADC cell 80 illustrated in FIGS. 7A and 7B is 4 (m=4). The signal amplification factor is determined by a ratio of a synthetic capacitance (C0/4+C0/4+C0/2=C0) of the capacitors 91, 92 and 93 and a capacitance (C0/4) of the capacitor 94.

The signal amplification factor is determined by the above ratio because the first end (a terminal on the left side of FIGS. 7A and 7B) of the capacitor 94 acquires the amount of charges having an opposite sign that equates to a total amount of charges generated in the second ends (terminals on the right side of FIGS. 7A and 7B) of the capacitors 91, 92 and 93 while performing a sampling operation.

As described above, the ADC cell 80 is configured to perform an analog to digital conversion corresponding to a signal level of the analog input signal VIN supplied within a reference voltage range of +VR and −VR.

The MDAC 90A outputs an analog output signal VO (VO=4×VIN−DA×VR) by adding the DA1×VR to or subtracting the DA1×VR from a result of a quadrupled analog input signal VIN (=4×VIN). Note that the add-subtract count DA is any one of +3, +2, +1, 0, −1, −2 and −3.

Figure 8B:
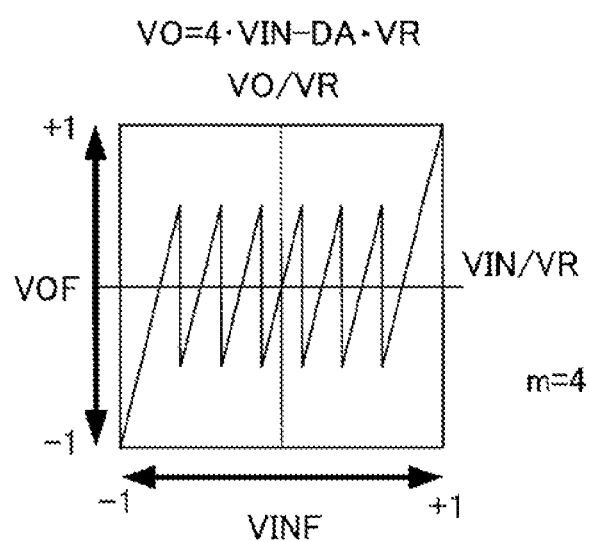
FIG. 8B is a diagram illustrating input-output properties of the ADC cell 80.

FIG. 8A is a diagram illustrating an operation of the ADC cell 80 in a table form, and FIG. 8B is a diagram illustrating input-output properties of the ADC cell 80. In FIG. 8B, a horizontal axis indicates an analog input signal represented by VIN/VR, and a vertical axis indicates an analog output signal represented by VO/VR.

FIG. 8A illustrates an analog input signal VIN(Vcmp), a digital code DO, an add-subtract count DA, analog signals VDA2 and VDA1, and an analog output signal VO. Note that the analog input signal VIN supplied to the comparators 51A to 51F is expressed as an "analog input signal VIN(Vcmp)".

The digital code DO is "+011", and the add-subtract count DA is "+3" when the analog input signal VIN(Vcmp) is +⅝≤VIN/VR≤+1. Further, the analog signal VDA2 is "+VR", the analog signal VDA1 is "+VR", and the analog output signal VO is VO=4×VIN−3×VR.

The digital code DO is "+010", and the add-subtract count DA is "+2" when the analog input signal VIN(Vcmp) is +⅜≤VIN/VR<+⅝. Further, the analog signal VDA2 is "+VR", the analog signal VDA1 is "0", and the analog output signal VO is VO=4×VIN−2×VR.

The digital code DO is "+001", and the add-subtract count DA is "+1" when the analog input signal VIN(Vcmp) is +⅛≤VIN/VR<+⅜. Further, the analog signal VDA2 is "0", the analog signal VDA1 is "+VR", and the analog output signal VO is VO=4×VIN−VR.

The digital code DO is "000", and the add-subtract count DA is "0" when the analog input signal VIN(Vcmp) is −⅛≤VIN/VR<+⅛. Further, the analog signal VDA2 is "0", the analog signal VDA1 is "0", and the analog output signal VO is VO=4×VIN.

The digital code DO is "−001", and the add-subtract count DA is "−1" when the analog input signal VIN(Vcmp) is −⅜≤VIN/VR<−⅛. Further, the analog signal VDA2 is "0", the analog signal VDA1 is "−VR", and the analog output signal VO is VO=4×VIN+VR.

The digital code DO is "−010", and the add-subtract count DA is "−2" when the analog input signal VIN(Vcmp) is −⅝≤VIN/VR<−⅜. Further, the analog signal VDA2 is "−VR", the analog signal VDA1 is "0", and the analog output signal VO is VO=4×VIN+2×VR.

The digital code DO is "−011", and the add-subtract count DA is "−3" when the analog input signal VIN(Vcmp) is −1≤VIN/VR<−⅝. Further, the analog signal VDA2 is "−VR", the analog signal VDA1 is "−VR", and the analog output signal VO is VO=4×VIN+3×VR.

Accordingly, the input-output properties of the ADC cell 80 are, as illustrated in FIG. 8B, VO=4×VIN−3×VR when +⅝≤VIN/VR≤+1; VO=4×VIN−2×VR when +⅜≤VIN/VR<+⅝; and VO=4×VIN−VR when +⅛≤VIN/VR<+⅜. Further, VO=4×VIN when −⅛≤VIN/VR<+⅛; VO=4×VIN+VR when −⅜≤VIN/VR<−⅛; and VO=4×VIN+3×VR when −1≤VIN/VR<−⅝.

Figure 9:
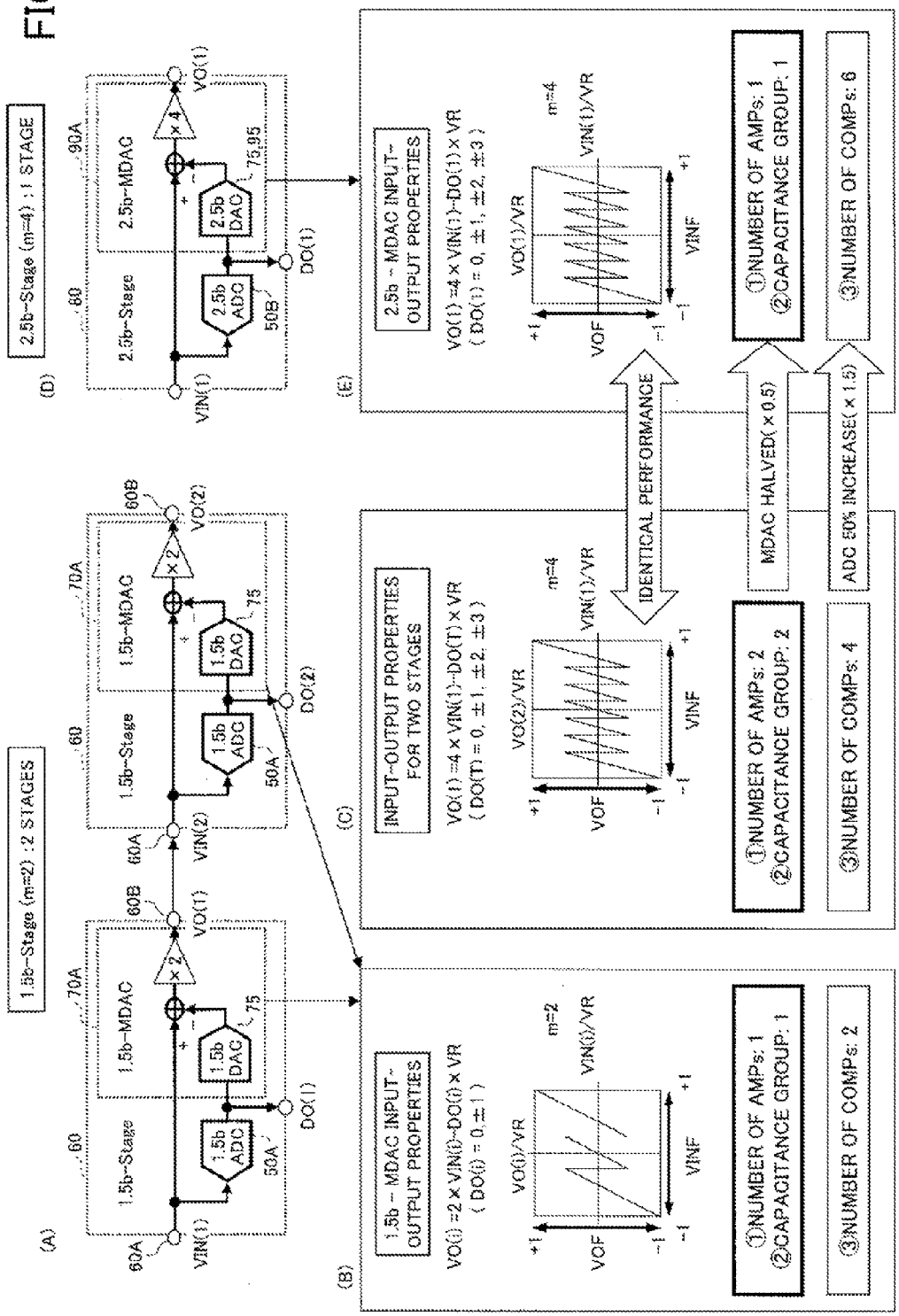
FIG. 9 is a diagram illustrating a comparison between a circuit composed of the comparative example of the 1.5b-ADC cells 60 (see FIG. 5A) serially connected in two stages and the comparative example of the 2.5b-ADC cell 80 (see FIG. 7A)

FIG. 9 is a diagram illustrating a comparison between a circuit composed of the comparative example of the 1.5b-ADC cells 60 (see FIG. 5A) serially connected in two stages and the comparative example of the 2.5b-ADC cell 80 (see FIG. 7A). In FIG. 9, (A) and (D) are block diagrams illustrating the simplified ADC cells 60, and the simplified ADC cell 80, respectively.

Each of the 1.5b-ADC cells 60 of the comparative example has an amplification factor m of 2 (m=2), and the 2.5b-ADC cell 80 of the comparative example has an amplification factor m of 4 (m=4).

Input-output properties of the two 1.5b-ADC cells 60 connected in series as illustrated (A) of FIG. 9 are illustrated in (B) of FIG. 9, that is, VO(i)=2×VIN(i)−DO(i)×VR. In the above formula, i represents the number of stages. That is, in the ADC cell 60 on the left side of (A) of FIG. 9, i=1, whereas in the ADC cell 60 on the right side of (A) of FIG. 9, i=2.

The input-output properties of the two 1.5b-ADC cells 60 connected in series as illustrated (A) of FIG. 9 are illustrated in (C) of FIG. 9, that is, VO(2)=2×VIN(1)−DO(T)×VR. In the above formula, DO(T)=0, ±1, ±2, and ±3.

Further, the 2.5b-ADC cell 80 illustrated in (D) of FIG. 9 has input-output properties illustrated in (E) of FIG. 9.

In the following, a case in which two 1.5b-ADC 60 cells serially connected in two stages are used as illustrated in (A) of FIG. 9 and a case in which one 2.5b-ADC cell 80 is used as illustrated in (D) of FIG. 9 are compared.

As illustrated in (C) and (E) of FIG. 9, the input-output properties of two 1.5b-ADC cells 60 connected in series equate to the input-output properties of one 2.5b-ADC cell 80.

Further, when comparing the ADC cells 60 for two stages with the ADC cell 80 for one stage, the number of operational amplifiers 74 that may be required for the ADC cells 60 for two stages is two, whereas the number of operational amplifiers 74 that may be required for the ADC cell 80 for one stage is one.

Further, when comparing the ADC cells 60 for two stages with the ADC cell 80 for one stage, the number of capacitors that may be required for the ADC cells 60 for two stages is two, that is, two capacitor groups (a group (a capacitance group) including capacitors 71, 72, and 73). Whereas, the number of capacitors that may be required for the ADC cell 80 for one stage is one, that is, one capacitor group (a group (a capacitance group) including capacitors 91, 92, 93, and 94).

Hence, when comparing the ADC cells 60 for two stages with the ADC cell 80 for one stage, the number of multiplying digital to analog converters (MDAC) that may be required for the ADC cells 60 for two stages may be halved compared to the number of multiplying digital to analog converters (MDAC) that may be required for the ADC cell 80 for one stage.

Further, in comparing the number of comparators (the number of Amps), the ADC cells 60 for two stages have a total number of four comparators (i.e., two comparators 51, and two comparators 52), whereas the ADC cell 80 for one stage has 6 comparators (i.e., comparators 51A to 51F).

Accordingly, when comparing the ADC cells 60 for two stages with the ADC cell 80 for one stage, the number of comparators that may be required for the ADC cell 80 for one stage is increased by 50% compared to the number of comparators that may be required for the ADC cells 60 for two stages.

This case compares the 1.5b-ADC cells 60 with the 2.5b-ADC cell 80. However, the multiplication of bits may provide an effect similar to the effect obtained by increasing the number of bits from 1.5b to 2.5b.

Note that an increase in the number of comparators when multiplying bits of the ADC cell for receiving the benefit of micro-fabrication will not be an obstacle of the multiplication of bits.

Hence, it is suitable for improving the performance of a system to employ the 2.5b-ADC cell 80 rather than employing the 1.5b-ADC cells 60 serially connected in two stages because the number of operational amplifiers and the number of capacitor groups may be reduced in the 2.5b-ADC cell 80 compared to the 1.5b-ADC cells 60 serially connected in two stages. The multiplication of bits in the ADC may be implemented by the multiplication of bits in the MDAC, and thus, the multiplication of bits in the ADC may be used synonymously with the multiplication of bits in the MDAC.

When the bits of the MDAC are multiplied, the signal amplification factor m is increased. Hence, the analog arithmetic operation time may be increased due to parasitic capacitance Cpo of a transistor group contained in the output stage of the operational amplifier.

Since the analog arithmetic operation time for the MDAC is increased in proportion to a product of the signal amplification factor m and the parasitic capacitance Cpo (i.e., m×Cpo), the analog to digital (AD) conversion speed of the ADC cell may be lowered.

Figure 10A:
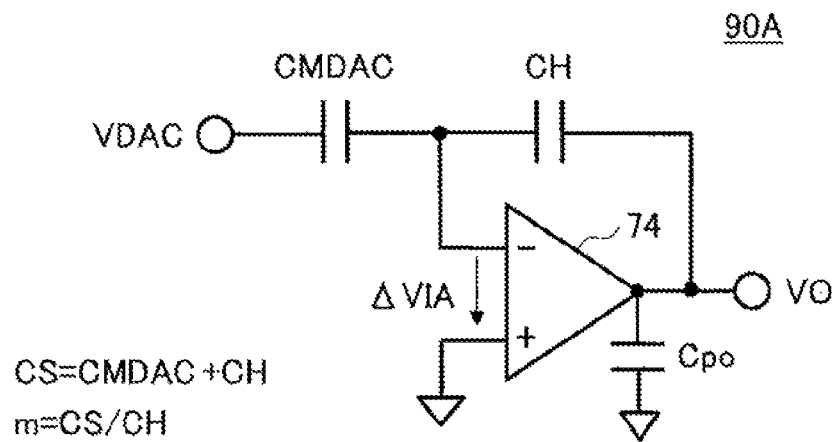
FIGS. 10A to 10C are diagrams illustrating degradation of an arithmetic operation speed due to parasitic capacitance of a multiplying digital to analog converter (MDAC)
Figure 10B:
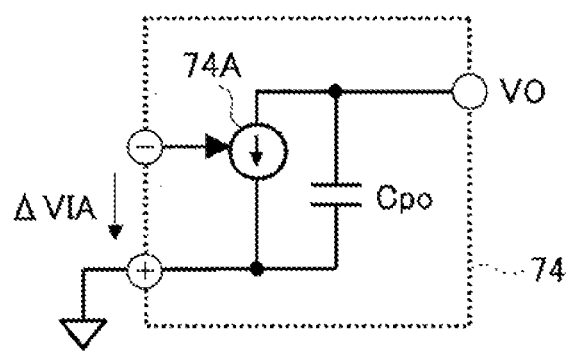
Figure 10C:
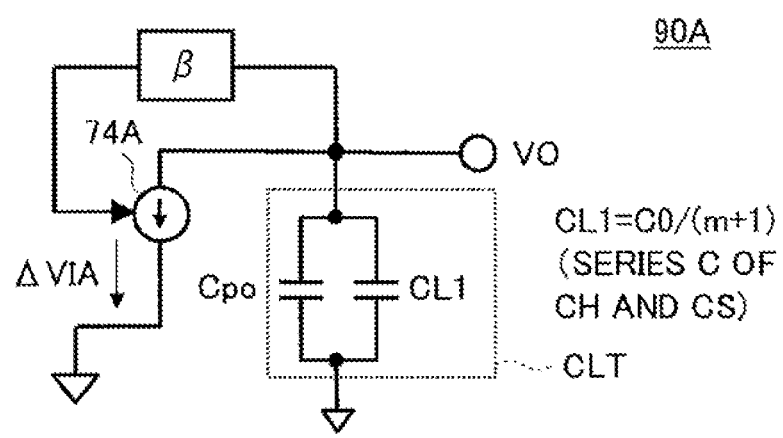

FIGS. 10A to 10C are diagrams illustrating degradation of an arithmetic operation speed due to parasitic capacitance of a multiplying digital to analog converter (MDAC).

FIG. 10A is an equivalent circuit diagram of the MDAC 90A (see FIG. 7B) in the analog operation. Note that the 2.5b-MDAC 90A is used as an example of the MDAC; however, the degradation of the arithmetic operation speed due to the parasitic capacitance may also be observed in the 1.5b-MDAC 70A in a similar manner.

In FIG. 10A, a capacitor CMDAC is formed by synthesizing the capacitors 91, 92, and 93 illustrated in FIG. 7B. In addition, a capacitor CH is the capacitor 94 illustrated in FIG. 7B. In the 1.5b-MDAC 70A (see FIG. 7B), a capacitor CMDAC is formed by synthesizing the capacitors 71 and 72, and a capacitor CH is the capacitor 73 illustrated in FIG. 7B.

In the MDAC 90A in the analog arithmetic operation, a voltage NDAC is applied to a first end (a terminal on the left side) of the capacitor CMDAC. The voltage VDAC is supplied from the DAC 75 and DAC 95.

Further, when the operational amplifier 74 is expressed in the equivalent circuit diagram, a circuit in which a constant current source 74A for outputting the current ΔIO and the parasitic capacitance Cpo are connected in parallel as illustrated in FIG. 10. Note that the parasitic capacitance Cpo illustrated in FIG. 10A is similar to the parasitic capacitance Cpo illustrated in FIG. 5B or FIG. 7B, which is undesirably formed by connecting the operational amplifier 74 to the capacitor group (i.e., the capacitors 71 to 73 in FIG. 5B, and the capacitors 91 to 94 in FIG. 7B).

In this case, when a potential difference between the inverting input terminal (−) and the non-inverting input terminal (+) of the operational amplifier 74 is defined as ΔVIA, and the conductance of the operational amplifier 74 is defined as gm, the current ΔIO may be expressed by ΔIO=gm×ΔVIA.

When an equivalent circuit of the operational amplifier 74 illustrated in FIG. 10B is incorporated into an equivalent circuit of the MDAC 90A illustrated in FIG. 10A, the equivalent circuit of the MDAC 90A is converted into a circuit illustrated in FIG. 10C.

Note that a capacitor CLT illustrated in FIG. 10C corresponds to a synthetic capacitance of the parasitic capacitance Cpo of the operational amplifier and a capacitor CL1, which is a series capacitance of the capacitor CMDAC and the capacitor CH illustrated in FIG. 10A. The series capacitance of the capacitor CH may be expressed by C0/(m+1). Further, a feedback amount of the MDAC is represented by β. β is given by CH/(CH+CMDAC).

FIG. 11 is a diagram illustrating a comparison between a specification of the 1.5b-MDAC 70A and a specification of the 2.5b-MDAC 90A. Note that the specification illustrated in FIG. 11 illustrates values when the identical operational amplifier 74 is utilized in the 1.5b-MDAC 70A and the 2.5b-MDAC 90A.

FIG. 11 illustrates a signal amplification factor m, a capacitance CMDAC, a capacitance CH, a feedback amount β, a capacitance CL1, a parasitic capacitance Cpo of an output stage of the operational amplifier 74, a retardation coefficient 1, and a retardation coefficient 2.

Note that the signal amplification factor m is given by Cs/CH. The Cs in FIG. 11 represents an electrostatic capacitance of the capacitor Cs, which is a synthetic capacitance of the capacitors 71 and 72 of the 1.5b-MDAC 70A illustrated in FIG. 5A, and which is equal to the capacitor CMDAC of the 1.5b-MDAC 70A. Further, the Cs in FIG. 11 is a synthetic capacitance of the capacitors 91, 92 and 93 of the 2.5b-MDAC 70A illustrated in FIG. 7A, which is equal to the capacitor CMDAC of the 2.5b-MDAC 90A.

Accordingly, the signal amplification factor m is 2 in the 1.5b-MDAC 70A, and the signal amplification factor m is 4 in the 2.5b-MDAC 90A. Hence, the signal amplification factor m of the 2.5b-MDAC 90A is twice the signal amplification factor m of the 1.5b-MDAC 70A.

The capacitance CMDAC is an electrostatic capacitance of the capacitor CMDAC, which is equal to the electrostatic capacitance of the capacitor Cs. Note that the capacitor Cs of the 1.5b-MDAC 70A and the capacitor Cs of the 2.5b-MDAC 90A are equal, and are both C0.

The capacitance CH of the 1.5b-MDAC 70A and the capacitance CH of the 2.5b-MDAC 90A are equal, and are both C0. A general formula of the capacitance CH is expressed by C0/m. That is, the capacitance CH of the 1.5b-MDAC 70A is CH=C0/2, and the capacitance CH of the 2.5b-MDAC 90A is CH=C0/4. Accordingly, the capacitance CH of the 1.5b-MDAC 70A is half (½) of the capacitance CH of the 2.5b-MDAC 90A.

That feedback amount β is expressed by CH/(CH+CMDAC). Hence, the feedback amount β of the 1.5b-MDAC 70A is β=⅓, and the feedback amount β of the 2.5b-MDAC 90A is β=⅕. Accordingly, the feedback amount β of the 1.5b-MDAC 70A is ⅗ of the feedback amount β of the 5.5b-MDAC 90A.

The capacitance CL1 is given by (CH×CMDAC)/(CH+CMDAC), which is expressed by C0/(m+1). That is, the capacitance CL1 of the 1.5b-MDAC 70A is CL1=C0/3, and the capacitance CL1 of the 2.5b-MDAC 90A is CL1=C0/5. Accordingly, the capacitance CL1 of the 1.5b-MDAC 70A is ⅗ of the capacitance CL1 of the 3.5b-MDAC 90A.

Note that in this comparison, the parasitic capacitance Cpo of the output stage of the operational amplifier 74 is determined as a constant value, and hence, the parasitic capacitance Cpo of the output stage of the operational amplifier 74 in the 1.5b-MDAC 70A and the parasitic capacitance Cpo of the output stage of the operational amplifier 74 in the 2.5b-MDAC 90A are equal, and are both Cpo.

The retardation coefficient 1 is expressed by CL1/β. Hence, the capacitance CL1 of the 1.5b-MDAC 70A is CL1/β=C0, and the capacitance CL1 of the 2.5b-MDAC 90A is CL1/β=C0, and hence, the capacitance CL1 of the 1.5b-MDAC 70A is equal to the capacitance CL1 of the 2.5b-MDAC 90A.

The retardation coefficient 2 is expressed by Cpo/β. The retardation coefficient 2 (Cpo/β) is expressed by (m+1)×Cpo. Hence, the retardation coefficient 2 of the 1.5b-MDAC 70A is expressed by Cpo/β=3×C0, and the retardation coefficient 2 of the 2.5b-MDAC 90A is expressed by Cpo/β=5×C0. Accordingly, the retardation coefficient 2 (Cpo/β) of the 1.5b-MDAC 70A is ⅗ of the retardation coefficient 2 (Cpo/β) of the 2.5b-MDAC 90A.

As described above, in comparing the 1.5b-MDAC 70A with the 2.5b-MDAC 90A, the capacitance CH, the feedback amount β, and the capacitance CL1 may be improved by the multiplication of bits; however, the retardation coefficient 2 (Cpo/β) is increased by ⅗.

Note that when a capacitor (a synthetic capacitance of a parasitic capacitance Cpo of the operational amplifier and the capacitor CL1) is defined as CLT, the conductance of the operational amplifier 74 is defined as gm, and the feedback amount is defined as β, an analog arithmetic operation time Ttotal of the MDAC may be expressed by the following formula (1). In the following formula (1), a coefficient k is a proportionality coefficient that is independent of CLT, gm, and β.

$$T_{total} = \frac{k}{gm_{AMP}} \cdot \frac{C_{LT}}{\beta} \quad (1)$$

Further, the analog arithmetic operation time Ttotal of the MDAC is expressed by a total amount of time of a retardation time TCL1 caused by the capacitor CL1 that is the capacitor group of the MDAC and a retardation time TCpo caused by the parasitic capacitance Cpo of the output stage of the operational amplifier. That is, the analog arithmetic operation time Ttotal of the MDAC is expressed by the following formula (2).

$$\begin{aligned} T_{total} &= T_{CL1} + T_{Cpo} \\ &= \frac{k}{gm_{AMP}} \cdot \frac{C_{L1}}{\beta} + \frac{k}{gm_{AMP}} \frac{C_{po}}{\beta} \\ &= \frac{k}{gm_{AMP}} \cdot C0 + \frac{k}{gm_{AMP}} \cdot ((1+m) \cdot Cpo) \end{aligned} \quad (2)$$

In this case, the retardation time TCL1 caused by the capacitor CL1 is a theoretical retardation that is unavoidable as a basic operation when there is no parasitic capacitance Cpo of the output stage of the operational amplifier. The retardation time TCL1 caused by the capacitor CL1 is not increased by an increase of the signal amplification factor. In other words, the analog arithmetic operation speed is not essentially lowered by multiplying bits of the MDAC when it is possible to disregard the parasitic capacitance Cpo of the output stage of the operational amplifier.

However, since the parasitic capacitance Cpo of the output stage of the operational amplifier is not disregarded in practice, the analog arithmetic operation speed may be lowered.

Further, the retardation time TCpo is caused by the parasitic capacitance Cpo of the output stage of the operational amplifier alone, and hence, the retardation time TCpo may not be necessary for the basic operation of the MDAC.

The retardation time TCpo is in proportion to the retardation coefficient 2 (Cpo/β). Accordingly, when the signal amplification factor m is increased, a feedback coefficient β is lowered. Hence, the retardation time TCpo is increased in proportion to a factor of (1+m). That is, the retardation time TCpo is a factor that may induce the degradation of the analog arithmetic operation speed in the multiplication of bits in the MDAC circuit.

Next, a folded cascode operational amplifier is described with reference to FIGS. 12A to 12D.

Figure 12A:
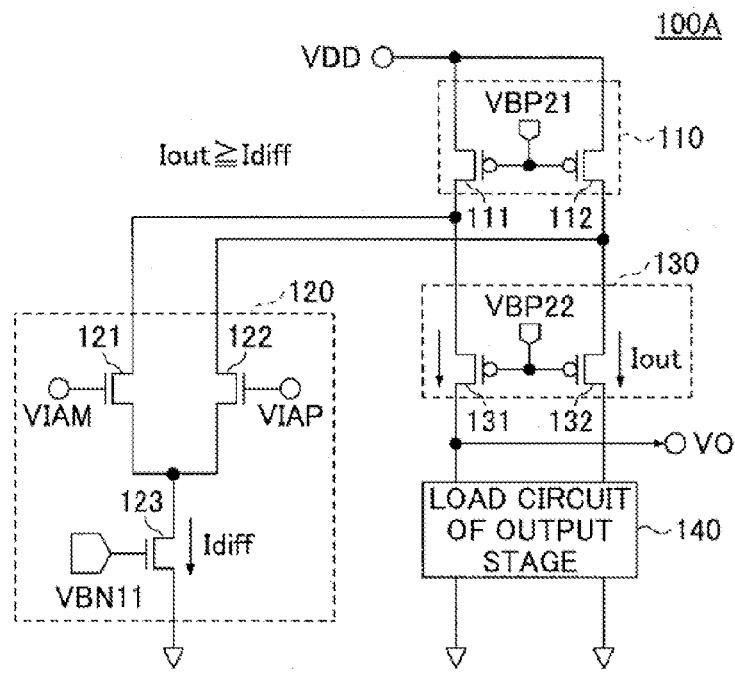
FIGS. 12A to 12D are diagrams illustrating circuit configurations of a folded cascode operational amplifier.
Figure 12B:
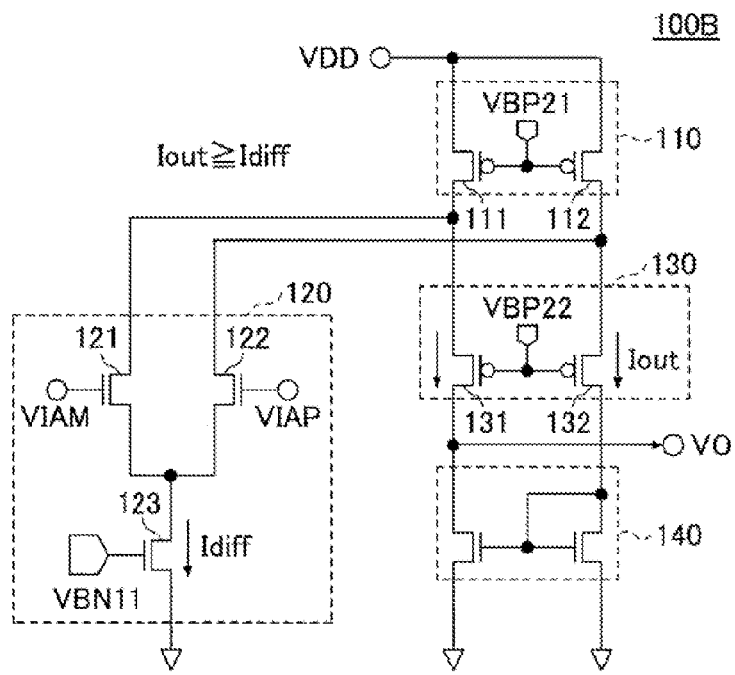
Figure 12C:
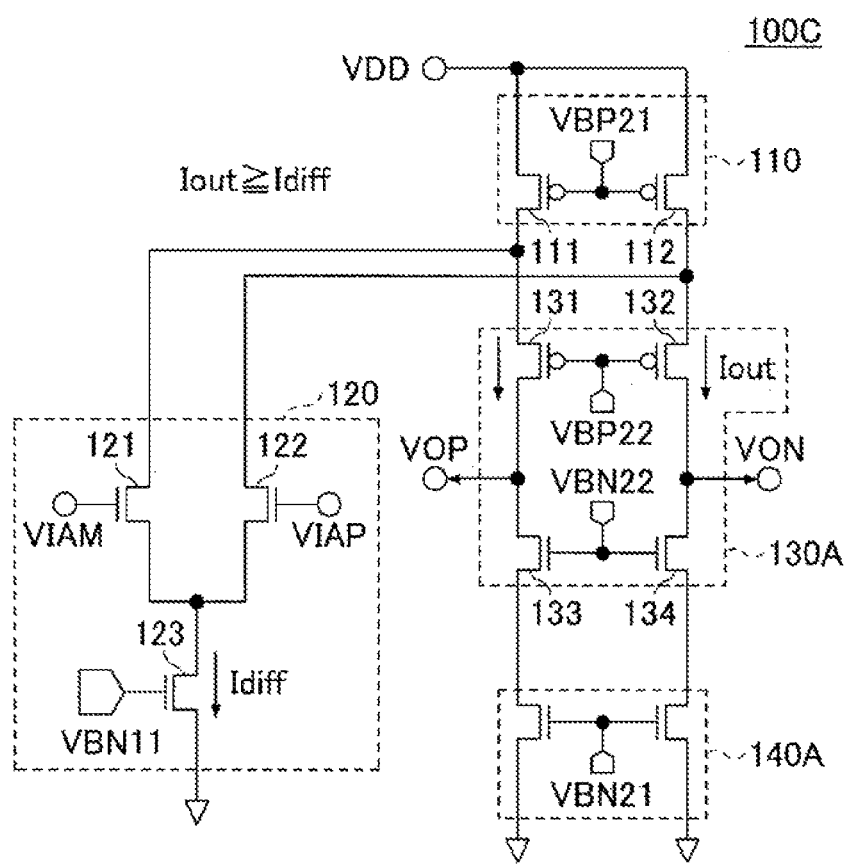
Figure 12D:
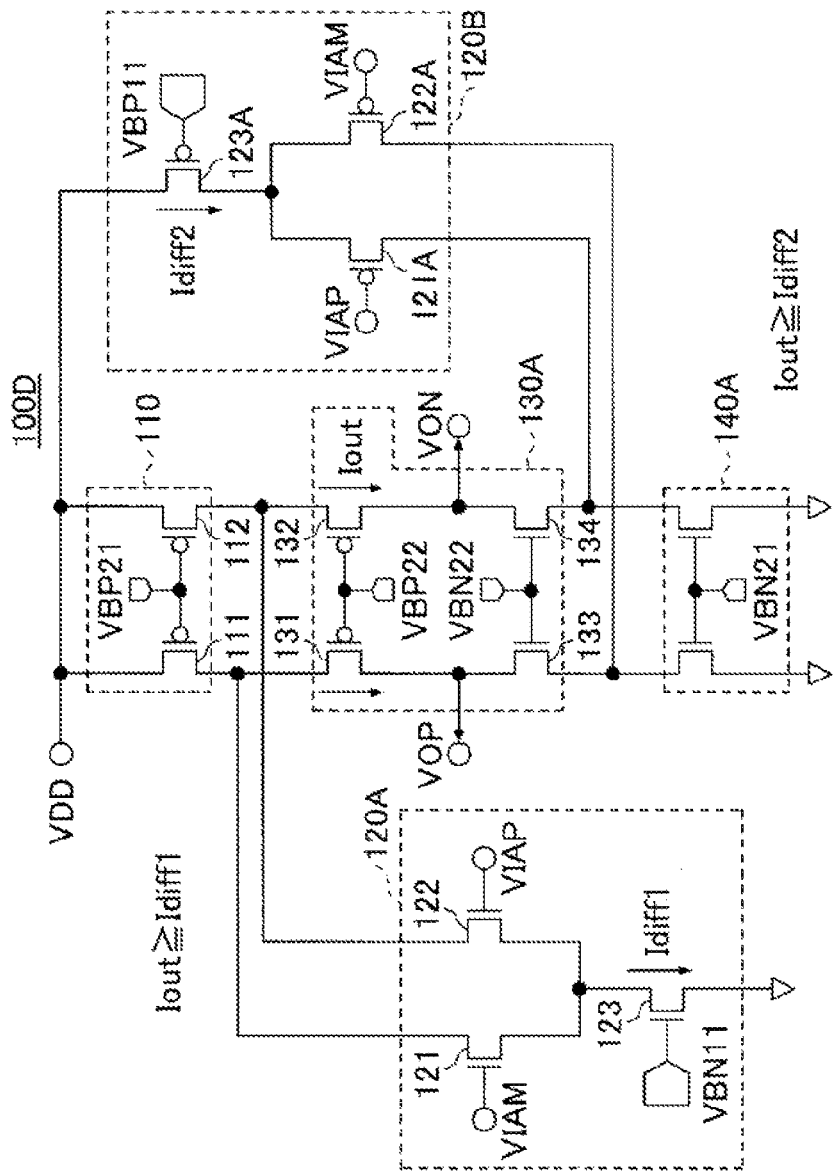

FIGS. 12A to 12D are diagrams illustrating a circuit configuration of the folded cascode operational amplifier. FIG. 12A illustrates a basic-type circuit configuration of the folded caseade operational amplifier, and FIG. 12B illustrates a single end type circuit configuration of the folded caseade operational amplifier. FIG. 12C illustrates a full differential output type circuit configuration of the folded cascode operational amplifier, and FIG. 12D illustrates a circuit configuration of the folded caseade operational amplifier having two differential input stages.

The folded cascode operational amplifiers 100A to 100D illustrated in FIGS. 12A to 12D indicate specific circuit configurations of the operational amplifiers 74 illustrated in FIGS. 5A, 5B, 7A, and 7B, respectively.

As illustrated in FIG. 12A, the basic type folded cascode operational amplifier 100A includes a constant current source 110, a differential input stage 120, and an output stage 130.

The constant current source 110 includes a pair of p-type metal oxide silicon field effect transistors (PMOSFETs). Drains of the PMOSFETs 111 and 112 are connected to a power source VDD, sources of the PMOSFETs 111 and 112 are connected to the differential input stage 120 and the output stage 130, and a predetermined voltage VBP21 is applied to gates of the PMOSFETs 111 and 112. The constant current source 110 is configured to output a predetermined current due to the voltage VBP21 applied to the gates of the PMOSFETs 111 and 112.

The differential input stage 120 is cascode-connected to the constant current source 110, and includes a pair of n-type metal oxide silicon field effect transistors (NMOSFETs) 121 and 122, and an NMOSFET 123 configured to output a differential current.

Sources of the NMOSFETs 121 and 122 are connected to the sources of the PMOSFETs 111 and 112, respectively, of the constant current source 110, and drains of the NMOSFETs 121 and 122 are connected to a source of the NMOSFET 123. A gate of the NMOSFET 121 is connected to an inverting input terminal of the operational amplifier 100A, and a gate of the NMOSFET 122 is connected to a non-inverting input terminal of the operational amplifier 100A.

The source of the NMOSFET 123 is connected to the drains of the NMOSFETs 121 and 122, a voltage VBN11 is applied to the gate of the NMOSFET 123, and a drain of the NMOSFET 123 is configured to output a differential current Idiff.

The output stage 130 is cascode-connected to the constant current source 110, and includes PMOSFETs 131 and 132. Drains of the PMOSFETs 131 and 132 are connected to the sources of the PMOSFETs 111 and 112, respectively, and sources of the PMOSFETs 131 and 132 are connected to a load circuit 140 of the output stage 130.

A voltage VPB22 is applied to gates of the PMOSFETs 131 and 132. A voltage of the source of the PMOSFET 131 corresponds to a voltage of an output terminal of the operational amplifier 100A, and hence, the output terminal of the operational amplifier 100A is configured to output a voltage VO. Further, the current flowing in the respective drain-source intervals of the PMOSFETs 131 and 132 corresponds to an output current Iout of the output stage 130.

In the circuit configuration of the folded cascode operational amplifier 100A, the differential input stage 120 and the output stage 130 are designed such that a current ratio of an output current Iout of the output stage 130 to a differential current Idiff of the differential input stage 120 that is represented by Ka=Iout/Idiff satisfies Ka≥1.

The circuit configuration of the folded cascode operational amplifier 100A is designed as above because of the following reasons. That is, the sum of the differential current Idiff of the differential input stage 120 and the output current Iout of the output stage 130 equates to a current I supplied from the constant current source 110. Hence, the output stage 130 is configured to have a sufficient size (capacitance) such that an output current Iout (=I–Idiff) flows in the output stage 130 when the differential current Id of the differential input stage 120 is reduced.

Further, the above circuit configuration may prevent the operation in a slew rate area where the output current is restricted by cutting off one of the transistors (i.e., NMOSFETs 121 and 122) of the differential input stage 120.

Accordingly, the folded cascode operational amplifier 100A is configured to have an output stage 130 having a relatively large size (capacitance).

The single end type folded cascode operational amplifier 100B illustrated in FIG. 12B includes a constant current source 110, a differential input stage 120, and an output stage 130. The output stage 130 is connected to a load circuit 140. The load circuit 140 is formed of a current mirror circuit configured to output equal currents from its left and right terminals.

The full differential output type folded cascode operational amplifier 100C illustrated in FIG. 12C includes a constant current source 110, a differential input stage 120, and an output stage 130A. The output stage 130A is connected to a load circuit 140A.

The output stage 130A includes NMOSFETs 133 and 134 that are cascode-connected to PMOSFETs 131 and 132. Sources of the NMOSFETs 133 and 134 are connected to the sources of the PMOSFETs 131 and 132, and drains of the NMOSFETs 133 and 134 are connected to sources of a pair of NMOSs of the load circuit 140A. A voltage VBN22 is applied to gates of the NMOSFETs 133 and 134.

The load circuit 140A includes the pair of NMOSFETs. The source of the pair of NMOSFETs of the load circuit 140A are connected to the drains of the NMOSFETs 133 and 134, a voltage VBN21 is applied to the gates of the NMOSFETs of the load circuit 140A, and drains of the NMOSFETs of the load circuit 140A serve as output terminals.

The folded cascode operational amplifier 100D illustrated in FIG. 12D includes a constant current source 110, differential input stages 120A and 120B, and an output stage 130A. The output stage 130A is connected to the load circuit 140A.

Note that the differential input stage 120A is the same as the differential input stage 120 illustrated in FIG. 12A to 12C. The differential input stage 120B includes PMOSFETs 121A, 122A, and 123A. The differential input stage 120B includes an inverted circuit configuration of the differential input stage 120A. A drain of the PMOSFET 123A is connected to a power source VDD, and a source of the PMOSFET 123A is connected to drains of the NMOSFETs 121A and 122A so as to output a differential current Idiff2. Sources of the NMOSFETs 121A and 122A are connected to sources of the pair of the NMOSFETs of the load circuit 140A, respectively.

The circuit configurations of the folded cascode operational amplifiers 100B, 100C, and 100D are designed in a manner similar to the circuit configuration of the folded cascode operational amplifier 100A, such that a current ratio of an output current Iout of the output stage 130 (130A) to a differential current Idiff of the differential input stage 120 (120A) that is represented by Ka=Iout/Idiff satisfies Ka≥1.

Accordingly, the folded cascode operational amplifiers 100B, 100C, and 100D are configured to have an output stage 130 (130A) having a relatively large size (capacitance).

This feature of the output stage 130 (130A) having a relatively large size is similar to the folded cascode operational amplifier 100A illustrated in FIG. 12A.

However, when the output stage 130 (130A) has a large size, the parasitic capacitance Cpo of the operational amplifier may be increased.

Accordingly, when the folded cascode operational amplifiers 100A to 100D are applied to an arithmetic circuit such as an MDAC, an arithmetic operation speed may be lowered due to a large parasitic capacitance Cpo. The above result may be observed not only in the MDAC, but may also be observed in an arithmetic circuit configured to convert an analog value into a digital value.

The degraded arithmetic operation speed may be improved when the size of the output stage 130 (130A) is reduced. However, the output stage 130 (130A) having a reduced size may fail to sufficiently absorb the current of the differential input stage 120 (120A), which may result in unstable operations.

Next, details of circuit operations and related factors may be described by referring to the full differential output type folded cascode operational amplifier 100C as an example.

FIGS. 13A to 13D are diagrams illustrating a circuit configuration and operational area of the full differential output type folded cascode operational amplifier 100C.

Figure 13A:
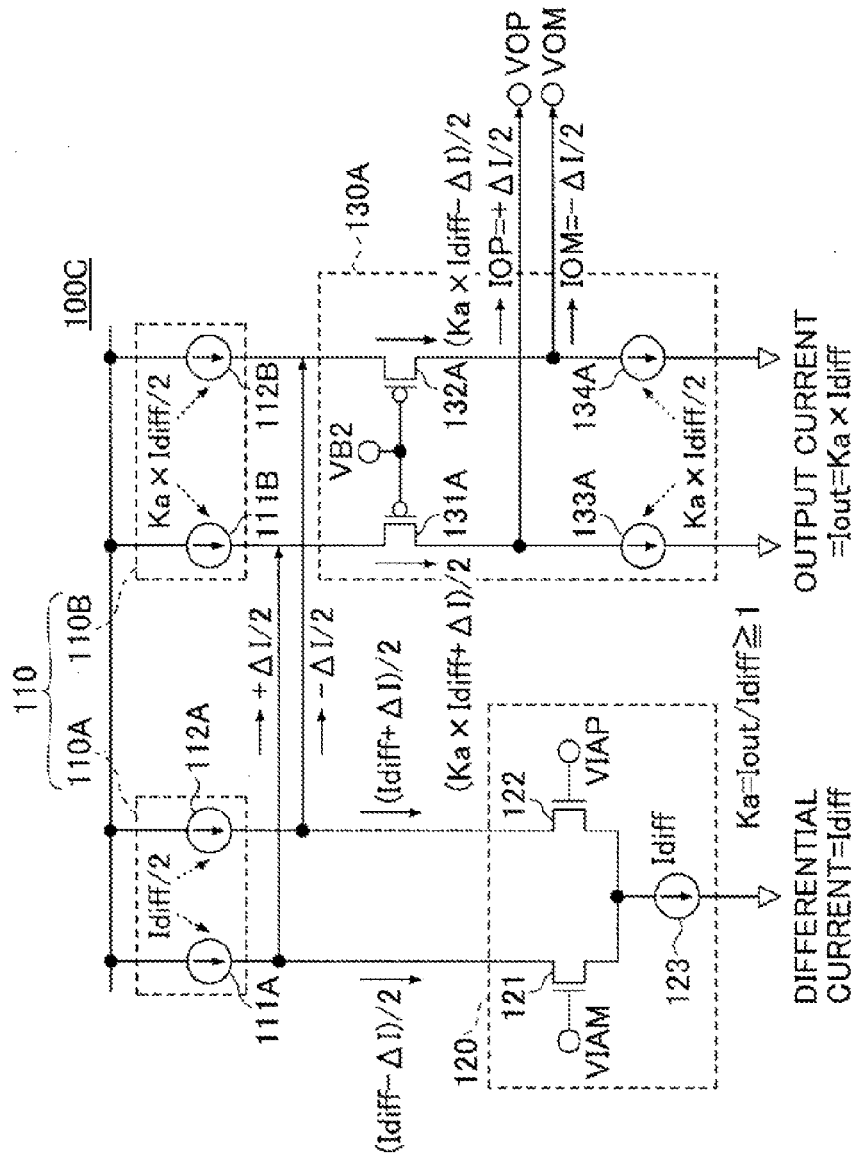

The full differential output type folded cascode operational amplifier 100C illustrated in FIG. 13A includes constant current sources 110A and 110B, a differential input stage 120, and an output stage 130A. Note that illustration of a load circuit connected to the output stage 130A is omitted from FIG. 13A.

In FIG. 13A, a constant current source 110 illustrated in FIG. 12C is illustrated as the two separate constant current sources 110A and 110B. Further, PMOSFETs 111 and 112 (see FIG. 12C) are illustrated as symbols of the current sources, and reference numerals 111A, 112A, 111B, and 112B are assigned to the respective symbols of the current sources.

Each of output currents of the current sources 111A and 112A is represented by Idiff/2, and each of output currents of the current sources 111B and 112B is represented by Ka×Idiff/2. Ka represents a current ratio (Iout/Idiff). The constant current source 110A is configured to output a differential input stage output current ±ΔI/2 to the constant current source 110B side according to a potential difference ΔVIA of the differential input generated between a gate of the PMOSFET 121 and a gate of the PMOSFET 122 of the differential input stage 120. Note that the differential input stage output current±ΔI/2 is limited in a range of ±(Idiff/2).

In FIG. 13A, the constant current source 111 illustrated in FIG. 12C is illustrated as the two separate constant current sources 111A and 111B, and the PMOSFETs 131 and 132 of the output stage 130A illustrated in FIG. 12C are illustrated as PMOSFETs 131A and 132A. Further, the PMOSFETs 133 and 134 illustrated in FIG. 12C are illustrated as the current sources 133A and 134A in FIG. 13A.

A voltage VB2 is applied to gates of the PMOSFETs 131A and 132A such that sources of the PMOSFETs 131A and 132A output respective currents (Ka×Idiff+ΔI)2 and (Ka× Idiff−ΔI)2.

A current Ka×Idiff/2 flows in each of the PMOSFETs (current sources) 133A and 134A arranged at output sides of the PMOSFETs 131A and 132A.

Accordingly, currents IOP and IOM flow in respective output terminals connected between the PMOSFETs 131A, 132A and the PMOSFETs 133A, 134A. The current IOP is +ΔI/2, and the current IOM is −ΔI/2.

Accordingly, in order to transmit the maximum differential current±(Idiff/2) to the output currents IOP and IOM, the circuit configuration of the folded cascode operational amplifier 100C is designed such that a current ratio of an output current Iout of the output stage 130 to a differential current Idiff of the differential input stage 120 that is represented by Ka=Iout/Idiff satisfies Ka≥1.

A potential difference ΔVIA of a differential input (hereinafter also called a "differential input potential difference"), output currents IOP and IOM, and an operating mode of the folded cascode operational amplifier 100C are summarized in FIG. 13B. Note that the differential input potential difference ΔVIA is obtained by subtracting a voltage (VIAM) of an inverting input terminal from a voltage (VIAP) of a non-inverting input terminal illustrated in FIG. 13B.

Further, Vod indicates overdrive voltages of all transistors contained in the folded cascode operational amplifier 100C, and hence, the Vod is an identical value for all the transistors including the transistors of the differential input stage 120. The overdrive voltage Vod is obtained by computing the difference (Vgs−Vth) between a gate-source interval voltage Vgs and a threshold voltage Vth of all the transistors contained in the folded cascode operational amplifier 100C.

In a range of |ΔVIA/2 Vod|<1, the output currents IOP and IOM are ±(I0/2 Vod)×(ΔVIA/2), which is an operating area in which the folded cascode operational amplifier 100C performs a linear operation.

Further, in a range of |ΔVIA/2 Vod|≥1, the output currents IOP and IOM are ±Idiff/2, which is a slew rate (SR) area of the folded cascode operational amplifier 100C.

Figure 13C:
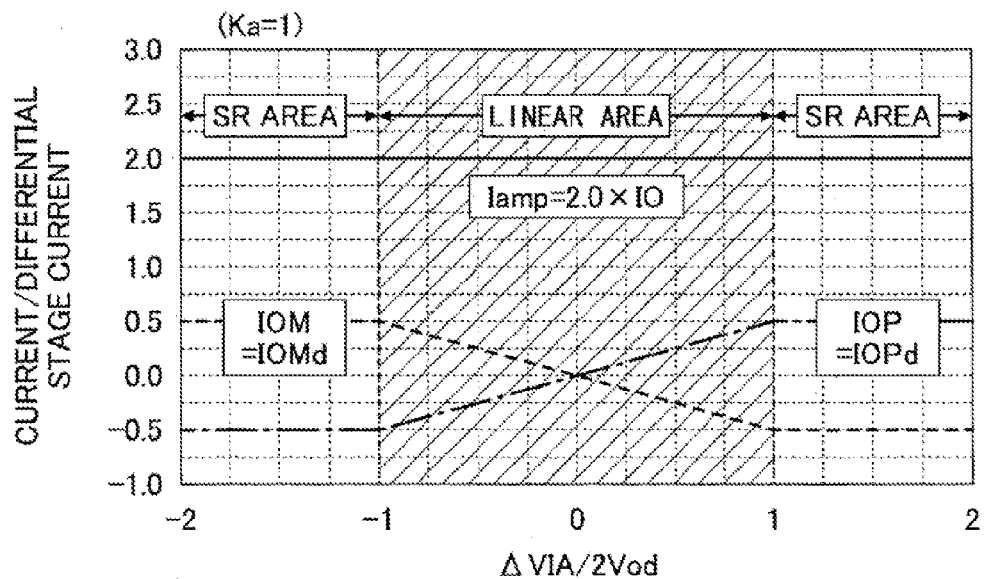

FIG. 13C is a diagram illustrating an operating area of the folded cascode operational amplifier of the comparative example, where a horizontal axis indicates ΔVIA/2 Vod, and a vertical axis indicates ratios of the output currents IOP and IOM to the differential current Idiff. Note that Since Ka=1, Iamp=2.0×Idiff. Iamp indicates an output current of the folded cascode operational amplifier 100C illustrated in FIG. 13A, which is obtained based on an output current (differential current Idiff) of the differential input stage 120 and an output current (Ka×Idiff/2×2).

As illustrated in FIG. 13C, in a range of |ΔVIA/2 Vod|<1, the ratios of the output currents IOP and IOM to the differential current Idiff are linearly represented. The area in which the above ratios are linearly represented is called a linear area. Further, in a range of |ΔVIA/2 Vod|≥1, the ratios of the output currents IOP and IOM to the differential current Idiff remain constant. The area in which the above ratios remain constant is called a slew rate (SR) area. In the SR area, the output current is restricted so as to remain constant, and therefore, a responding speed is drastically reduced.

Figure 13D:
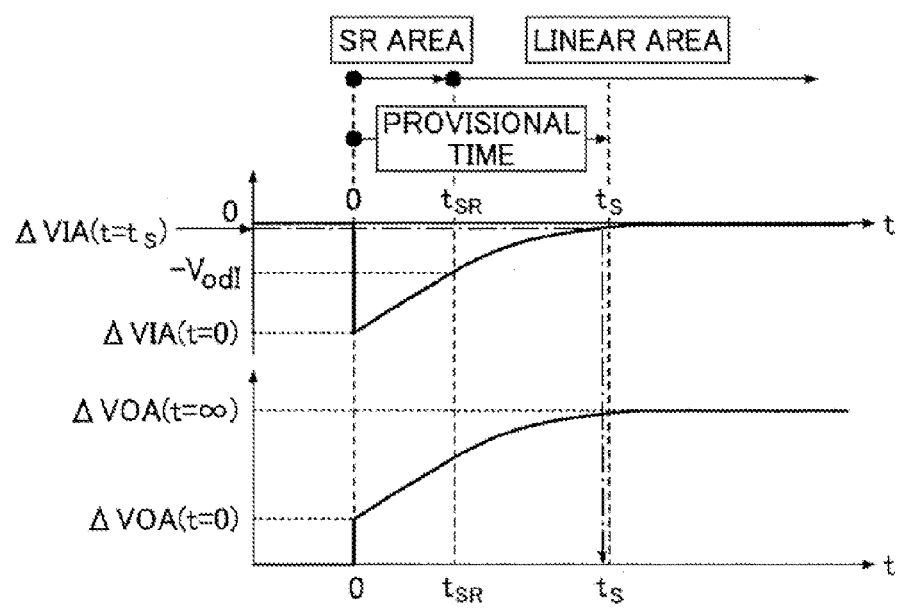

FIG. 13D is a diagram illustrating setting properties of the folded cascode operational amplifier of the comparative example, where a horizontal axis indicates time, and a vertical axis indicates ΔVIA and ΔVOA.

In FIG. 13D, the differential input potential difference ΔVIA is obtained by subtracting a voltage (VIAM) of an inverting input terminal from a voltage (VIAP) of a non-inverting input terminal illustrated in FIG. 13B. That is, ΔVIA=VIAP−VIAM.

As illustrated in FIG. 13D, the differential input potential difference ΔVIA is raised at a constant rate in the SR area (i.e. t=0 to tSR), and is then logarithmically raised in an area t=tSR to tS. Thereafter, ΔVIA becomes constant after a time tS.

Further, a differential-output potential difference ΔVOA is a potential difference of output voltages of the output stage 130, which is obtained by subtracting a voltage VOM of a minus side of the differential output from a voltage VOP of a plus side of the differential output. That is, ΔVOA=VOP−VOM.

As illustrated in FIG. 13D, the differential-output potential difference ΔVOA is raised at a constant rate in the SR area (i.e. t=0 to tSR), and is then logarithmically raised in an area t=tSR to tS. Thereafter, ΔVOA becomes constant after a time tS.

Thus, the setting time indicates t=0 to tS. After the setting time has elapsed, the differential input potential difference ΔVIA and the differential-output potential difference ΔVOA fall within an acceptable error range.

Figure 14A:
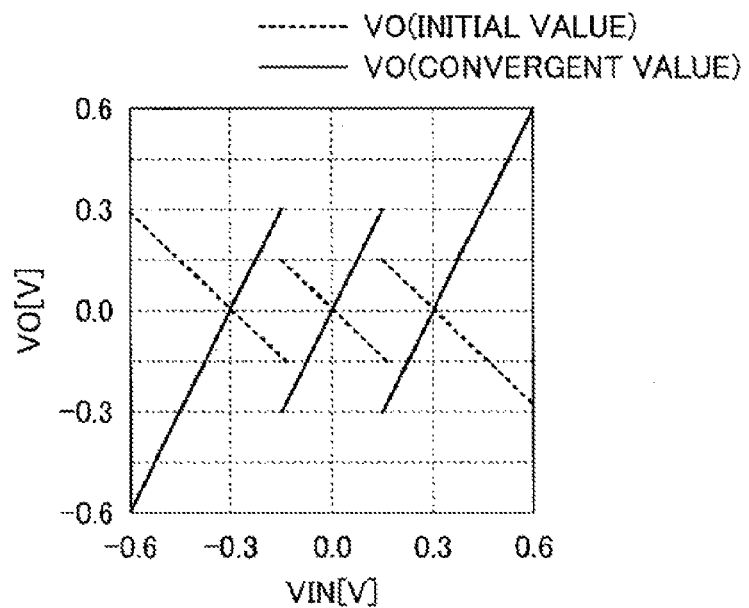
FIGS. 14A to 14D are diagrams illustrating input-output properties of the comparative examples of the 1.5b-MDAC and the 2.5b-MDAC, ΔVIA/2 Vod properties corresponding to an analog input signal VIN.
Figure 14B:
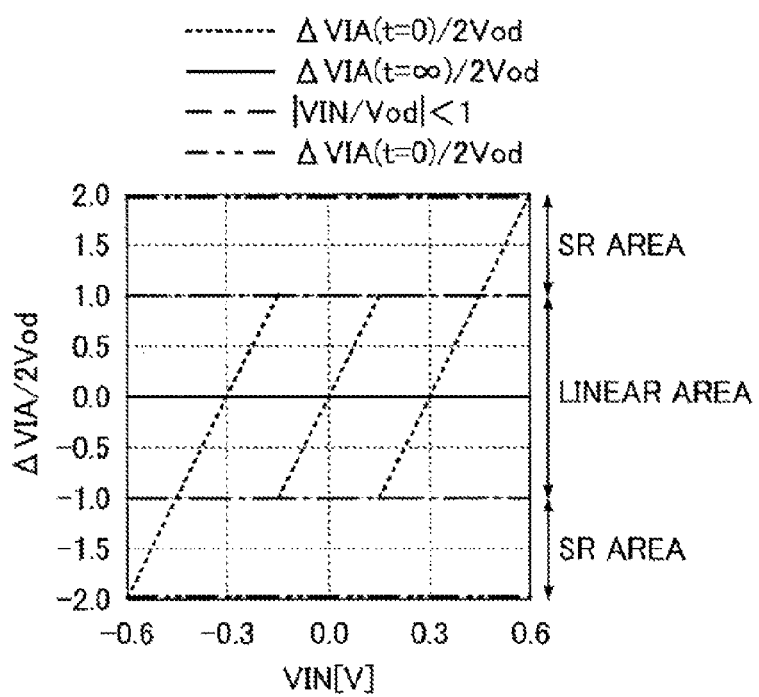
Figure 14C:
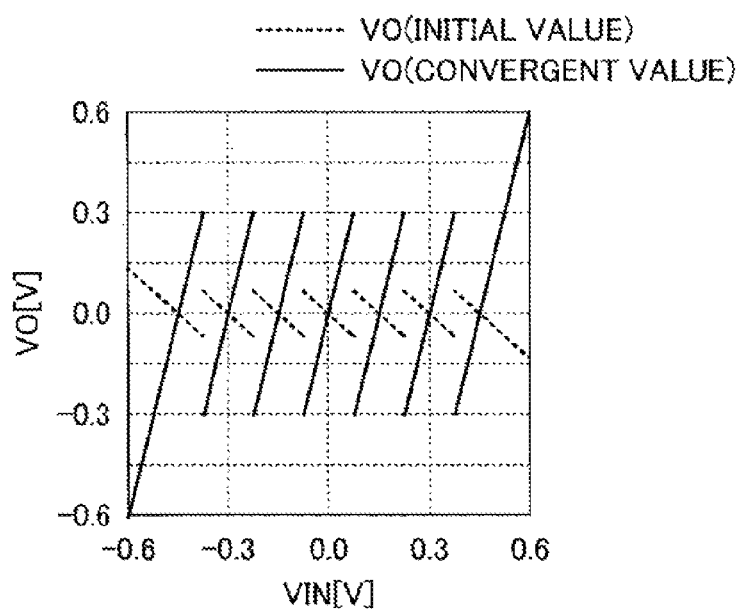
Figure 14D:
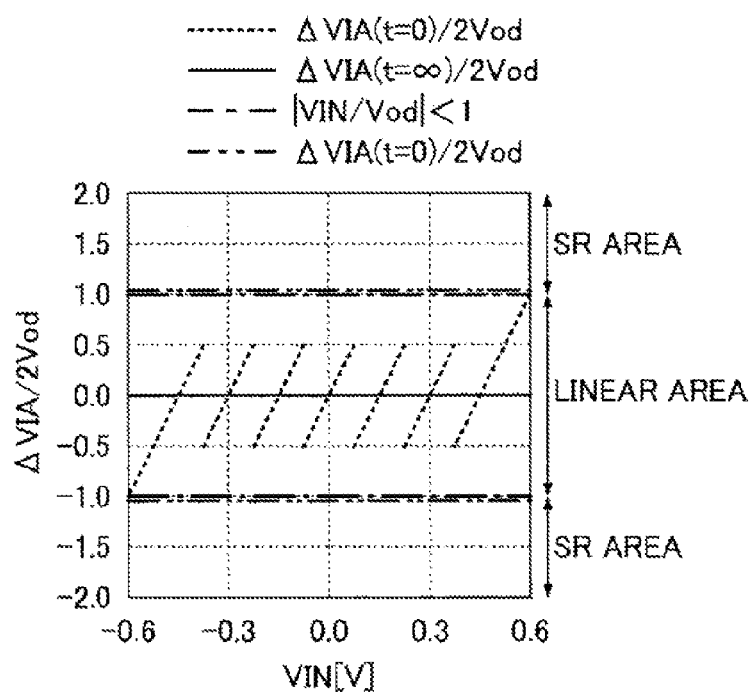

FIGS. 14A to 14D are diagrams illustrating input-output properties of the comparative examples of the 1.5b-MDAC and the 2.5b-MDAC, and ΔVIA/2 Vod properties corresponding to an analog input signal VIN. FIG. 14A is a diagram illustrating input-output properties of the comparative examples of the 1.5b-MDAC, and FIG. 14B is a diagram illustrating ΔVIA/2 Vod properties corresponding to an analog input signal VIN of the comparative example of the 2.5b-MDAC. FIG. 14C is a diagram illustrating input-output properties of the comparative examples of the 2.5b-MDAC, and FIG. 14D is a diagram illustrating ΔVIA/2 Vod properties corresponding to an analog input signal VIN of the comparative example of the 2.5b-MDAC.

Note that the comparative example of the 1.5b-MDAC corresponds to the MDAC 70A illustrated in FIG. 9A, and the comparative example of the 2.5b-MDAC corresponds to the MDAC 90A illustrated in FIG. 9D.

Further, the properties illustrated in FIGS. 14A to 14D are obtained under the following preconditions: the analog input signal VIN(peak-to-peak) is 1.2 V; a current ratio Ka (=Iout/Idiff) of a differential current Idiff of the differential input stage 120 and an output current Iout of the output stage 130 is 1; and an overdrive voltage Vod of all the transistors contained in the folded cascode operational amplifier is 0.15 V. The analog input signal VIN=1.2 V (peak-to-peak) is ±0.6 V, which is a condition in which the analog input signal VIN is four times the overdrive voltage Vod.

Further, settings of the comparative example of the 1.5b-MDAC 70A are as follows: the signal amplification factor m=2; the ADC50A is 1.5b; 2Nb/m=1.4; the feedback amount β=⅓; an input-output range (VOF/VINF)=1; and the maximum value of |ΔVIA/2 Vod| is 2. Note that Nb represents the number of bits of the ADC 50A, and Nb indicates 1.5 in this comparative example.

Further, settings of the comparative example of the 2.5b-MDAC 90A are as follows: the signal amplification factor m=4; the ADC50A is 2.5b; 2Nb/m=1.4; the feedback amount β=⅕; an input-output range (VOF/VINF)=1; and the maximum value of |ΔVIA/2 Vod| is 1. Note that Nb represents the number of bits of the ADC 50A, and Nb indicates 2.5 in this comparative example.

As illustrated in FIG. 14A, input-output properties of the comparative example of the 1.5b-MDAC 70A are indicated by broken lines when the analog output signal VO is an initial value (t=0). Further, input-output properties of the comparative example of the 1.5b-MDAC 70A are indicated by solid lines when the analog output signal VO is a convergence value (t=∞). Note that the initial value (t=0) indicates a value at a time where the capacitors 71, 72, and 73 are connected to the operational amplifier 74 for conducting the analog arithmetic operation in the MDAC 70A. Further, the convergence value (t=∞) indicates a value finally obtained after a sufficient time has elapsed from the time at which the capacitors 71, 72, and 73 are connected to the operational amplifier 74.

Further, in FIG. 14B, Ka=1, and hence, |ΔVIA/2 Vod|≤1 indicates the linear area while ΔVIA/2 Vod|<−1 and 1<|ΔVIA/2 Vod indicate the SR areas. Note that ΔVIA(t=0)/2 Vod indicates +2.0 and −2.0.

As illustrated in FIG. 14B, properties of the ΔVIA/2 Vod corresponding to the analog input signal ΔVIN of the comparative example of the 1.5b-MDAC 70A are as follows. Although the ΔVIA (t=∞)/2 Vod is 0, the ΔVIA (t=0)/2 Vod is less than −1.0 in a range of VIN≤−0.45, and greater than +1.0 in a range of +0.45<VIN as illustrated by broken lines in FIG. 14B.

Accordingly, when |ΔVIA/2 Vod|≤1 is established in a range of VIN≤−0.45 and +0.45<VIN (i.e., +0.45<VIN≤−0.45), the ΔVIA (t=∞)/2 Vod is in the SR area after exceeding the linear area.

As illustrated in FIG. 14C, input-output properties of the comparative example of the 2.5b-MDAC 90A are indicated by broken lines when the analog output signal VO is an initial value (t=0). Further, input-output properties of the comparative example of the 1.5b-MDAC 70A are indicated by solid lines when the analog output signal VO is a convergence value (t=∞). Note that the initial value (t=0) indicates a value at a time where the capacitors 91, 92, and 93 are connected to the operational amplifier 74 for conducting the analog arithmetic operation in the MDAC 90A. Further, the convergence value (t=∞) indicates a value finally obtained after a sufficient time has elapsed from the time at which the capacitors 91, 92, and 93 are connected to the operational amplifier 74.

As illustrated in FIG. 14D, since input-output properties of the comparative examples of the 2.5b-MDAC 90A includes Ka=1, |ΔVIA/2 Vod|≤1 indicates the linear area while ΔVIA/2 Vod<−1 and 1<ΔVIA/2 Vod indicate the SR areas. Note that ΔVIA(t=0)/2 Vod indicates +2.0 and −2.0.

As illustrated in FIG. 14D, properties of the ΔVIA/2 Vod corresponding to the analog input signal ΔVIN of the comparative example of the 2.5b-MDAC 90A are as follows. Although the ΔVIA (t=∞)/2 Vod is 0, the ΔVIA (t=0)/2 Vod=−1.0 when VIN=−0.6, and ΔVIA (t=0)/2 Vod=+1.0 when of +0.6 as illustrated by broken lines in FIG. 14D.

Accordingly, −1.0≤ΔVIA(t=0)/2 Vod≤1.0 in a range of −0.6≤VIN≤+0.6 falls in a linear area; however, the VIN in two ends of the graph indicate, though falling within the linear area, almost exceeding the linear area.

As described above, in the comparative examples of the operational amplifiers 74, and 100A to 100D, the circuit is designed such that the current ratio Ka=Iout/Idiff satisfies Ka≥1. Accordingly, the output stage 130 may include a sufficiently large size (capacitance).

Further, when the current ratio is set as Ka=1, the operating area of the comparative example of the 1.5b-MDAC 70A may fall in the SR area as illustrated in FIG. 13B, and the operating area of the comparative example of the 2.5b-MDAC 90A may, though falling within the linear area, almost exceed the linear area with the VIN reaching the maximum value and the minimum value.

Accordingly, when the comparative examples of the operational amplifiers 74, and 100A to 100D are applied to the 1.5b-MDAC 70A, the operating area falls in the SR area, which may result in the degradation of arithmetic operation speed. Further, the comparative examples of the operational amplifiers 74, and 100A to 100D have a large parasitic capacitance Cpo, which may also result in degradation of arithmetic operation speed.

Further, when the comparative examples of the operational amplifiers 74, and 100A to 100D are applied to the 2.5b-MDAC 90A, the operating area will not fall in the SR area but the sizes of the operational amplifiers 74, and 100A to 100D will not be reduced. As a result, the operational amplifiers 74, and 100A to 100D still have a large parasitic capacitance Cpo, which may exhibit the degradation of arithmetic operation speed.

Further, in the comparative examples of the operational amplifiers 74, and 100A to 100D, the operational amplifiers 74, and 100A to 100D have a large parasitic capacitance Cpo, which may also result in degradation of arithmetic operation speed.

Further, in general, the capacitance of the MDAC may need to be determined including a thermal noise (kT/C) factor in order to maintain high conversion accuracy. The operating voltage lowered by the use of micro-fabrication may reduce the amplitude of the analog input signal. Hence, the capacity of the MDAC itself may need to be increased in order to secure conversion accuracy identical to those produced without the use of the micro-fabrication. As a result, the MDAC may result in an increase in size and power consumption and reduction in an operation speed.

Accordingly, embodiments described below may provide an operational amplifier, an analog arithmetic circuit, and an analog to digital converter from which the above-described disadvantages are eliminated.

A description is given, with reference to the accompanying drawings, of preferred embodiments to which an operational amplifier, an analog arithmetic circuit, and an analog to digital converter are applied.

EMBODIMENTS

FIGS. 15A to 15D are diagrams illustrating respective circuit configurations of a folded cascode operational amplifier according to an embodiment.

In the following, same reference numerals are assigned to elements identical to those of the comparative examples of the folded cascode operational amplifiers 100A to 100D, and such overlapped elements are not repeatedly described.

Figure 15A:
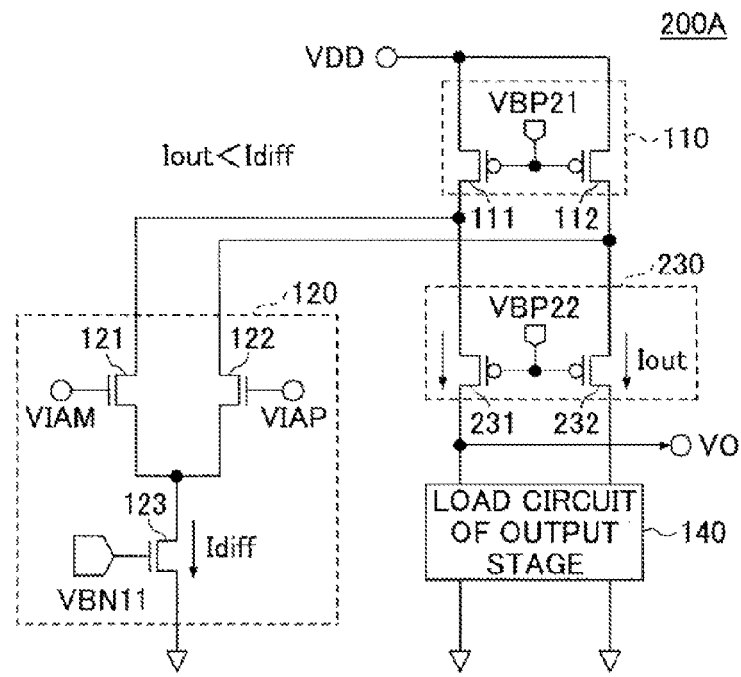
FIGS. 15A to 15D are diagrams illustrating circuit configurations of a folded cascode operational amplifier according to an embodiment.

As illustrated in FIG. 15A, a basic type folded cascode operational amplifier 200A according to the embodiment includes a constant current source 110, a differential input stage 120, and an output stage 230.

The constant current source 110 includes a pair of NMOSFETs 111 and 112. The constant current source 110 is the same as the constant current source 110 of the comparative example of the folded cascode operational amplifier 100A.

The differential input stage 120 is cascode-connected to the constant current source 110, and includes a pair of n-type metal oxide silicon field effect transistors (NMOSFETs) 121 and 122, and an NMOSFET 123 configured to output a differential current. The differential input stage 120 is the same as the differential input stage 120 of the comparative example of the folded cascode operational amplifier 100A.

The output stage 230 is cascode-connected to the constant-current source 110, and includes PMOSFETs 231 and 232. Drains of the PMOSFETs 231 and 232 are connected to sources of the PMOSFETs 111 and 112, and sources of the PMOSFETs 231 and 232 are connected to a load circuit 140 of the output stage 230.

A voltage VPB22 is applied to gates of the PMOSFETs 231 and 232. A voltage of the source of the PMOSFET 231 corresponds to a voltage of an output terminal of the operational amplifier 200A, and hence, the output terminal of the operational amplifier 200A is configured to output a voltage VO. Further, the current flowing in the respective drain-source intervals of the PMOSFETs 231 and 232 corresponds to an output current Iout of the output stage 230.

Figure 15B:
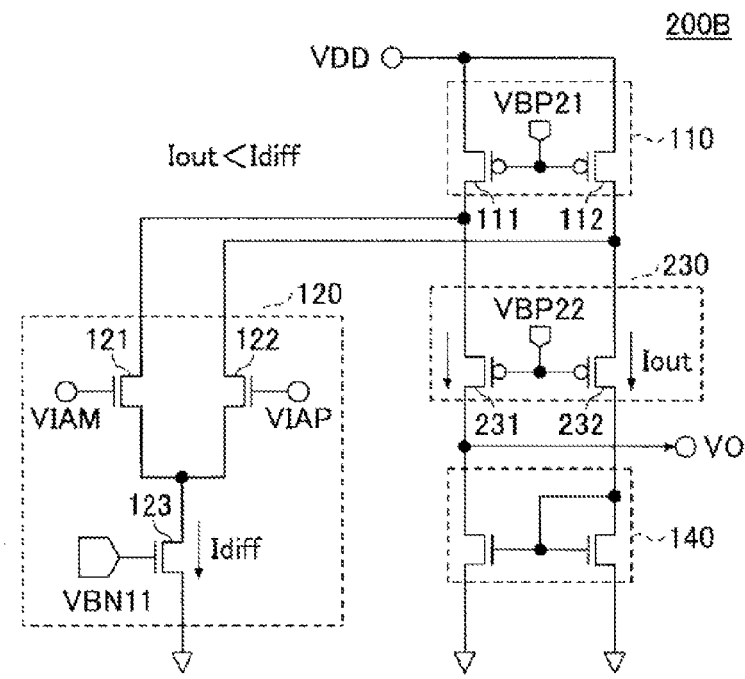

A single end-type folded cascode operational amplifier 200B according to an embodiment illustrated in FIG. 15B includes a constant current source 110, a differential input stage 120, and an output stage 230. The output stage 230 is connected to a load circuit 140. The load circuit 140 is formed of a current mirror circuit configured to output equal currents from its left and right terminals.

Figure 15C:
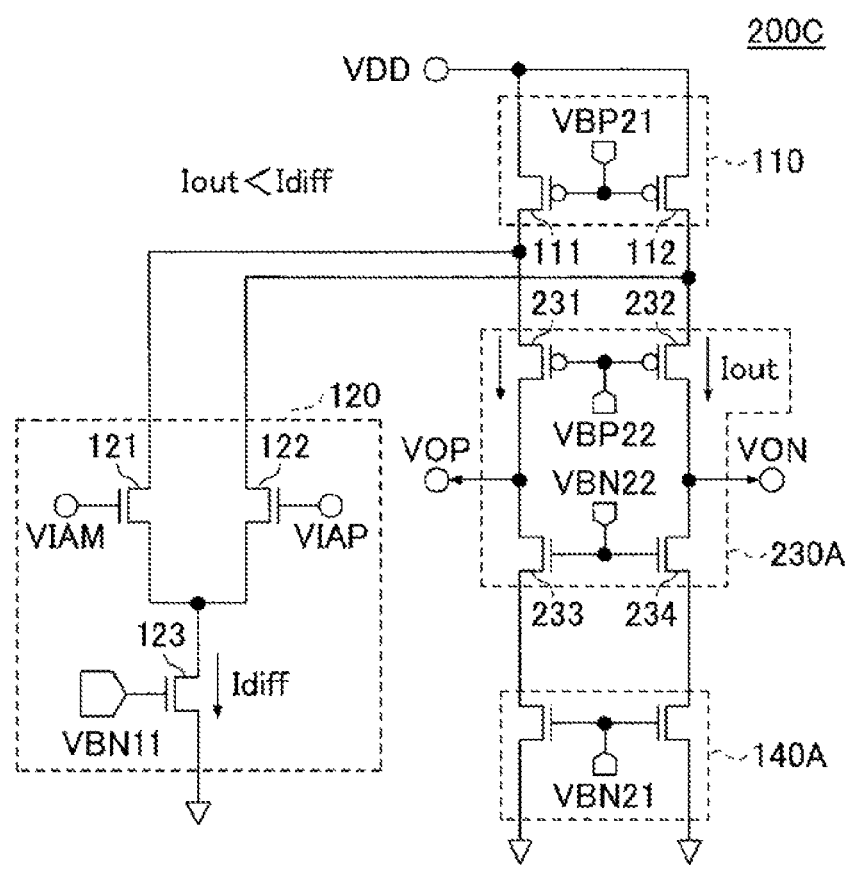

A full differential output type folded cascode operational amplifier 200C according to am embodiment illustrated in FIG. 15C includes a constant current source 110, a differential input stage 120, and an output stage 230A. The output stage 230A is connected to a load circuit 140A.

The output stage 130A includes NMOSFETs 233 and 234 that are cascode-connected to PMOSFETs 231 and 232. Sources of the NMOSFETs 233 and 234 are connected to sources of the PMOSFETs 231 and 232, and drains of the NMOSFETs 233 and 234 are connected to sources of a pair of NMOSs of a load circuit 140A. A voltage VBN22 is applied to gates of the NMOSFETs 233 and 234.

The load circuit 140A includes a pair of NMOSFETs. Sources of the pair of NMOSFETs of the load circuit 140A are connected to the drains of the NMOSFETs 233 and 234, a voltage VBN21 is applied to gates of the NMOSFETs of the load circuit 140A, and drains of the NMOSFETs of the load circuit 140A serve output terminals.

Figure 15D:
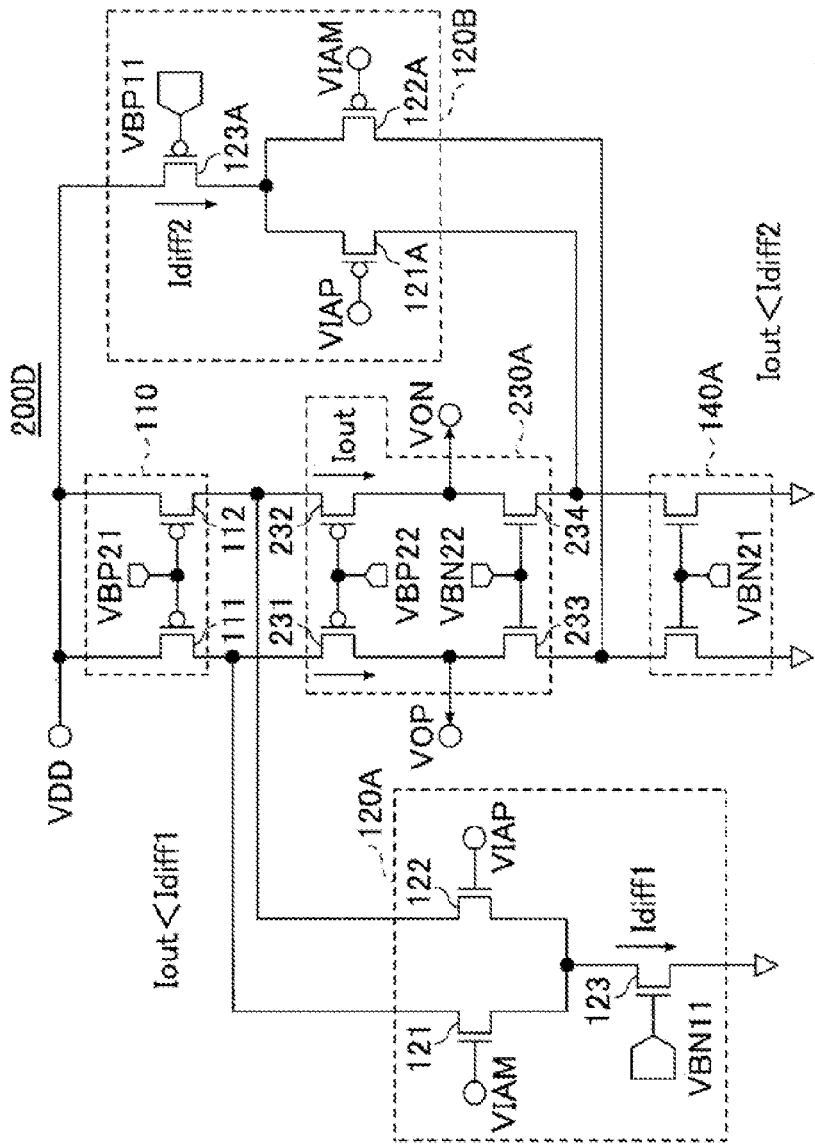

A folded cascode operational amplifier 200D having two differential input stages according to an embodiment illustrated in FIG. 15D includes a constant current source 110, differential input stages 120A and 120B, and an output stage 230A. The output stage 230A is connected to a load circuit 140A.

Note that the differential input stage 120A is the same as the differential input stage 120 illustrated in FIG. 15A to 15C. The differential input stage 120B includes PMOSFETs 121A, 122A, and 123A. The differential input stage 120B includes an inverted circuit configuration of the differential input stage 120A. A drain of the PMOSFET 123A is connected to a power source VDD, and a source of the PMOSFET 123A is connected to drains of the NMOSFETs 121A and 122A so as to output a differential current Idiff2. Sources of the NMOSFETs 121A and 122A are connected to sources of the pair of the NMOSFETs of the load circuit 140A, respectively.

In the circuit configurations of the folded cascode operational amplifiers 200A to 200D according to the embodiments, the differential input stage 120 and one of the output stages 230 and 230A are designed such that a current ratio of an output current Iout of one of the output stages 230 and 230A to a differential current Idiff of the differential input stage 120 that is represented by Ka=Iout/Idiff satisfies Ka<1.

The above circuit configuration is implemented by reducing the sizes of the PMOSFETs 231 and 232 of the output stage 230 or 230A.

Figure 16B:
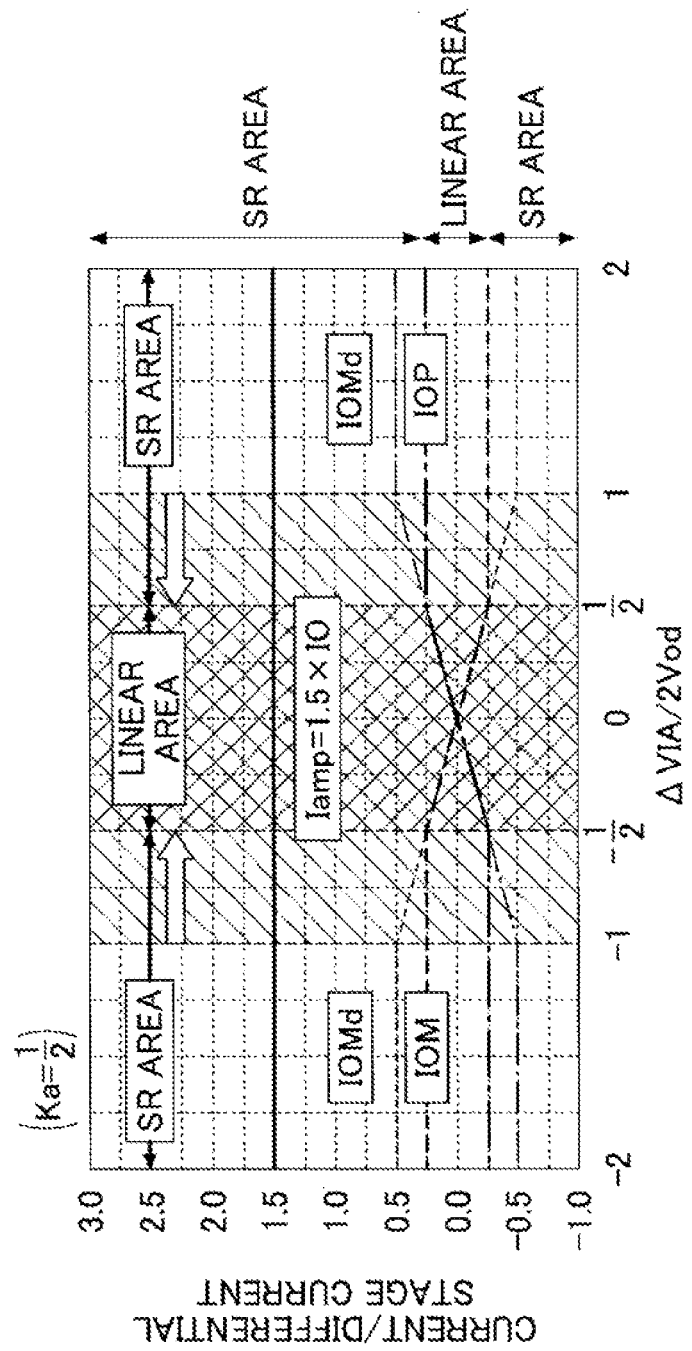

FIGS. 16A and 16B are diagrams illustrating an operating mode and an operating area of the folded cascode operational amplifier 200A according to the embodiment.

A potential difference ΔVIA of a differential input, output currents IOP and IOM, and an operating mode of the folded cascode operational amplifier 100A according to the embodiment are summarized in FIG. 16A.

Note that Vod indicates an overdrive voltage of all transistors contained in the folded cascode operational amplifier 100A, and hence, the Vod is an identical value for all the transistors including the transistors of the differential input stage 120. The overdrive voltage Vod is obtained by computing the difference (Vgs−Vth) between a gate-source interval voltage Vgs and a threshold voltage Vth of all the transistors contained in the folded cascode operational amplifier 200A.

In a range of |ΔVIA/2 Vod|<Ka, the output currents IOP and IOM are ±(I0/2Vod)×(ΔVIA/2), which is an operating area in which the folded cascode operational amplifier 200A performs a linear operation.

Further, in a range of |ΔVIA/2 Vod|≥Ka, the output currents IOP and IOM are ±Ka×Idiff/2, which is a slew rate (SR) area of the folded cascode operational amplifier 200A.

FIG. 16B illustrates an operating area of the folded cascode operational amplifier 200A according to the embodiment, where a horizontal axis indicates ΔVIA/2 Vod, and a vertical axis indicates ratios of the output currents IOP and IOM to the differential current Idiff. Note that FIG. 16B includes an operating area when Ka=½ is set.

As illustrated in FIG. 16B, in a range of |ΔVIA/2 Vod|<½, the ratios of the output currents IOP and IOM to the differential current Idiff are linearly represented. Accordingly, a linear area is obtained. Further, in a range of |ΔVIA/2 Vod|≥½, the ratios of the output currents IOP and IOM to the differential current Idiff remain constant, and such an area where the ratios of the output currents IOP and IOM to the differential current Idiff remain constant corresponds to a slew rate (SR) area.

In the SR area, the output current is restricted so as to remain constant, and therefore, a responding speed is drastically reduced. Accordingly, in the circuit configurations of the folded cascode operational amplifier 200A according to the embodiment, an input range is limited such that a current ratio of an output current Iout of the output stages 230 to a differential current Idiff of the differential input stage 120 that is represented by Ka=Iout/Idiff satisfies Ka<1, and $|\Delta VIA/2 Vod| \leq Ka < 1$ is established.

Conditions of the folded cascode operational amplifier 200A according to the embodiment are summarized below.

a current ratio $Ka(=Iout/Idiff)<1$. (Condition 1)

$Max.(|\Delta VIA/2\ Vod|) \leq Ka < 1$. (Condition 2)

Accordingly, in the circuit configurations of the folded cascode operational amplifier 200A according to the embodiment, a differential current Idiff indicates a differential current of the differential input stage 120, an output current Iout indicates an output current of the output stages 230, ΔVIA indicates a potential difference of the differential input, and Vod indicates overdrive voltage of all the transistors contained in the operational amplifier 200A.

The condition 1 is set for reducing the sizes (i.e., a gate width and a gate length) of the PMOSFETs 231 and 232 of the output stage 230. The above condition 1 is set for improving the arithmetic operation speed by reducing the parasitic capacitances Cpo of the PMOSFETs 231 and 232 of the output stage 230.

However, when the arithmetic operation operates in the slew rate area (SR area), reducing the above parasitic capacitances of the output stage 230 will not improve the arithmetic operation speed. Hence, the condition 2 is provided for that reason.

The condition 2 is set for restricting an absolute value of the differential input ΔVIA of the operational amplifier 200A for causing the operational amplifier 200A to operate in the linear area. Since the size of the output stage 230 is reduced based on the condition 1 so as to limit the output current, $|\Delta VIA/2\ Vod|$ may also be limited.

For example, as illustrated in FIG. 16B, when a current ratio Ka of an output current Tout of the output stages 230 to a differential current Idiff of the differential input stage 120 is ½, a range of the linear area is limited to a range represented by $|\Delta VIA/2\ Vod| \leq ½$.

Accordingly, when the transistor of the output stage 230 is configured such that the size of the transistor satisfies the condition 1, the input range may be limited to satisfy the condition 2.

Hence, the operating area will not be deviated from the linear area by designing the output stage 230 to satisfy the conditions 1 and 2.

Figure 17A:
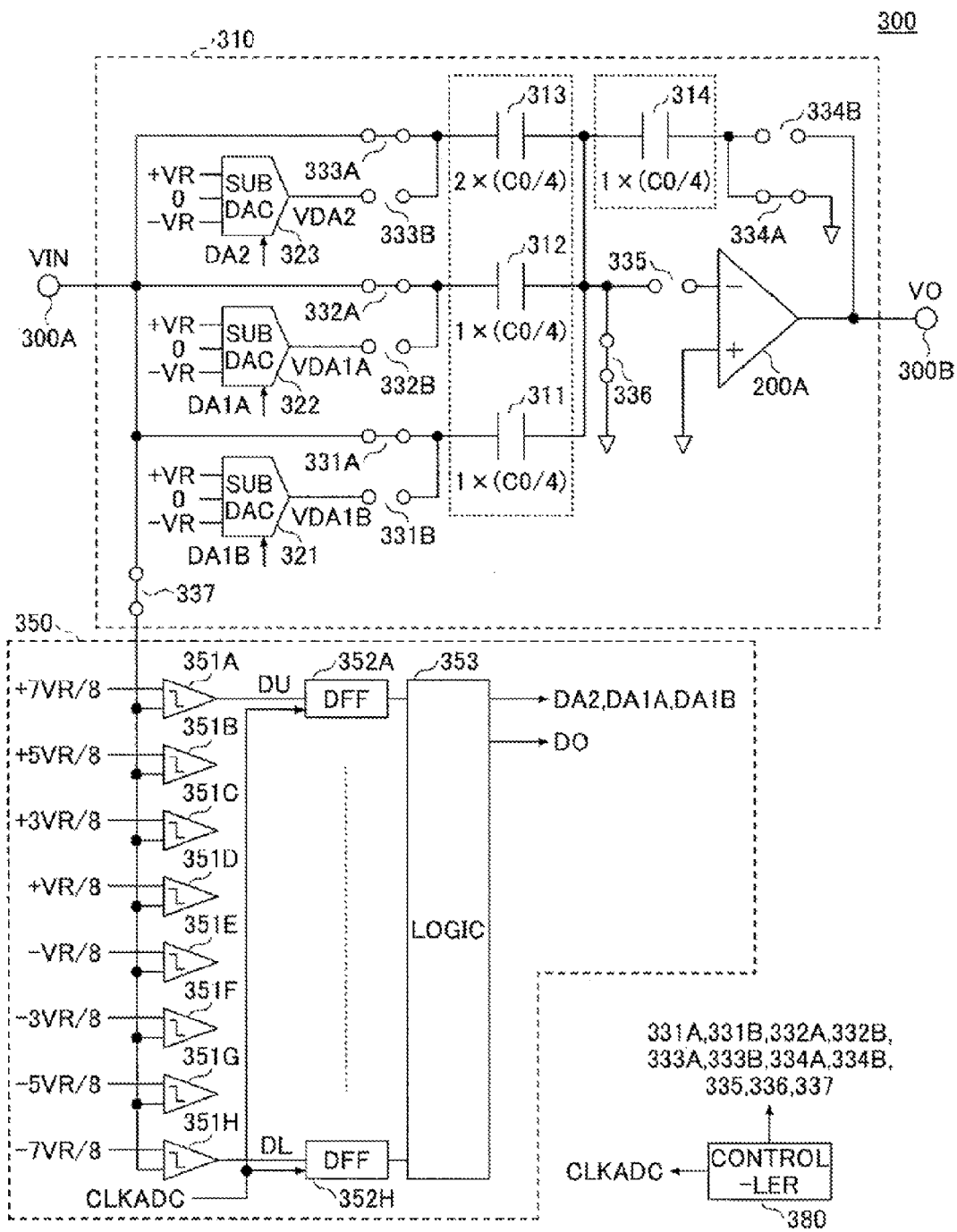
FIGS. 17A and 17B are diagrams illustrating a circuit configuration of a 3b-ADC cell 300 having an amplification factor of 4 in a folded cascode operational amplifier according to an embodiment.
Figure 17B:
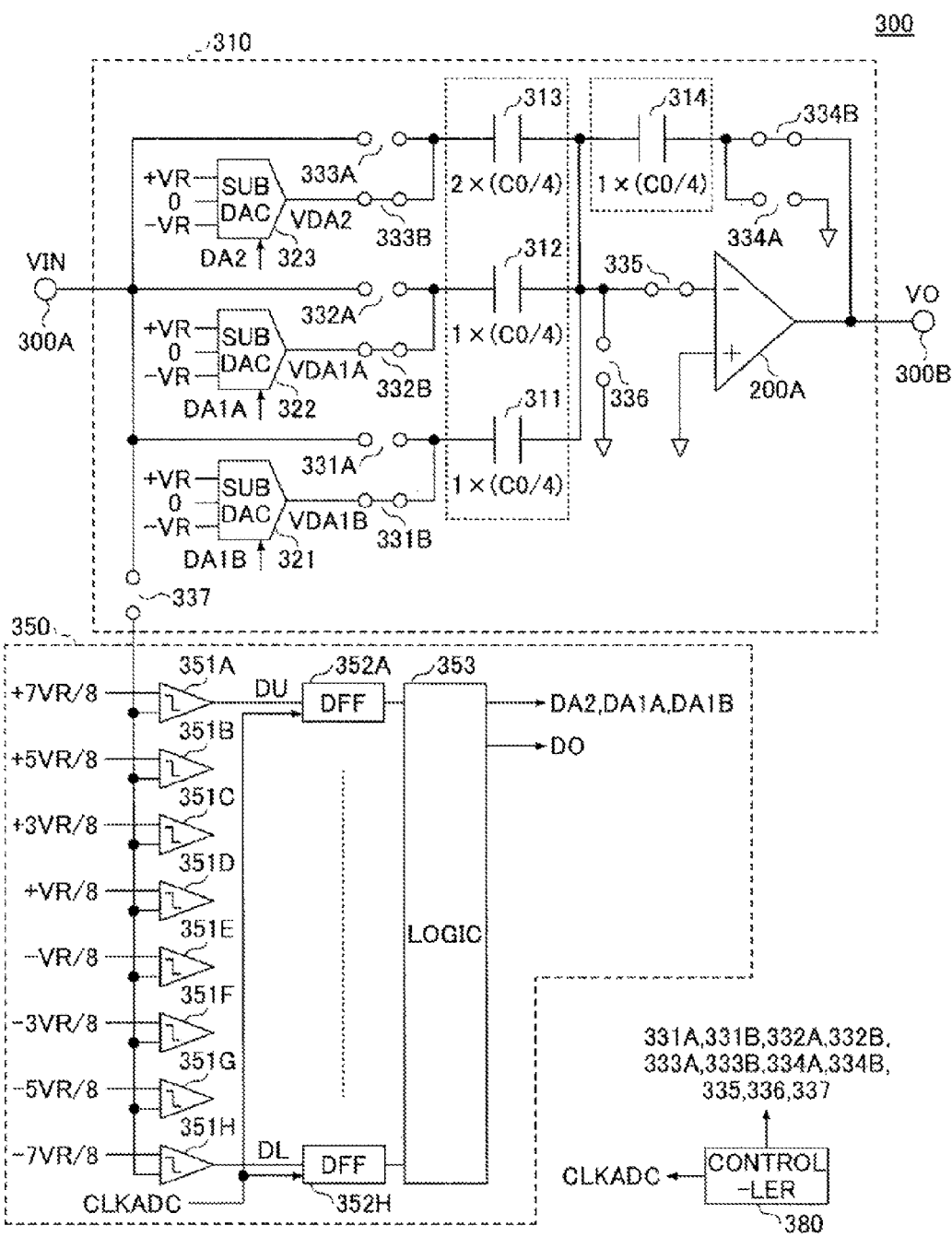

FIGS. 17A and 17B are diagrams, each illustrating a circuit configuration of an ADC cell 300 according to an embodiment. More specifically, FIG. 17A illustrates a connection status of the ADC cell 300 in a sampling operation, and FIG. 17B illustrates a connection status of the ADC cell 300 in an analog arithmetic operation. The ADC cell 300 according to the embodiment is a 3b (3 bit)-ADC cell.

The ADC cell 300 includes a multiplying digital to analog converter (MDAC) 310, a sub-ADC 350A, and a controller 380. A signal amplification factor m of the ADC cell 300 is 4 (m=4).

The MDAC 310 is a 3b-MDAC that includes capacitors 311, 312, 313 and 314, an operational amplifier 200A, digital to analog converters (DAC) 321, 322, and 323, and switches 331A, 331B, 332A, 332B, 333A, 333B, 334A, 334B, 336, and 337.

First ends (terminals on the left side of FIGS. 17A and 17B) of the capacitors 311, 312 and 313 are connected to an input terminal 300A of the ADC cell 300 via the switches 331A, 332A and 333A. Second ends (terminals on the right side of FIGS. 17A and 17B) of the capacitors 311, 312 and 313 are connected to one another, which are then connected to a first end (a terminal on the left side of FIGS. 7A and 7B) of the capacitor 314, and to the switches 335 and 336. Note that the capacitors 311, 312 and 313 are examples of input elements of the folded cascode operational amplifier 200A.

The first end (a terminal on the left side of FIGS. 17A and 17B) of the capacitor 314 is connected to the second ends (terminals on the right side of FIGS. 17A and 17B) of the capacitors 311, 312 and 313, and a second end (a terminal on the right side of FIGS. 17A and 17B) of the capacitor 314 is connected to the switches 334A and 334B. The second end (a terminal on the right side of FIGS. 17A and 17B) of the capacitor 314 is connected to an output terminal of the operational amplifier 200A via the switch 334B. A second end of a switch 334A is grounded. Note that the capacitor 314 is an example of the feedback element of the folded cascode operational amplifier 200A.

Note that capacitances of the capacitors 311, 312 and 314 are C0/4, and a capacitance of the capacitor 313 is C0/2 (=2×C0/4). Note that C0 represents a predetermined standard capacitance.

The operational amplifier 200A includes an inverting input terminal that is connected to a connection point of the first end (a terminal on the left side of FIGS. 17A and 17B) of the capacitor 314 and the second ends (terminals on the right side of FIGS. 17A and 17B) of the capacitors 311, 312 and 313 via the switch 335. Further, the operational amplifier 200A includes a non-inverting input terminal that is grounded, and an output terminal that is connected to the output terminal 300B of the ADC cell 300 as well as being connected to the second end (a terminal on the right side of FIGS. 17A and 17B) of the capacitor 314 via the switch 334B. The operational amplifier 200A is configured to input a voltage at a connection point of the capacitors 311, 312, 313 and 314 to its inverting input terminal, and output the analog output signal VO to the output terminal 300B.

Digital to analog converters (DAC) 321 and 322 are configured to output analog signals represented by m×DA1A×VR/4 and m×DA1B×VR/4 based on the add-subtract counts DA1A and DA1B output from the sub-ADC 350. The DAC 321 is connected to the first end (a terminal on the left side of FIGS. 17A and 17B) of the capacitor 311 via the switch 331B, and the DAC 322 is connected to the first end (a terminal on the left side of FIGS. 17A and 17B) of the capacitor 312 via the switch 332B.

A digital to analog converter (DAC) 323 is configured to output an analog signal represented by m×DA2×VR/2 based on an add-subtract count DA2 output from the sub-ADC 350. The DAC 323 is connected to the first end (a terminal on the left side of FIGS. 17A and 17B) of the capacitor 313 via the switch 333B.

The switches 331A, 331B, 332A, 332B, 333A, 333B, 334A, 334B, 335, 336, and 337 are connected as illustrated in FIG. 17A, which are switched ON (close) or OFF (open) by the controller 380.

The sub-ADC 350 is formed of a 3b (3 bits) sub-ADC circuit that includes comparators 351A to 351H, data flip flops (DFFs) 352A to 352H, and a logic circuit 353. The DFFs 352A to 352H are respectively connected between output terminals of the comparators 351A and 351H and input terminals of the logic circuit 353. Hence, the DFFs 352A to 352H output, when a clock CLKADC is at a high (H) level, output signals of the comparators 351A and 351H to the logic circuit 353. Note that DFFs 352B to 352G are omitted from FIGS. 17A and 17B for facilitating viewability of the circuit configurations.

The sub-ADC 350 is configured to compare an analog input signal VIN based on comparison voltages (+7VR/8, +5VR/8, +3VR/8, +VR/8, −VR/8, −3VR/8, −5VR/8, and −7VR/8), and output a nine-valued digital code DO and the add-subtract counts DA1A, DA1B and DA2 according to a level of the analog input signal VIN.

The comparator 351A switches an output signal to a high level (H) when the analog input signal VIN is higher than the comparison voltage (+7VR/8), whereas the comparator 351A switches an output signal to a low level (L) when the analog input signal VIN is lower than the comparison voltage (+7VR/8).

The comparator 351B switches an output signal to a high level (H) when the analog input signal VIN is higher than the comparison voltage (+5VR/8), whereas the comparator 351B switches an output signal to a low level (L) when the analog input signal VIN is lower than the comparison voltage (+5VR/8).

The comparator 351C switches an output signal to a high level (H) when the analog input signal VIN is higher than the comparison voltage (+3VR/8), whereas the comparator 351C switches an output signal to a low level (L) when the analog input signal VIN is lower than the comparison voltage (+3VR/8).

The comparator 351D switches an output signal to a high level (H) when the analog input signal VIN is higher than the comparison voltage (+VR/8), whereas the comparator 351D switches an output signal to a low level (L) when the analog input signal VIN is lower than the comparison voltage (+VR/8).

The comparator 351E switches an output signal to a high level (H) when the analog input signal VIN is higher than the comparison voltage (−VR/8), whereas the comparator 351E switches an output signal to a low level (L) when the analog input signal VIN is lower than the comparison voltage (−VR/8).

The comparator 351F switches an output signal to a high level (H) when the analog input signal VIN is higher than the comparison voltage (−3VR/8), whereas the comparator 351F switches an output signal to a low level (L) when the analog input signal VIN is lower than the comparison voltage (−3VR/8).

The comparator 351G switches an output signal to a high level (H) when the analog input signal VIN is higher than the comparison voltage (−5VR/8), whereas the comparator 351G switches an output signal to a low level (L) when the analog input signal VIN is lower than the comparison voltage (−5VR/8).

The comparator 351H switches an output signal to a high level (H) when the analog input signal VIN is higher than the comparison voltage (−7VR/8), whereas the comparator 351H switches an output signal to a low level (L) when the analog input signal VIN is lower than the comparison voltage (−7VR/8).

The logic circuit 353 is configured to output the digital codes DO and the add-subtract counts DA1A, DA1B, and DA2 based on the output signals of the comparators 351A to 351H. Note that a three-bit add-subtract count DA represented by 4×DA2+2×DA1A+DA1B is applied in this embodiment. The DA2 of the add-subtract count DA corresponds to the third bit of the digital code DO, the DA1A of the add-subtract count DA corresponds to the second bit of the digital code DO, and the DA1B of the add-subtract count DA corresponds to the first bit of the digital code DO.

The logic circuit 353 is configured to output "+100" as the digital code DO, output "+1" as the add-subtract count DA2, output "0" as the add-subtract count DA1A, and output "0" as the add-subtract count DA1B when the output signals of the comparators 351A to 351H are all at a high level (H).

The logic circuit 353 is configured to output "+011" as the digital code DO, output "0" as the add-subtract count DA2, output "+1" as the add-subtract count DA1A, and output "+1" as the add-subtract count DA1B when the output signal of the comparator 351A is at a low level (L), and the output signals of the comparators 351B to 351H are all at a high level (H).

The logic circuit 353 is configured to output "+010" as the digital code DO, output "0" as the add-subtract count DA2, output "+1" as the add-subtract count DA1A, and output "0" as the add-subtract count DA1B when the output signals of the comparators 351A and 351B are at a low level (L), and the output signals of the comparators 351C to 351H are all at a high level (H).

The logic circuit 353 is configured to output "+001" as the digital code DO, output "0" as the add-subtract count DA2, output "0" as the add-subtract count DA1A, and output "+1" as the add-subtract count DA1B when the output signals of the comparators 351A to 351C are at a low level (L), and the output signals of the comparators 351D to 351H are all at a high level (H).

The logic circuit 353 is configured to output "000" as the digital code DO, output "0" as the add-subtract count DA2, output "0" as the add-subtract count DA1A, and output "0" as the add-subtract count DA1B when the output signals of the comparators 351A to 351D are all at a low level (L), and the output signals of the comparators 351E to 351H are all at a high level (H).

The logic circuit 353 is configured to output "−010" as the digital code DO, output "0" as the add-subtract count DA2, output "−1" as the add-subtract count DA1A, and output "0" as the add-subtract count DA1B when the output signals of the comparators 351A to 351E are all at a low level (L), and the output signals of the comparators 351F to 351H are at a high level (H).

The logic circuit 353 is configured to output "−011" as the digital code DO, output "0" as the add-subtract count DA2, output "−1" as the add-subtract count DA1A, and output "−1" as the add-subtract count DA1B when the output signals of the comparators 351A to 351F are all at a low level (L), and the output signals of the comparators 351G and 351H are at a high level (H).

The logic circuit 353 is configured to output "−100" as the digital code DO, output "1" as the add-subtract count DA2, output "0" as the add-subtract count DA1A, and output "0" as the add-subtract count DA1B when the output signals of the comparators 351A to 351H are all at a low level (L).

The digital code DO is expressed by a nine-value representation composed of "+100", "+011", "+010", "+001", "0", "−001", "−010", "−011", and "−100", and each of the add-subtract counts DA1A, DA1B, and DA2 is expressed by a three-value representation composed of "+1", "0" and "−1".

The DAC 321 is configured to receive a reference voltage (−VR, 0, +VR) and the add-subtract count DA1B, and output an analog signal VDA1B represented by m×DA1B×(VR/4). When the amplification factor m is 4, and the add-subtract count DA1B is one of +1, 0, and −1, the analog signal VD1B becomes a corresponding one of +VR, 0, and −VR. The add-subtract count DA1B is supplied from the logic circuit 353 to the DAC 321.

The DAC 322 is configured to receive a reference voltage (−VR, 0, +VR) and the add-subtract count DA1A, and output an analog signal VDA1A represented by m×DA1A×(VR/4). When the amplification factor m is 4, and the add-subtract count DA1A is one of +1, 0, and −1, the analog signal VD1A becomes a corresponding one of +VR, 0, and −VR. The add-subtract count DA1A is supplied from the logic circuit 353 to the DAC 322.

The DAC 323 is configured to receive a reference voltage (−VR, 0, +VR) and the add-subtract count DA2, and output an analog signal VDA2 represented by m×DA2×(VR/4). When the amplification factor m is 4, and the add-subtract count DA2 is one of +1, 0, and −1, the analog signal VDA2 becomes a corresponding one of +VR, 0, and −VR. The add-subtract count DA2 is supplied from the logic circuit 353 to the DAC 323.

Next, operations of the MDAC 310 are described. Initially, the switches 331A, 332A, 333A, 334A, 336, and 337 are switched ON (close) while the switches 331B, 332B, 333B, 334B, and 335 are switched OFF (open) in an sampling operation illustrated in FIG. 17A. As a result, an input terminal 300A is connected to first ends (terminals on the left side of FIG. 17A) of the capacitors 311, 312 and 313.

Further, a reference potential is set as a voltage at a connection point of the capacitors 311, 312, 313, and 314. Thus, the capacitor 314 is reset by discharging electric charges.

Accordingly, the first ends (terminals on the left side in FIG. 17A) of the capacitors 311, 312 and 313 are charged with the analog input signal VIN supplied to the input terminal 300A.

Subsequently, the switches 331A, 332A, 333A, 334A, 336, and 337 are switched OFF (open) while the switches 331B, 332B, 333B, 334B, and 335 are switched ON (close) in an analog arithmetic operation illustrated in FIG. 17B.

As a result, the inverting input terminal of the operational amplifier 200A is connected to the connection point of the capacitors 311, 312, 313, and 314. Further, the first end (a terminal on the left side of FIG. 17B) of the capacitor 313 is connected to the output terminal of the DAC 313 via the switch 333B, and the first end (a terminal on the left side of FIG. 17B) of the capacitor 312 is connected to the output terminal of the DAC 322 via the switch 332B. Further, the first end (a terminal on the left side of FIG. 17B) of the capacitor 311 is connected to the output terminal of the DAC 321 via the switch 331B, and a second end (a terminal on the right side of FIG. 17B) of the capacitor 314 is connected to the output terminal of the operational amplifier 200A via the switch 334B.

The analog output signal VO of the operational amplifier 200A is represented by the following formula.

$$VO = 4 \times VIN - DA \times VR$$

The signal amplification factor m of the ADC cell 300 illustrated in FIGS. 17A and 17B is 4 (m=4). The signal amplification factor is determined by a ratio of a synthetic capacitance (C0/4+C0/4+2×C0/4=C0) of the capacitors 311, 312 and 313 and a capacitance (C0/4) of the capacitor 314.

The signal amplification factor is determined by the above ratio because the first end (a terminal on the left side of FIGS. 17A and 17B) of the capacitor 314 acquires the amount of charges having an opposite sign that equates to a total amount of charges generated in second ends (terminals on the right side of FIGS. 17A and 17B) of the capacitors 311, 312 and 313 while performing a sampling operation.

As described above, the ADC cell 300 is configured to perform an analog to digital conversion corresponding to a signal level of the analog input signal VIN supplied within a reference voltage range of +VR and −VR.

The MDAC 310 outputs an analog output signal VO (VO=4×VIN−DA×VR) by adding the DA×VR to or subtracting the DA×VR from a result of a quadrupled analog input signal VIN (=4×VIN). Note that the add-subtract count DA is any one of +3, +2, +1, 0, −1, −2 and −3.

Figure 18B:
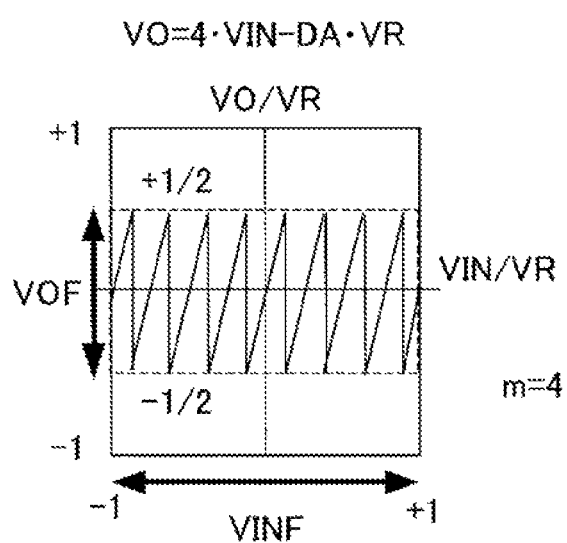
FIG. 18B is a diagram illustrating input-output properties of the ADC cell 300.

FIG. 18A is a diagram illustrating an operation of the ADC cell 300 in a table form, and FIG. 18B is a diagram illustrating input-output properties of the ADC cell 300. In FIG. 18B, a horizontal axis indicates an analog input signal represented by VIN/VR, and a vertical axis indicates an analog output signal represented by VO/VR.

FIG. 18A illustrates an analog input signal VIN(Vcmp), a digital code DO, an add-subtract count DA, analog signals VDA2, VDA1A, and VDA1B, and an analog output signal VO. Note that the analog input signal VIN supplied to the comparators 351A to 351H is expressed as an "analog input signal VIN(Vcmp)".

The digital code DO is "+100", and the add-subtract count DA is "+4" when the analog input signal VIN (Vcmp) is $⅞ \leq VIN/VR \leq +1$. Further, the analog signal VDA2 is "+VR", the analog signal VDA1A is "0", the analog signal VDA1B is "0", and the analog output signal VO is VO=4×VIN−4×VR.

The digital code DO is "+011", and the add-subtract count DA is "+3" when the analog input signal VIN(Vcmp) is $+⅝ \leq VIN/VR < +⅞$. Further, the analog signal VDA2 is "0", the analog signal VDA1A is "+VR", the analog signal VDA1B is "+VR", and the analog output signal VO is VO=4×VIN−3×VR.

The digital code DO is "+010", and the add-subtract count DA is "+2" when the analog input signal VIN(Vcmp) is $+⅜ \leq VIN/VR < +⅝$. Further, the analog signal VDA2 is "0", the analog signal VDA1A is "+VR", the analog signal VDA1B is "0", and the analog output signal VO is VO=4×VIN−2×VR.

The digital code DO is "+001", and the add-subtract count DA is "+1" when the analog input signal VIN(Vcmp) is $+⅛ \leq VIN/VR < +⅜$. Further, the analog signal VDA2 is "0", the analog signal VDA1A is "0", the analog signal VDA1B is "+VR", and the analog output signal VO is VO=4×VIN−VR.

The digital code DO is "000", and the add-subtract count DA is "0" when the analog input signal VIN(Vcmp) is $-⅛ \leq VIN/VR < +⅛$. Further, the analog signal VDA2 is "0", the analog signal VDA1A is "0", the analog signal VDA1B is "0", and the analog output signal VO is VO=4×VIN.

The digital code DO is "−001", and the add-subtract count DA is "−1" when the analog input signal VIN(Vcmp) is $-⅜ \leq VIN/VR < -⅛$. Further, the analog signal VDA2 is "0", the analog signal VDA1A is "0", the analog signal VDA1B is "−VR", and the analog output signal VO is VO=4×VIN+VR.

The digital code DO is "−010", and the add-subtract count DA is "−2" when the analog input signal VIN(Vcmp) is $-⅝ \leq VIN/VR < -⅜$. Further, the analog signal VDA2 is "−0", the analog signal VDA1A is "−VR", the analog signal VDA1B is "0", and the analog output signal VO is VO=4×VIN+2×VR.

The digital code DO is "−011", and the add-subtract count DA is "−3" when the analog input signal VIN(Vcmp) is $-⅞ \leq VIN/VR < -⅝$. Further, the analog signal VDA2 is "0", the analog signal VDA1A is "−VR", the analog signal VDA1B is "−VR", and the analog output signal VO is VO=4×VIN+3×VR.

The digital code DO is "−100", and the add-subtract count DA is "−4" when the analog input signal VIN(Vcmp) is $-1 \leq VIN/VR < -7/8$. Further, the analog signal VDA2 is "−VR", the analog signal VDA1A is "0", the analog signal VDA1B is "0", and the analog output signal VO is VO=4×VIN+4×VR.

Accordingly, the input-output properties of the ADC cell 300 are, as illustrated in FIG. 18A, VO=4×VIN−4×VR when $+7/8 \leq VIN/VR \leq +1$; VO=4×VIN−3×VR when $+5/8 \leq VIN/VR < +7/8$; VO=4×VIN−2×VR when $+3/8 \leq VIN/VR < +5/8$; and VO=4×VIN−VR when $+1/8 \leq VIN/VR < +3/8$. Further, VO=4×VIN when $-1/8 \leq VIN/VR < +1/8$; VO=4×VIN+VR when $-3/8 \leq VIN/VR < -1/8$; VO=4×VIN+2×VR when $-5/8 \leq VIN/VR < -3/8$; VO=4×VIN+3×VR when $-7/8 \leq VIN/VR < -5/8$; and VO=4×VIN+4×VR when $-1 \leq VIN/VR < -7/8$.

Figure 19A:
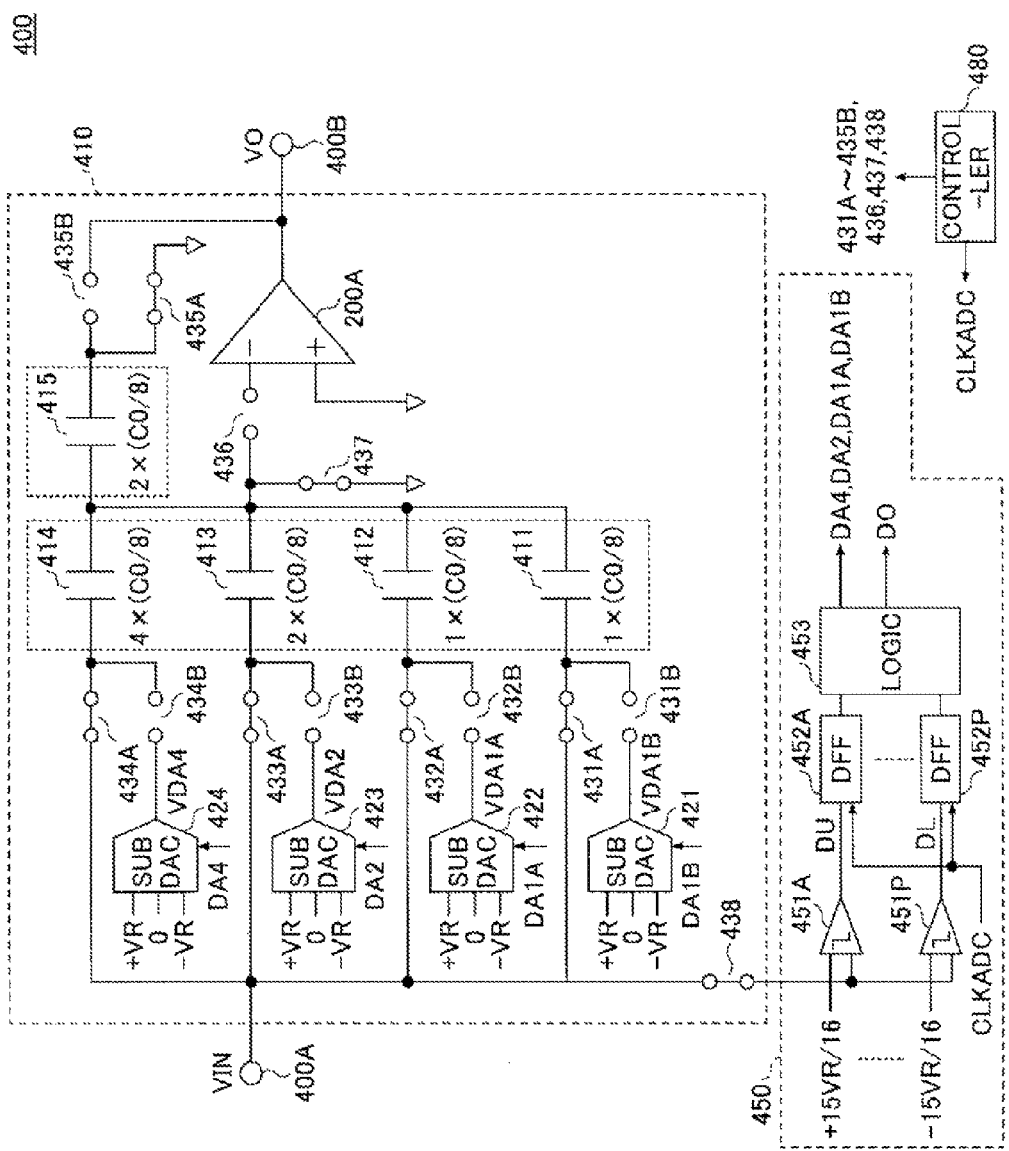
FIGS. 19A and 19B are diagrams illustrating a circuit configuration of a 4b-ADC cell 400 having an amplification factor of 4 in a folded cascode operational amplifier according to an embodiment.
Figure 19B:
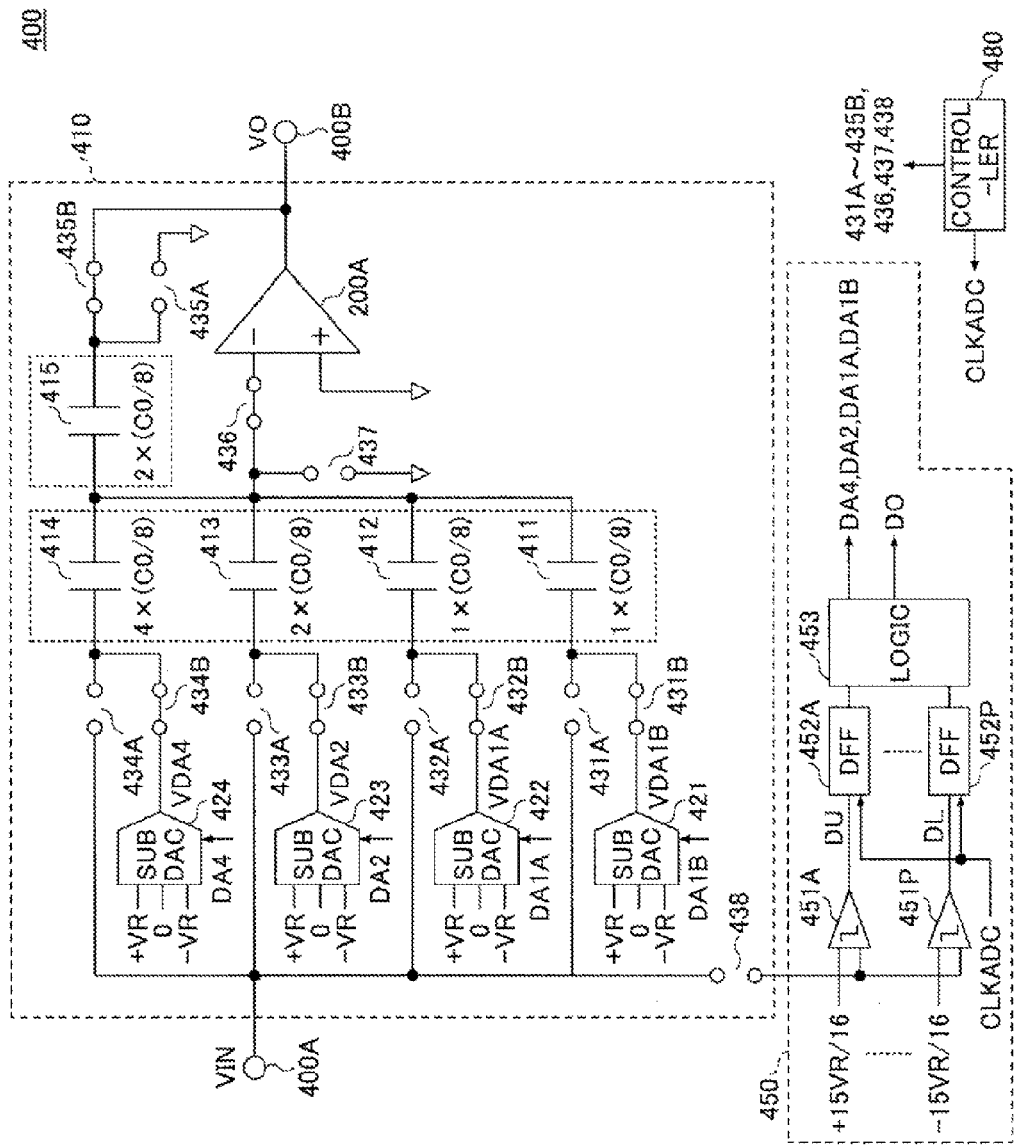

FIGS. 19A and 19B are diagrams illustrating a circuit configuration of a 4b-ADC cell 400 according to an embodiment. More specifically, FIG. 19A illustrates a connection status of the ADC cell 400 in a sampling operation, and FIG. 19B illustrates a connection status of the ADC cell 400 in an analog arithmetic operation. The ADC cell 400 according to the embodiment is a 4b (4 bit)-ADC cell.

The ADC cell 400 includes a multiplying digital to analog converter (MDAC) 410, a sub-ADC 450, and a controller 480. A signal amplification factor m of the ADC cell 400 is 4 (m=4).

The MDAC 410 is a 4b-MDAC that includes capacitors 411, 412, 413, 414, and 415, an operational amplifier 200A, digital to analog converters (DAC) 421, 422, 423, and 424, and switches 431A, 431B, 432A, 432B, 433A, 433B, 434A, 434B, 435A, 436B, 437, and 438.

First ends (terminals on the left side of FIGS. 19A and 19B) of the capacitors 411, 412, 413, and 414 are connected to an input terminal 400A of the ADC cell 400 via the switches 431A, 432A, 433A, and 434A. Second ends (terminals on the right side of FIGS. 19A and 19B) of the capacitors 411, 412, 413, and 414 are connected to one another, which are then connected to a first end (a terminal on the left side of FIGS. 19A and 19B) of the capacitor 415, and to the switches 436 and 437.

The first end (a terminal on the left side of FIGS. 19A and 19B) of the capacitor 415 is connected to the second ends (terminals on the right side of FIGS. 19A and 19B) of the capacitors 411, 412, 413, and 414, and a second end (a terminal on the right side of FIGS. 19A and 19B) of the capacitor 415 is connected to the switches 435A and 435B. The second end (a terminal on the right side of FIGS. 19A and 19B) of the capacitor 415 is connected to an output terminal of the operational amplifier 200A via the switch 435B. A second end of a switch 435A is grounded.

Note that capacitances of the capacitors 411 and 412 are C0/8, capacitances of the capacitor 415 and 413 are C0/4 (=2×C0/8), and a capacitance of the capacitor 414 is C0/2 (=4×C0/8). Note that C0 represents a predetermined standard capacitance.

The operational amplifier 200A includes an inverting input terminal that is connected to a connection point of the first end (a terminal on the left side of FIGS. 19A and 19B) of the capacitor 415 and second ends (terminals on the right side of FIGS. 19A and 19B) of the capacitors 411, 412, 413 and 414 via the switch 436. Further, the operational amplifier 200A includes a non-inverting input terminal that is grounded, and an output terminal that is connected to an output terminal 400B of the ADC cell 400 as well as being connected to second end (a terminal on the right side of FIGS. 19A and 19B) of the capacitor 415 via the switch 435B. The operational amplifier 200A is configured to have input a voltage at a connection point of the capacitors 411, 412, 413, 414, and 415 to its inverting input terminal, and output the analog output signal VO to the output terminal 400B.

Digital to analog converters (DAC) 421 and 422 are configured to output analog signals represented by m×DA1A×VR/8 and m×DA1B×VR/8 based on the add-subtract counts DA1A and DA1B output from the sub-ADC 450. The DAC 421 is connected to the first end (a terminal on the left side of FIGS. 19A and 19B) of the capacitor 412 via the switch 431B, and the DAC 422 is connected to the first end (a terminal on the left side of FIGS. 19A and 19B) of the capacitor 412 via the switch 432B.

A digital to analog converter (DAC) 423 is configured to output an analog signal represented by m×DA2×VR/4 based on an add-subtract count DA2 output from the sub-ADC 450. The DAC 423 is connected to the first end (a terminal on the left side of FIGS. 19A and 19B) of the capacitor 413 via the switch 433B.

A digital to analog converter (DAC) 424 is configured to output an analog signal represented by m×DA4×VR/2 based on an add-subtract count DA4 output from the sub-ADC 450. The DAC 424 is connected to the first end (a terminal on the left side of FIGS. 19A and 19B) of the capacitor 414 via the switch 434B.

The switches 431A, 431B, 432A, 432B, 433A, 433B, 434A, 434B, 435A, 435B, 436, 437, and 438 are connected as illustrated in FIG. 19A, which are switched ON (close) or OFF (open) by the controller 480.

The sub-ADC 450 is formed of a 4b (4 bits) sub-ADC circuit that includes 16 comparators 451A to 451P, data flip flops (DFFs) 452A to 452P, and a logic circuit 453. The DFFs 452A to 452P are respectively connected between output terminals of the comparators 451A to 451P and input terminals of the logic circuit 453. Hence, the DFFs 452A to 452P output, when a clock CLKADC is at a high (H) level, output signals of the comparators 452A to 452P to the logic circuit 453. Note that 14 comparators 451B to 451O, and 14 DFFs 452B to 452O are omitted from FIGS. 19A and 19B for facilitating viewability of the circuit configurations.

The sub-ADC 450 is configured to compare an analog input signal VIN based on comparison voltages (+15VR/16, +13VR/16, +11VR/16, +9VR/16, +7VR/8, +5VR/8, +3VR/8, +VR/8, −VR/8, −3VR/8, −5VR/8, −7VR/8, −9VR/16, −11VR/16, −13VR/16, and −15VR/16). The sub ADC 50A is configured to compare an analog input signal VIN based on a comparison voltage (+VR/4) and a comparison voltage (−VR/4), and output a 17-valued digital code DO and the add-subtract count DA1A, DA1B, and DA2 according to a level of the analog input signal VIN.

The comparator 451A switches an output signal to a high level (H) when the analog input signal VIN is higher than the comparison voltage (+15VR/16), whereas the comparator 451A switches an output signal to a low level (L) when the analog input signal VIN is lower than the comparison voltage (+15VR/16).

The comparator 451B switches an output signal to a high level (H) when the analog input signal VIN is higher than the comparison voltage (+13VR/16), whereas the comparator 451B switches an output signal to a low level (L) when the analog input signal VIN is lower than the comparison voltage (+13VR/16).

The comparator 451C switches an output signal to a high level (H) when the analog input signal VIN is higher than the comparison voltage (+11VR/16), whereas the comparator 451C switches an output signal to a low level (L) when the analog input signal VIN is lower than the comparison voltage (+11VR/16).

The comparator 451D switches an output signal to a high level (H) when the analog input signal VIN is higher than the comparison voltage (+9VR/16), whereas the comparator 451D switches an output signal to a low level (L) when the analog input signal VIN is lower than the comparison voltage (+9VR/16).

The comparator 451E switches an output signal to a high level (H) when the analog input signal VIN is higher than the comparison voltage (+7VR/16), whereas the comparator 451E switches an output signal to a low level (L) when the analog input signal VIN is lower than the comparison voltage (+7VR/16).

The comparator 451F switches an output signal to a high level (H) when the analog input signal VIN is higher than the comparison voltage (+5VR/16), whereas the comparator 451F switches an output signal to a low level (L) when the analog input signal VIN is lower than the comparison voltage (+5VR/16).

The comparator 451G switches an output signal to a high level (H) when the analog input signal VIN is higher than the comparison voltage (+3VR/16), whereas the comparator 551G switches an output signal to a low level (L) when the analog input signal VIN is lower than the comparison voltage (+3VR/16).

The comparator 451H switches an output signal to a high level (H) when the analog input signal VIN is higher than the comparison voltage (+VR/16), whereas the comparator 451H switches an output signal to a low level (L) when the analog input signal VIN is lower than the comparison voltage (+VR/16).

The comparator 451I switches an output signal to a high level (H) when the analog input signal VIN is higher than the comparison voltage (−VR/16), whereas the comparator 451I switches an output signal to a low level (L) when the analog input signal VIN is lower than the comparison voltage (−VR/16).

The comparator 451J switches an output signal to a high level (H) when the analog input signal VIN is higher than the comparison voltage (−3VR/16), whereas the comparator 451J switches an output signal to a low level (L) when the analog input signal VIN is lower than the comparison voltage (−3VR/16).

The comparator 451K switches an output signal to a high level (H) when the analog input signal VIN is higher than the comparison voltage (−5VR/16), whereas the comparator 451K switches an output signal to a low level (L) when the analog input signal VIN is lower than the comparison voltage (−5VR/16).

The comparator 451L switches an output signal to a high level (H) when the analog input signal VIN is higher than the comparison voltage (−7VR/16), whereas the comparator 451L switches an output signal to a low level (L) when the analog input signal VIN is lower than the comparison voltage (−7VR/16).

The comparator 451M switches an output signal to a high level (H) when the analog input signal VIN is higher than the comparison voltage (−9VR/16), whereas the comparator 451M switches an output signal to a low level (L) when the analog input signal VIN is lower than the comparison voltage (−9VR/16).

The comparator 451N switches an output signal to a high level (H) when the analog input signal VIN is higher than the comparison voltage (−11VR/16), whereas the comparator 451N switches an output signal to a low level (L) when the analog input signal VIN is lower than the comparison voltage (−11VR/16).

The comparator 451O switches an output signal to a high level (H) when the analog input signal VIN is higher than the comparison voltage (−13VR/16), whereas the comparator 451O switches an output signal to a low level (L) when the analog input signal VIN is lower than the comparison voltage (−13VR/16).

The comparator 451P switches an output signal to a high level (H) when the analog input signal VIN is higher than the comparison voltage (−15VR/16), whereas the comparator 451P switches an output signal to a low level (L) when the analog input signal VIN is lower than the comparison voltage (−15VR/16).

The logic circuit 453 is configured to output the digital codes DO and the add-subtract counts DA1A, DA1B, DA2, and DA4 based on the output signals of the comparators 451A to 451P. Note that a four-bit add-subtract count DA represented by $4 \times DA4 + 2 \times DA2 + DA1A + \frac{1}{2} \times DA1B$ is applied in this embodiment. The DA4 of the add-subtract count DA corresponds to the fourth bit of the digital code DO, the DA2 of the add-subtract count DA corresponds to the third bit r of the digital code DO, the DA1A of the add-subtract count DA corresponds to the second bit of the digital code DO, and the DA1B of the add-subtract count DA corresponds to the first bit of the digital code DO.

The logic circuit 453 is configured to output "+100.0" as the digital code DO, output "+1" as the add-subtract count DA4, output "0" as the add-subtract count DA2, "0" as the add-subtract count DA1A, and output "0" as the add-subtract count DA1B when the output signals of the comparators 451A to 451P are all at a low level (L).

The logic circuit 453 is configured to output "+011.1" as the digital code DO, output "0" as the add-subtract count DA4, output "+1" as the add-subtract count DA2, output "+1" as the add-subtract count DA1A, and output "+1" as the add-subtract count DA1B when the output signal of the comparator 451A is at a low level (L), and the output signals of the comparators 451B to 451P are all at a high level (H).

The logic circuit 453 is configured to output "+011.0" as the digital code DO, output "0" as the add-subtract count DA4, output "+1" as the add-subtract count DA2, output "+1" as the add-subtract count DA1A, and output "0" as the add-subtract count DA1B when the output signals of the comparators 451A and 451B are at a low level (L), and the output signals of the comparators 451C to 451P are all at a high level (H).

The logic circuit 453 is configured to output "+010.1" as the digital code DO, output "0" as the add-subtract count DA4, output "+1" as the add-subtract count DA2, output "0" as the add-subtract count DA1A, and output "+1" as the add-subtract count DA1B when the output signals of the comparators 451A to 451C are at a low level (L), and the output signals of the comparators 451D to 451P are all at a high level (H).

The logic circuit 453 is configured to output "+010.0" as the digital code DO, output "0" as the add-subtract count DA4, output "+1" as the add-subtract count DA2, output "0" as the add-subtract count DA1A, and output "0" as the add-subtract count DA1B when the output signals of the comparators 451A to 451D are at a low level (L), and the output signals of the comparators 451E to 451P are all at a high level (H).

The logic circuit 453 is configured to output "+001.1" as the digital code DO, output "0" as the add-subtract count DA4, output "0" as the add-subtract count DA2, output "+1" as the add-subtract count DA1A, and output "+1" as the add-subtract count DA1B when the output signals of the comparators 451A to 451E are at a low level (L), and the output signals of the comparators 451F to 451P are all at a high level (H).

The logic circuit 453 is configured to output "+001.0" as the digital code DO, output "0" as the add-subtract count DA4, output "0" as the add-subtract count DA2, output "+1" as the add-subtract count DA1A, and output "0" as the add-subtract count DA1B when the output signals of the comparators 451A to 451F are at a low level (L), and the output signals of the comparators 451G to 451P are all at a high level (H).

The logic circuit 453 is configured to output "+000.1" as the digital code DO, output "0" as the add-subtract count DA4, output "0" as the add-subtract count DA2, output "0" as the add-subtract count DA1A, and output "+1" as the add-subtract count DA1B when the output signals of the comparators 451A to 451G are at a low level (L), and the output signals of the comparators 451H to 451P are all at a high level (H).

The logic circuit 453 is configured to output "+000.0" as the digital code DO, output "0" as the add-subtract count DA4, output "0" as the add-subtract count DA2, output "0" as the add-subtract count DA1A, and output "0" as the add-subtract count DA1B when the output signals of the comparators 451A to 451H are at a low level (L), and the output signals of the comparators 451I to 451P are all at a high level (H).

The logic circuit 453 is configured to output "-000.1" as the digital code DO, output "0" as the add-subtract count DA4, output "0" as the add-subtract count DA2, output "0" as the add-subtract count DA1A, and output "-1" as the add-subtract count DA1B when the output signals of the comparators 451A to 451I are at a low leve.

(L), and the output signals of the comparators 451J to 451P are all at a high level (H).

The logic circuit 453 is configured to output "-001.0" as the digital code DO, output "0" as the add-subtract count DA4, output "0" as the add-subtract count DA2, output "-1" as the add-subtract count DA1A, and output "0" as the add-subtract count DA1B when the output signals of the comparators 451A to 451J are at a low level (L), and the output signals of the comparators 451K to 451P are all at a high level (H).

The logic circuit 453 is configured to output "-001.1" as the digital code DO, output "0" as the add-subtract count DA4, output "0" as the add-subtract count DA2, output "-1" as the add-subtract count DA1A, and output "-1" as the add-subtract count DA1B when the output signals of the comparators 451A to 451K are at a low level (L), and the output signals of the comparators 451L to 451P are all at a high level (H).

The logic circuit 453 is configured to output "-010.0" as the digital code DO, output "0" as the add-subtract count DA4, output "-1" as the add-subtract count DA2, output "0" as the add-subtract count DA1A, and output "0" as the add-subtract count DA1B when the output signals of the comparators 451A to 451L are at a low level (L), and the output signals of the comparators 451M to 451P are all at a high level (H).

The logic circuit 453 is configured to output "-010.1" as the digital code DO, output "0" as the add-subtract count DA4, output "-1" as the add-subtract count DA2, output "0" as the add-subtract count DA1A, and output "-1" as the add-subtract count DA1B when the output signals of the comparators 451A to 451M are at a low level (L), and the output signals of the comparators 451N to 451P are all at a high level (H).

The logic circuit 453 is configured to output "-011.0" as the digital code DO, output "0" as the add-subtract count DA4, output "-1" as the add-subtract count DA2, output "-1" as the add-subtract count DA1A, and output "0" as the add-subtract count DA1B when the output signals of the comparators 451A to 451N are all at a low level (L), and the output signals of the comparators 451O and 451P are at a high level (H).

The logic circuit 453 is configured to output "-011.1" as the digital code DO, output "0" as the add-subtract count DA4, output "-1" as the add-subtract count DA2, output "-1" as the add-subtract count DA1A, and output "-1" as the add-subtract count DA1B when the output signals of the comparators 451A to 451O are all at a low level (L), and the output signal of the comparator 451P is at a high level (H).

The logic circuit 453 is configured to output "-100.0" as the digital code DO, output "-1" as the add-subtract count DA4, output "0" as the add-subtract count DA2, output "0" as the add-subtract count DA1A, and output "0" as the add-subtract count DA1B when the output signals of the comparators 451A to 451P are all at a low level (L).

The digital code DO is expressed by a 17-value representation composed of "+100.0", "+011.1", "+011.0", "+010.1", "+010.0", "+001.1", "+001.0", "+000.1", "000.0", "-000.1", "-001.0", "-001.1", "-010.0", "-010.1", "-011.0", "-011.1" and "-100.0", and each of the add-subtract counts Da3, DA2, DA1A, and DA1B is expressed by a three-value representation composed of "+1", "0" and "-1".

The DAC 421 is configured to receive a reference voltage (-VR, 0, +VR) and the add-subtract count DA1B, and output an analog signal VDA1B represented by m×DA1B×(VR/8). When the amplification factor m is 4, and the add-subtract count DA1B is one of +1, 0, and -1, the analog signal VD1B becomes a corresponding one of +VR/2, 0, and -VR/2. The add-subtract count DA1B is supplied from the logic circuit 453 to the DAC 421.

The DAC 422 is configured to receive a reference voltage (-VR, 0, +VR) and the add-subtract count DA1A, and output an analog signal VDA1A represented by m×DA1A×(VR/8). When the amplification factor m is 4, and the add-subtract count DA1A is one of +1, 0, and -1, the analog signal VD1A becomes a corresponding one of +VR/2, 0, and -VR/2. The add-subtract count DA1A is supplied from the logic circuit 453 to the DAC 422.

The DAC 423 is configured to receive a reference voltage (-VR, 0, +VR) and the add-subtract count DA2, and output an analog signal VDA2 represented by m×DA2×(VR/8).

When the amplification factor m is 4, and the add-subtract count DA2 is one of +1, 0, and -1, the analog signal VDA2 becomes a corresponding one of +VR/2, 0, and -VR/2. The add-subtract count DA2 is supplied from the logic circuit 453 to the DAC 423.

The DAC 424 is configured to receive a reference voltage (-VR, 0, +VR) and the add-subtract count DA4, and output an analog signal VDA4 represented by m×DA4×(VR/8). When the amplification factor m is 4, and the add-subtract count DA4 is one of +1, 0, and -1, the analog signal VDA4 becomes a corresponding one of +VR/2, 0, and -VR/2. The add-subtract count DA4 is supplied from the logic circuit 453 to the DAC 424.

Next, operations of the MDAC 410 are described. Initially, the switches 431A, 432A, 433A, 434A, 435A, 437, and 438 are switched ON (close) while the switches 431B, 432B, 433B, 434B, 435B, and 436 are switched OFF (open) in a sampling operation illustrated in FIG. 19A. As a result, an input terminal 400A is connected to first ends (terminals on the left side of FIG. 19A) of the capacitors 411, 412, 413, and 414.

Further, a reference potential is set as a voltage at the at a connection point of the capacitors 411, 412, 413, 414, and 415. Thus, the capacitor 415 is reset by discharging electric charges.

Accordingly, the first ends (terminals on the left side in FIG. 19A) of the capacitors 411, 412, 413 and 414 are charged with the analog input signal VIN supplied to the input terminal 400A.

Subsequently, the switches 431A, 432A, 433A, 434A, 435A, 437, and 438 are switched OFF (open) while the switches 431B, 432B, 433B, 434B, 435B, and 436 are switched ON (close) in an analog arithmetic operation illustrated in FIG. 19B.

As a result, the output terminal of the operational amplifier 200A is connected to the connection point of the capacitors 411, 412, 413, 414, and 415. Further, the first end (a terminal on the left side of FIG. 19B) of the capacitor 414 is connected to the output terminal of the DAC 424 via the switch 434B, and the first end (a terminal on the left side of FIG. 19B) of the capacitor 413 is connected to the output terminal of the DAC 423 via the switch 433B. Further, the first end (a terminal on the left side of FIG. 19B) of the capacitor 411 is connected to the output terminal of the DAC 421 via the switch 431B, and second end (a terminal on the right side of FIG. 19B) of the capacitor 415 is connected to the output terminal of the operational amplifier 200A via the switch 435B.

The analog output signal VO of the operational amplifier 200A is represented by the following formula.

$$VO = 4 \times VIN - DA \times VR$$

The signal amplification factor m of the ADC cell 400 illustrated in FIGS. 19A and 19B is 4 (m=4). The signal amplification factor is determined by a ratio of a synthetic capacitance (C0/2+C0/4+C0/8+C0/8≤C0) of the capacitors 411, 412, 413, and 414 and a capacitance (C0/4) of the capacitor 415.

The signal amplification factor is determined by the above ratio because the first end (a terminal on the left side of FIGS. 19A and 19B) of the capacitor 415 acquires the amount of charges having an opposite sign that equates to a total amount of charges generated in the second ends (terminals on the right side of FIGS. 19A and 19B) of the capacitors 411, 412, 413, and 414 while performing a sampling operation.

As described above, the ADC cell 400 is configured to perform an analog to digital conversion corresponding to a signal level of the analog input signal VIN supplied within a reference voltage range of +VR and −VR.

The MDAC 410 outputs an analog output signal VO (VO=4×VIN−DA×VR) by adding the DA×VR to or subtracting the DA×VR from a result of a quadrupled analog input signal VIN (=4×VIN). Note that the add-subtract count DA is any one of +4, +3, +2, +1, 0, −1, −2 −3, and −4.

Figure 20B:
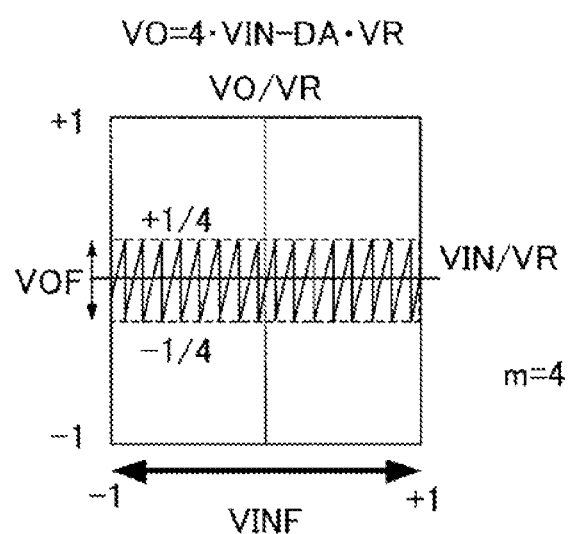
FIG. 20B is a diagram illustrating input-output properties of the ADC cell 400.

FIG. 20A is a diagram illustrating an operation of the ADC cell 400 in a table form, and FIG. 20B is a diagram illustrating input-output properties of the ADC cell 400. In FIG. 20B, a horizontal axis indicates an analog input signal represented by VIN/VR, and a vertical axis indicates an analog output signal represented by VO/VR.

FIG. 20A illustrates an analog input signal VIN(Vcmp), a digital code DO, an add-subtract count DA, analog signals VDA4, VDA2, VDA1A, and VDA1B, and an analog output signal VO. Note that the analog input signal VIN supplied to the comparators 451A to 451P is expressed as an "analog input signal VIN(Vcmp)".

The digital code DO is "+100.0", and the add-subtract count DA is "+4" when the analog input signal VIN(Vcmp) is +15;16≤VIN/VR≤+1. Further, the analog signal VDA4 is "+VR", the analog signal VDA2 is "0", the analog signal VDA1A is "0", the analog signal VDA1B is "0", and the analog output signal VO is VO=4×VIN−4×VR.

The digital code DO is "+011.1", and the add-subtract count DA is "+3.5" when the analog input signal VIN(Vcmp) is +$^{13}/_{16}$≤VIN/VR<+$^{15}/_{16}$. Further, the analog signal VDA4 is "0", the analog signal VDA2 is "+VR", the analog signal VDA1A is "+VR", the analog signal VDA1B is "+VR", and the analog output signal VO is VO=4×VIN−3.5×VR.

The digital code DO is "+011.0", and the add-subtract count DA is "+3" when the analog input signal VIN(Vcmp) is +$^{11}/_{15}$≤VIN/VR<+$^{13}/_{16}$. Further, the analog signal VDA4 is "0", the analog signal VDA2 is "+VR", the analog signal VDA1A is "+VR", the analog signal VDA1B is "0", and the analog output signal VO is VO=4×VIN−3×VR.

The digital code DO is "+010.1", and the add-subtract count DA is "+2.5" when the analog input signal VIN(Vcmp) is +$^{9}/_{16}$≤VIN/VR<+$^{11}/_{16}$. Further, the analog signal VDA4 is "0", the analog signal VDA2 is "+VR", the analog signal VDA1A is "0", the analog signal VDA1B is "+VR", and the analog output signal VO is VO=4×VIN−2.5×VR.

The digital code DO is "+010.0", and the add-subtract count DA is "+2" when the analog input signal VIN(Vcmp) is +$^{7}/_{16}$≤VIN/VR<+$^{9}/_{16}$. Further, the analog signal VDA4 is "0", the analog signal VDA2 is "+VR", the analog signal VDA1A is "0", the analog signal VDA1B is "0", and the analog output signal VO is VO=4×VIN−2×VR.

The digital code DO is "+001.1", and the add-subtract count DA is "+1.5" when the analog input signal VIN(Vcmp) is +$^{5}/_{16}$≤VIN/VR<+$^{7}/_{16}$. Further, the analog signal VDA4 is "0", the analog signal VDA2 is "0", the analog signal VDA1A is "+VR", the analog signal VDA1B is "+VR", and the analog output signal VO is VO=4×VIN−1.5×VR.

The digital code DO is "+001.0", and the add-subtract count DA is "+1" when the analog input signal VIN(Vcmp) is +$^{3}/_{16}$≤VIN/VR<+$^{5}/_{16}$. Further, the analog signal VDA4 is "0", the analog signal VDA2 is "0", the analog signal VDA1A is "+VR", the analog signal VDA1B is "0", and the analog output signal VO is VO=4×VIN−VR.

The digital code DO is "+000.1", and the add-subtract count DA is "+0.5" when the analog input signal VIN(Vcmp) is +$^{1}/_{16}$≤VIN/VR<+$^{3}/_{16}$. Further, the analog signal VDA4 is "0", the analog signal VDA2 is "0", the analog signal VDA1A is "0", the analog signal VDA1B is "+VR", and the analog output signal VO is VO=4×VIN−0.5×VR.

The digital code DO is "+000.0", and the add-subtract count DA is "0" when the analog input signal VIN(Vcmp) is −$^{1}/_{16}$≤VIN/VR<+$^{1}/_{16}$. Further, the analog signal VDA4 is "0", the analog signal VDA2 is "0", the analog signal VDA1A is "0", the analog signal VDA1B is "0", and the analog output signal VO is VO=4×VIN.

The digital code DO is "−000.1", and the add-subtract count DA is "−0.5" when the analog input signal VIN(Vcmp) is −$^{3}/_{16}$≤VIN/VR<−$^{1}/_{16}$. Further, the analog signal VDA4 is "0", the analog signal VDA2 is "0", the analog signal VDA1A is "0", the analog signal VDA1B is "−VR", and the analog output signal VO is VO=4×VIN+0.5×VR.

The digital code DO is "−001.0", and the add-subtract count DA is "−1" when the analog input signal VIN(Vcmp) is −$^{5}/_{16}$≤VIN/VR<−$^{3}/_{16}$. Further, the analog signal VDA4 is "0", the analog signal VDA2 is "0", the analog signal VDA1A is "−VR", the analog signal VDA1B is "0", and the analog output signal VO is VO=4×VIN+VR.

The digital code DO is "−001.1", and the add-subtract count DA is "−1.5" when the analog input signal VIN(Vcmp) is −$^{7}/_{16}$≤VIN/VR<−$^{5}/_{16}$. Further, the analog signal VDA4 is "0", the analog signal VDA2 is "0", the analog signal VDA1A is "−VR", the analog signal VDA1B is "−VR", and the analog output signal VO is VO=4×VIN+1.5×VR.

The digital code DO is "−010.0", and the add-subtract count DA is "−2" when the analog input signal VIN(Vcmp) is −9/16≤VIN/VR≤−7/16. Further, the analog signal VDA4 is "0", the analog signal VDA2 is "−VR", the analog signal VDA1A is "0", the analog signal VDA1B is "0", and the analog output signal VO is VO=4×VIN+2×VR.

The digital code DO is "−010.1", and the add-subtract count DA is "−2.5" when the analog input signal VIN(Vcmp) is −11/16≤VIN/VR<−9/16. Further, the analog signal VDA4 is "0", the analog signal VDA2 is "−VR", the analog signal VDA1A is "0", the analog signal VDA1B is "−VR", and the analog output signal VO is VO=4×VIN+2.5×VR.

The digital code DO is "−011.0", and the add-subtract count DA is "−3" when the analog input signal VIN(Vcmp) is −13/16≤VIN/VR<−11/16. Further, the analog signal VDA4 is "0", the analog signal VDA2 is "−VR", the analog signal VDA1A is "−VR", the analog signal VDA1B is "0", and the analog output signal VO is VO=4×VIN+3×VR.

The digital code DO is "−011.1", and the add-subtract count DA is "−3.5" when the analog input signal VIN(Vcmp) is −15/16≤VIN/VR<−13/16. Further, the analog signal VDA4 is "0", the analog signal VDA2 is "−VR", the analog signal VDA1A is "−VR", the analog signal VDA1B is "−VR", and the analog output signal VO is VO=4×VIN+3.5×VR.

The digital code DO is "−100.0", and the add-subtract count DA is "−4" when the analog input signal VIN(Vcmp) is −1≤VIN/VR≤−15/16. Further, the analog signal VDA4 is "−VR", the analog signal VDA2 is "0", the analog signal VDA1A is "0", the analog signal VDA1B is "0", and the analog output signal VO is VO=4×VIN+4×VR.

Accordingly, the input-output properties of the ADC cell 400 are, as illustrated in FIG. 20B, VO=4×VIN−4×VR when +15/16≤VIN/VR≤+1; VO=4×VIN−3.5×VR when +13/16≤VIN/VR<15/16; and VO=4×VIN−3×VR when +11/15≤VIN/VR<+13/16.

Further, VO=4×VIN−2.5×VR when +9/16≤VIN/VR<+11/16; VO=4×VIN−2×VR when +7/16≤VIN/VR<+9/16; and VO=4×VIN−1.5×VR when +5/16≤VIN/VR<+7/16.

Further, VO=4×VIN−VR when +3/16≤VIN/VR<+5/16; VO=4×VIN−0.5×VR when +1/16≤VIN/VR<+3/16; and VO=4×VIN when −1/16≤VIN/VR<+1/16.

Further, VO=4×VIN+0.5×VR when −3/16≤VIN/VR<−1/16; VO=4×VIN+VR when −5/16≤VIN/VR<−3/16; and VO=4×VIN+1.5×VR when −7/16≤VIN/VR<−5/16.

Further, VO=4×VIN+2×VR when −9/16≤VIN/VR<−7/16; VO=4×VIN+2.5×VR when −11/16≤VIN/VR<−9/16; and VO=4×VIN+3×VR when −13/16≤VIN/VR<−11/16.

Further, VO=4×VIN+3.5×VR when −15/16≤VIN/VR<−13/16; and VO=4×VIN+4×VR when −1 VIN/VR−15/16.

Figure 21A:
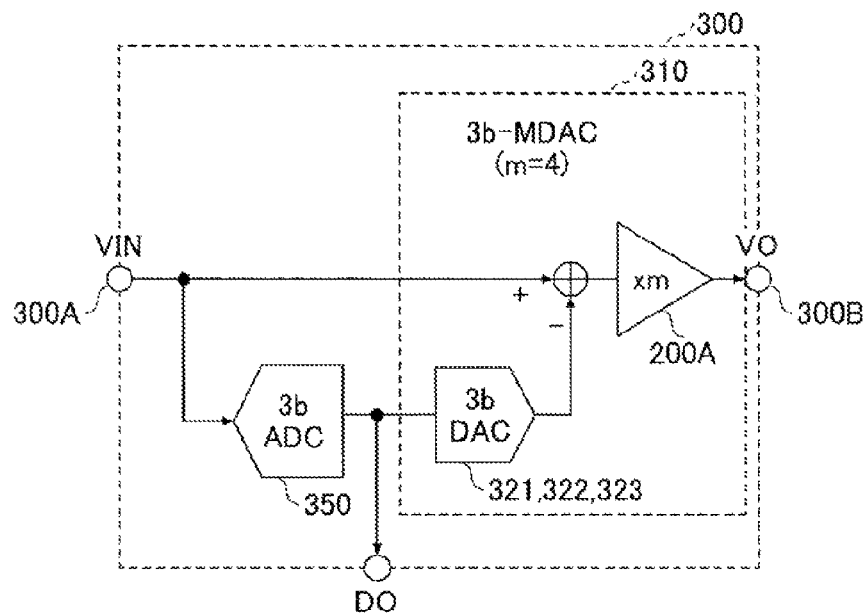
FIGS. 21A and 21B are diagrams illustrating the 3b-ADC cell 300 having an amplification factor of 4 and the 4b-ADC cell 400 having an amplification factor of 4 in the folded cascode operational amplifier according to the embodiment.
Figure 21B:
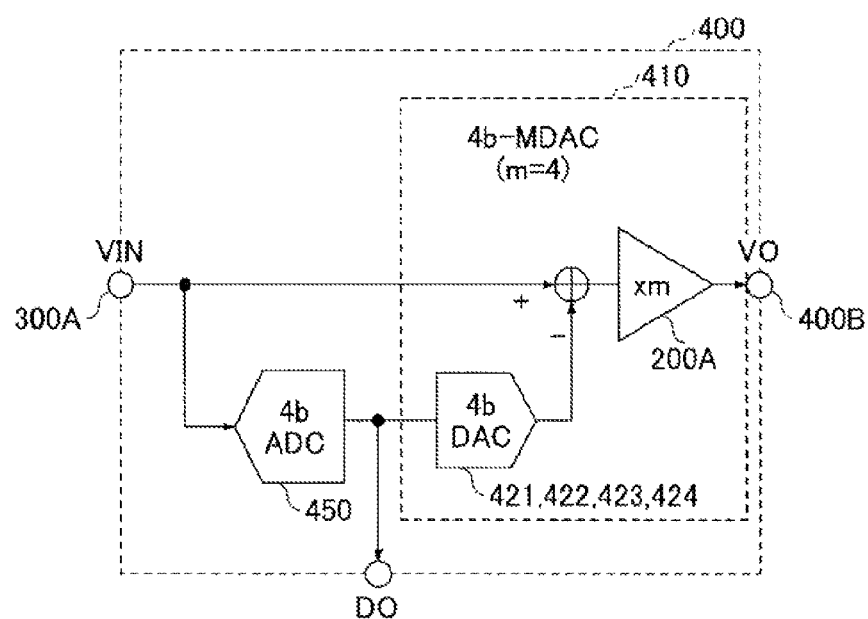

FIGS. 21A and 21B are diagrams illustrating the 3b-ADC cell 300 (see FIG. 17A) of the folded cascode operational amplifier according to the embodiment, and the 4b-ADC cell 400 (see FIG. 19 A) of the folded cascode operational amplifier according to the embodiment. In FIGS. 21A and 21B, the ADC cell 300 and the ADC cell 400 are simplified as respective block diagrams.

The signal amplification factor m of the ADC cell 300 illustrated in FIG. 21A is 4 (m=4). The ADC cell 300 includes a 3b-MDAC 310, DACs 321, 322, and 323, an operational amplifier 200A, and an ADC 350. A current ratio Ka of the operational amplifier 200A is Ka=½.

The signal amplification factor m of the ADC cell 400 illustrated in FIG. 21B is 4 (m=4). The ADC cell 400 includes a 4b-MDAC 410, DACs 421, 422, 423, and 424, an operational amplifier 200A, and an ADC 450. A current ratio Ka of the operational amplifier 200A illustrated in FIG. 21A is Ka=¼.

FIGS. 22A to 22D are diagrams illustrating input-output properties of the 3b-ADC cell 300 of the folded cascode operational amplifier according to the embodiment (see FIG. 17A), input-output properties of the 4b-ADC cell 400 of the folded cascode operational amplifier according to the embodiment (see FIG. 19A), and ΔVIA/2 Vod properties corresponding to an analog input signal VIN in the folded cascode operational amplifier according to the embodiment.

Figure 22A:
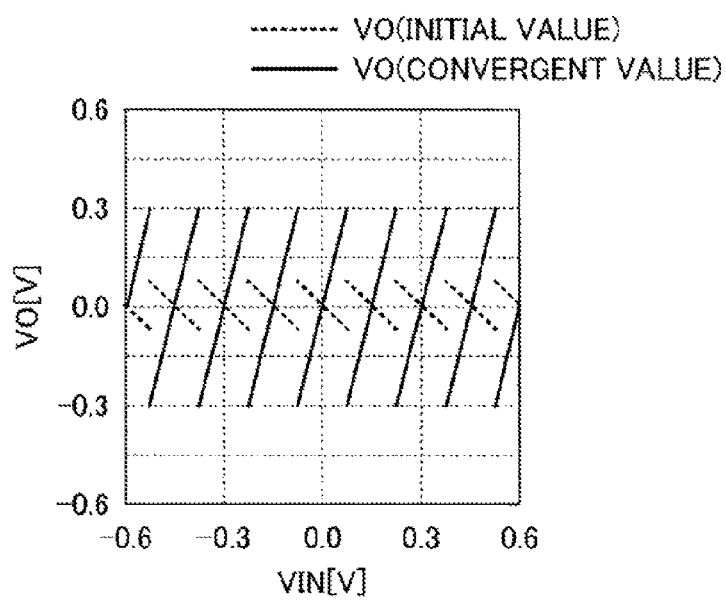
FIGS. 22A to 22D are diagrams illustrating input-output properties of the 3b-ADC cell 300 having a signal amplification factor of 4 and the 4b-ADC cell 400 having a signal amplification factor of 4, and ΔVIA/2 Vod properties corresponding to an analog input signal VIN in the folded cascode operational amplifier according to the embodiment.
Figure 22B:
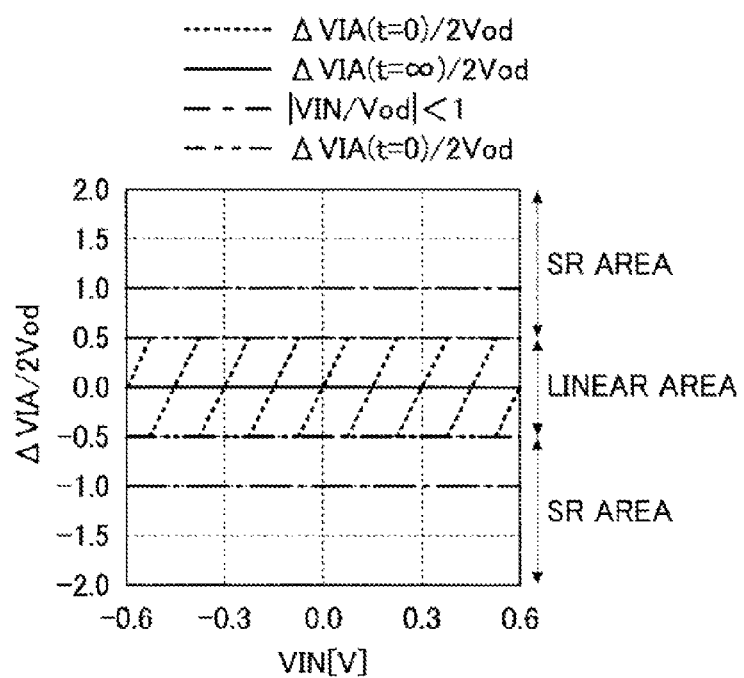
Figure 22C:
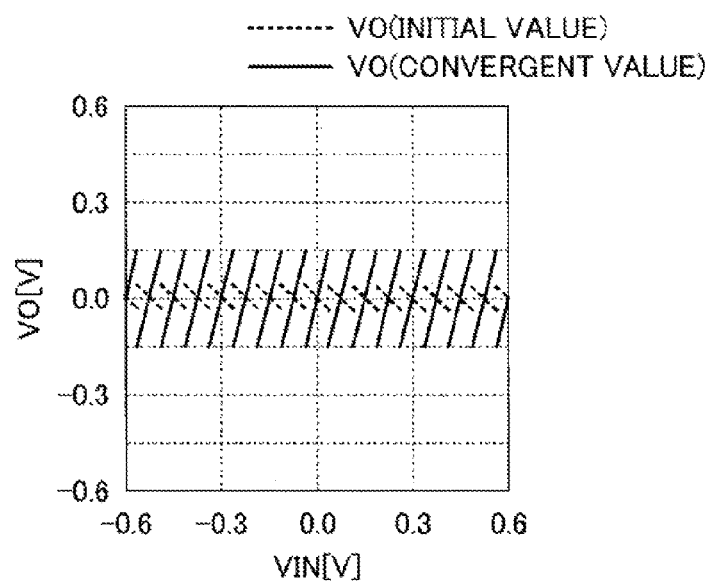

FIG. 22A is a diagram illustrating input-output properties of the 3b-MDAC 310 according to the embodiment, and FIG. 22B is a diagram illustrating ΔVIA/2 Vod properties corresponding to the analog input signal VIN of the 3b-MDAC 310 according to the embodiment. FIG. 22C is a diagram illustrating input-output properties of the 4b-MDAC 410 according to the embodiment, and FIG. 22D is a diagram illustrating ΔVIA/2 Vod properties corresponding to the analog input signal VIN of the 4b-MDAC 410 according to the embodiment.

Further, the properties illustrated in FIGS. 22A and 22B are obtained under the following preconditions: the analog input signal VIN (peak-to-peak) is 1.2 V; a current ratio Ka (=Iout/Idiff) of an output current Iout to a differential current Idiff in the folded cascode operational amplifier 200A is ½; and an overdrive voltage Vod of all the transistors contained in the folded cascode operational amplifier 200A is 0.15 V. The analog input signal VIN=1.2 V (peak-to-peak) is ±0.6 V, which is a condition in which the analog input signal VIN is four times the overdrive voltage Vod.

Figure 22D:
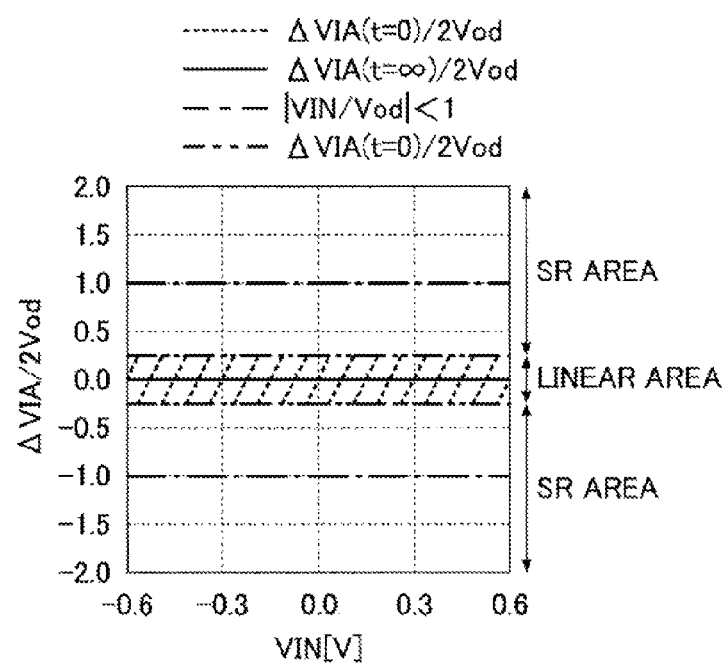

Further, the properties illustrated in FIGS. 22C and 22D are obtained under the following preconditions: the analog input signal VIN (peak-to-peak) is 1.2 V; a current ratio Ka (=Iout/Idiff) of an output current Iout to a differential current Idiff in the folded cascode operational amplifier 200A is ¼; and an overdrive voltage Vod of all the transistors contained in the folded cascode operational amplifier 200A is 0.15 V. The analog input signal VIN=1.2 V (peak-to-peak) is ±0.6 V, which is a condition in which the analog input signal VIN is four times the overdrive voltage Vod.

Further, settings of the 3b-MDAC 310 of the folded cascode operational amplifier 200A according to the embodiment are as follows: the signal amplification factor m=4; the ADC 350 is 3b; 2Nb/m=3; the feedback amount β=⅕; an input-output range (VOF/VINF)=½; and the maximum value of |ΔVIA/2 Vod| is ½. Note that Nb represents the number of bits of the ADC 450, and Nb indicates 3 in this embodiment.

Further, settings of the 4b-MDAC 410 of the folded cascode operational amplifier 200A according to the embodiment are as follows: the signal amplification factor m=4; the ADC 450 is 4b; 2Nb/m=4; the feedback amount β=⅕; an input-output range (VOF/VINF)=¼; and the maximum value of |ΔVIA/2 Vod| is ¼. Note that Nb represents the number of bits of the ADC 450, and Nb indicates 4 in this embodiment.

As illustrated in FIG. 22A, input-output properties of the 3b-MDAC 300 according to the embodiment are indicated by broken lines when the analog output signal VO is an initial value (t=0). Further, input-output properties of the 3b-MDAC 300 according to the embodiment are indicated by solid lines when the analog output signal VO is a convergence value (t=∞). Note that the initial value (t=0) indicates a value at a time where the capacitors 311, 312, 313, and 314 are connected to the operational amplifier 200A for conducting the analog arithmetic operation in the MDAC 300. Further, the convergence value (t=∞) indicates a value finally obtained after a sufficient time has elapsed from the time at which the capacitors 311, 312, 313, and 314 are connected to the operational amplifier 200A.

The properties illustrated in FIG. 22A indicate the properties VR times the values of the vertical and the horizontal axes of the properties illustrated in FIG. 18B.

Further, in FIG. 22B, Ka=½, and hence, |ΔVIA/2 Vod|≤½ indicates the linear area while ΔVIA/2 Vod<−½ and ½<ΔVIA/2 Vod indicate the SR areas.

As illustrated in FIG. 22B, properties of the ΔVIA/2 Vod corresponding to the analog input signal ΔVIN of the 3b-MDAC 310 are as follows. Although the ΔVIA (t=∞)/2 Vod is 0, the ΔVIA (t=0)/2 Vod is less than or equal to −0.5 in a range of −0.6≤VIN≤−6 as illustrated by broken lines in FIG. 22B.

Accordingly, the properties of the ΔVIA/2 Vod corresponding to the analog input signal ΔVIN fall within the linear area in an entire range of −0.6≤VIN≤−6.

As illustrated in FIG. 22C, input-output properties of the 4b-MDAC 410 according to the embodiment are indicated by broken lines when the analog output signal VO is an initial value (t=0). Further, input-output properties of the 4b-MDAC 410 according to the embodiment are indicated by solid lines when the analog output signal VO is a convergence value (t=∞). Note that the initial value (t=0) indicates a value at a time where the capacitors 411, 412, 413, 414, and 415 are connected to the operational amplifier 200A for conducting the analog arithmetic operation in the MDAC 410. Further, the convergence value (t=∞) indicates a value finally obtained after a sufficient time has elapsed from the time at which the capacitors 411, 412, 413, 414, and 415 are connected to the operational amplifier 200A.

The properties illustrated in FIG. 22C indicate the properties VR times the values of the vertical and the horizontal axes of the properties illustrated in FIG. 20B.

Further, in FIG. 22D, Ka=¼, and hence, |ΔVIA/2 Vod|≤¼ indicates the linear area while ΔVIA/2 Vod<−¼ and ¼<ΔVIA/4 Vod indicate the SR areas.

As illustrated in FIG. 22D, properties of the ΔVIA/2 Vod corresponding to the analog input signal ΔVIN of the 4b-MDAC 410 are as follows. Although the ΔVIA (t=∞)/2 Vod is 0, the ΔVIA (t=0)/2 Vod is less than or equal to −0.25 (−¼) in a range of −0.6≤VIN≤−6 as illustrated by broken lines in FIG. 22D.

Accordingly, the properties of the ΔVIA/2 Vod corresponding to the analog input signal ΔVIN fall within the linear area in an entire range of −0.6≤VIN≤−6.

As described above, according to the above embodiments, the arithmetic operation speed of the operational amplifier 200A (and 200C to 200D) may be improved by reducing the sizes of the PMOSFETS 231 and 232 of the output stage 230 to satisfy the conditions 1 and 2, which results in reduction of the parasitic capacitance of the output stage 230, while operational stability of the operational amplifier 200A (and 200C to 200D) may be secured by adjusting the operating area to fall within the linear area.

The conditions 1 and 2 are as follows.

a current ratio $Ka(=Iout/Idiff)<1$. (Condition 1)

$Max.(|\Delta VIA/2 Vod|) \leq Ka < 1$. (Condition 2)

The folded cascode operational amplifiers 200A to 200D according to the embodiments may be able to reduce the parasitic capacitance Cpo in inverse proportion to the signal amplification factor m while maintaining the conductance gm. Accordingly, the folded cascode operational amplifiers 200A to 200D may be suitable for use in an analog arithmetic circuit configured to convert an analog value into a digital value. The folded cascode operational amplifiers 200A to 200D according to the embodiments may specifically be suitable for an analog arithmetic circuit configured to carry out analog to digital conversion on a small input voltage.

Accordingly, the folded cascode operational amplifiers 200A to 200D according to the embodiments may be suitable for use in the MDAC 310 and 410. However, the use of the folded cascode operational amplifiers 200A to 200D according to the embodiments is not limited to the MDAC 310 and 410, and the folded cascode operational amplifiers 200A to 200D according to the embodiments may be utilized in any analog arithmetic circuit insofar as the analog arithmetic circuit converts an analog value into a digital value.

As described above, according to the above embodiments, there are provided operational amplifiers 200A to 200D in which stable operations may be secured by reducing the size of the output stage.

Finally, FIG. 23 illustrates effects of the operational amplifiers 200A to 200D according to embodiments, and effects of the MDACs 310 and 410 according to embodiments are compared with effects of the comparative example of the operational amplifier 74, and effects of the comparative examples of the MDACs 70A and 90A.

FIG. 23 is a diagram illustrating comparison results of the operational amplifiers 200A to 200D according to the embodiments and the MDACs 310 and 410 according to embodiments, and the comparative example of the operational amplifier 74 and the comparative examples of the MDACs 70A and 90A in a table form.

Note that FIG. 23 illustrated comparison results of the MDACs 310 and 410 according to the embodiments having multiplication of bits that are compared with the comparative example of the MDAC 90A. However, FIG. 23 may also include a comparison result with the comparative example of 1.5b-MDAC 70A. Further, the operational amplifier 200A is utilized in the MDACs 310 and 410 according to the embodiments, and the operational amplifier 74 is utilized in the comparative examples of the MDACs 70A and 90A.

The signal amplification factors m of the comparative examples of the MDAC 70A and the MDAC 90A are, as illustrated in FIG. 23, m=2, and m=4, respectively. By contrast, the signal amplification factors m of the MDAC 310 and the MDAC 410 according to the embodiments, are both m=4 as illustrated in FIG. 23.

Further, the feedback amounts β of the comparative examples of the MDAC 70A and the MDAC 90A are β=⅓, and β=⅕, respectively. By contrast, the feedback amounts β of the MDAC 310 and the MDAC 410 according to the embodiments are both β=⅕.

Thus, the MDACs 310 and 410 according to the embodiments having multiplication of bits include the same signal amplification factors m and feedback amounts β as the signal amplification factor m and the feedback amount β of the comparative example of the MDAC 90A. The embodiments and the comparative examples are compared based on the following conditions.

The numbers of bits of the comparative examples of the MDAC 70A and the MDAC 90A are, as illustrated in FIG. 23, 1.5b and 2.5b, respectively, and similarly, the numbers of bits of the comparative examples of the ADC 50A and the ADC 50B are 1.5b and 2.5b, respectively. When Nb is determined as 1.5, 2Nb/m=1.4, and when Nb is determined as 2.5, 2Nb/m=1.4.

By contrast, the number of bits of the MDAC 310 and the MDAC 410 according to the embodiments are 3b and 4b, respectively. When Nb is determined as 3, 2Nb/m=2, and when Nb is determined as 4, 2Nb/m=4.

Accordingly, the numbers of bits of the embodiments are increased compared to the numbers of bits of the comparative examples.

Further, the output ranges (VOFS/VIFS) of the comparative examples of the MDAC 70A and the MDAC 90A are both 1, whereas the output ranges (VOFS/VIFS) of the MDAC 310 and the MDAC 410 are ½ and ¼, respectively. Thus, the output ranges of the embodiments are limited. Note that VOFS indicates a full-scale (FS) value of the output voltage of the MDAC, and VIFS indicates a full-scale (FS) value of the input voltage of the MDAC.

The input range of the operational amplifier 74 contained in the comparative example of the MDAC 70A is less than or equal to an absolute value of 2, and the input range of the operational amplifier 74 contained in the comparative example of the MDAC 90A is less than or equal to an absolute value of 1.

By contrast, the input range of the operational amplifier 200A contained in the MDAC 310 according to the embodiment is less than or equal to an absolute value of ½, and the input range of the operational amplifier 200A contained in the MDAC 410 according to the embodiment is less than or equal to an absolute value of ¼.

Further, in the operational amplifier 74 utilized in the comparative example of the MDAC 90A, a current ratio Ka (Ka=Iout/Idiff) of the output current Iout to the differential current Idiff is Ka=1. In the comparative examples, the current ratio Ka is set as Ka≥1 for suppressing occurrence of a cutoff status in one of the pair of the transistors of the differential stage. Accordingly, Ka=1 is a minimum vale of the current ratio in the operational amplifier 74 of the comparative example.

By contrast, the current ratios Ka of the operational amplifiers 200A contained in the MDAC 310 and MDAC 410 according to the embodiments are Ka=½ and ¼, respectively. This illustrates that the sizes of the PMOSFETs of the output stage 230 of the operational amplifiers 200A contained in the MDAC 310 and MDAC 410 according to the embodiments are reduced by ½ and ¼, respectively, compared to the sizes of the PMOSFETs of the output stage of the operational amplifier 74 of the comparative example.

Note that in the operational amplifier 74 utilized in the comparative example of the MDAC 70A, a current ratio Ka (Ka=Iout/Idiff) of the output current Iout to the differential current Idiff is Ka=1.

Further, when the parasitic capacitance Cpo of the operational amplifier 74 utilized in the comparative example of the MDAC 90A is determined as 1, the parasitic capacitances Cpo of the operational amplifiers 200A contained in the MDAC 310 and the MDAC 410 according to the embodiments are ½ and ¼, respectively. Note that the parasitic capacitance Cpo is generated in proportion to the current ratio Ka.

This indicates that the MDAC 310 in the embodiment has accomplished 50% reduction of the parasitic capacitance compared to the comparative example of the MDAC 90A, and the MDAC 410 in the embodiment has accomplished 75% reduction of the parasitic capacitance compared to the comparative example of the MDAC 90A.

Note that the parasitic capacitance Cpo of the operational amplifier 74 utilized in the comparative example of the MDAC 70A is identical to the parasitic capacitance Cpo of the operational amplifier 74 utilized in the comparative example of the MDAC 90A.

Further, when retardation time due to the parasitic capacitance Cpo of the operational amplifier 74 utilized in the comparative example of the MDAC 90A is determined as 1, retardation times due to the parasitic capacitances Cpo of the operational amplifiers 200A contained in the MDAC 310 and the MDAC 410 according to the embodiments are ½ and ¼, respectively. The retardation time due to the parasitic capacitance Cpo is determined in proportion to the parasitic capacitance Cpo/the feedback amount β (Cpo/β).

This indicates that the retardation time due to the parasitic capacitance Cpo in the MDAC 310 in the embodiment is reduced by 50% compared to the retardation time due to the parasitic capacitance Cpo in the comparative example of the MDAC 90A, and the retardation time due to the parasitic capacitance Cpo in the MDAC 410 in the embodiment is reduced by 75% compared to the retardation time due to the parasitic capacitance Cpo in the comparative example of the MDAC 90A.

Note that the retardation time due to the parasitic capacitance Cpo of the operational amplifier 74 utilized in the comparative example of the MDAC 70A is ⅗ of the retardation time due to the parasitic capacitance Cpo of the operational amplifier 74 utilized in the comparative example of the MDAC 90A. Thus, the retardation time of the comparative example of the MDAC 70A has a value 40% less than the value of the retardation time of the comparative example of the MDAC 90A. Therefore, retardation times due to the parasitic capacitances Cpo of the operational amplifiers 200A utilized in the MDAC 310 and the MDAC 410 according to the embodiments are reduced compared to the retardation time due to the parasitic capacitance Cpo of the operational amplifiers 74A contained in the comparative example of the MDAC 70A.

Further, an output current Iamp of the operational amplifier and an area of the operational amplifier are determined in proportion to (1+Ka). Note that the output current Iamp and the area of the operational amplifier 74 utilized in the comparative example of the MDAC 90A are determined as 1.

The output current Iamp and the area of the operational amplifier 200A utilized in the MDAC 310 are ¾, and the output current Iamp and the area of the operational amplifier 200A utilized in the MDAC 410 are ⅝. The results indicate that the MDAC 310 and the MDAC 410 in the embodiments have accomplished 25% reduction and 37% reduction, respectively.

Note that the output current Iamp and the area of the operational amplifier 74 utilized in the comparative example of the MDAC 70A are identical to the output current Iamp and the area of the operational amplifier 74 utilized in the comparative example of the MDAC 90A.

As described above, according to the above embodiments, the retardation time due to the parasitic capacitance Cpo of the operational amplifier 200A may be improved by reducing the sizes of transistors of the output stage 230 and limiting the input-output range according to the conditions 1 and 2. Accordingly, the retardation times due to the parasitic capacitances Cpo of the operational amplifiers 200A utilized in the MDAC 310 and the MDAC 410 according to the embodiments are reduced by ½ and ¼, respectively, compared to the retardation time of the comparative example of the 2.5b-MDAC in which the multiplication of bits is applied. Further, an output current Iamp and an area (size) of the operational amplifiers 200A utilized in the MDAC 310 and the MDAC 410 according to the embodiments are reduced by ¾ and ⅝, respectively.

Thus, according to the above embodiments, the arithmetic operation speed of the operational amplifier 200A (and 200C to 200D) may be improved by reducing the sizes of the PMOSFETS 231 and 232 of the output stage 230 to satisfy the conditions 1 and 2, which results in reduction of the parasitic capacitance of the output stage 230, while operational stability of the operational amplifier 200A (and 200C to 200D) may be secured by adjusting the operating area to fall within the linear area.

The folded cascode operational amplifiers 200A to 200D according to the embodiments have a simpler circuit configuration, which do not require phase compensation capacitances. Accordingly, the folded cascode operational amplifiers 200A to 200D according to the embodiments are suitable for increasing their arithmetic operation speeds. Thus, it appears to be extremely useful to increase the arithmetic operation speeds in the folded cascode operational amplifiers 200A to 200D according to the embodiments by reducing the sizes of the output stages 230.

Further, a smaller area and low power consumption may need to be implemented by a low voltage operation for microfabrication of the high precision ADC cell. Thus, the ADC cells 300 and 400 including the operational amplifier 200A having a reduced-sized output stage 230 may be able to satisfy the above need for implementing the reduced area and the low power consumption.

Further, the output stage 230 of the operational amplifier 200A according to the embodiment is configured such that the conditions 1 and 2 are satisfied. With this configuration, the operation of the operational amplifier 200A in the slew rate area may be prevented, and the operation of the operational amplifier 200A in the linear area may be stabilized. Hence, the arithmetic operation speed may further be improved.

Further, in the high-rate conversion ADC, a pipeline ADC system is extremely effective. Accordingly, a pipeline ADC implementing the high-rate conversion may be provided by connecting the ADC cells 300 and 400 in a pipeline configuration.

In addition, with the rapid growth of digital AV systems and wireless communications, there is an increase in need of the AD converter (ADC) that may implement high rates (≥30 Mbps), high precision (≥10 bits), and low power consumption. In order to realize the reduction in size and reduction in cost, implementation of a "system on a chip" configuration having an analog circuit and a digital circuit installed on one chip by utilizing a technology of complementary metal oxide semiconductor (CMOS) microfabrication (≤130 nm) has been increasingly desired. The CMOS microfabrication may require reduction in voltage (≤1.2 V).

In the digital circuits, the benefit of the reduced voltage may be significant. However, in the analog circuits, the reduced voltage may result in reduction in the signal amplitude, which may have an adverse effect on the high preciscion, low power consumption, and the reduction in areas. As a result, an analog design technology capable of achieving a low voltage and high precision may play an increasingly important role. Such an analog design technology may also be important for the pipeline ADC.

Thus, the folded caseade operational amplifiers 200A to 200D according to the embodiments configured to exhibit increased arithmetic operation speeds by reducing the sizes of the output stages 230 may satisfy the above-described needs.

In addition, in the MDAC, when the analog input signal VIN is reduced to simply satisfy the condition 2, signal power may be reduced in proportion to the square of the analog input signal ($VIN^2$). In order to secure a signal-to-noise (SN) ratio representing conversion accuracy, it may be necessary to reduce thermal noise (kT/C). As a result, a capacitance group may need to be increased in proportion to the square of the analog input signal ($VIN^2$). The increase of the capacitance group may induce an increase in a retardation time (TCL1) due to an output capacitance (CL1) of a capacitor element of the MDAC.

Therefore, according to the embodiments, the sizes (a gate width and a gate length) of the PMOSFETs 231 and 232 of the output stage 230 are reduced based on the condition 1, and the operating speeds are improved by decreasing the parasitic capacitances Cpo to cause the operational amplifiers 200A and the like to operate in the linear areas based on the condition 2.

Finally, a description is given, with reference to FIGS. 24A to 24E, of an analog to digital converter (ADC) cell 500 serving as a stage 2 (STG-2) when an analog to digital converter (ADC) cell 300 according to the embodiment is utilized as a stage 1 (STG-1).

Figure 24A:
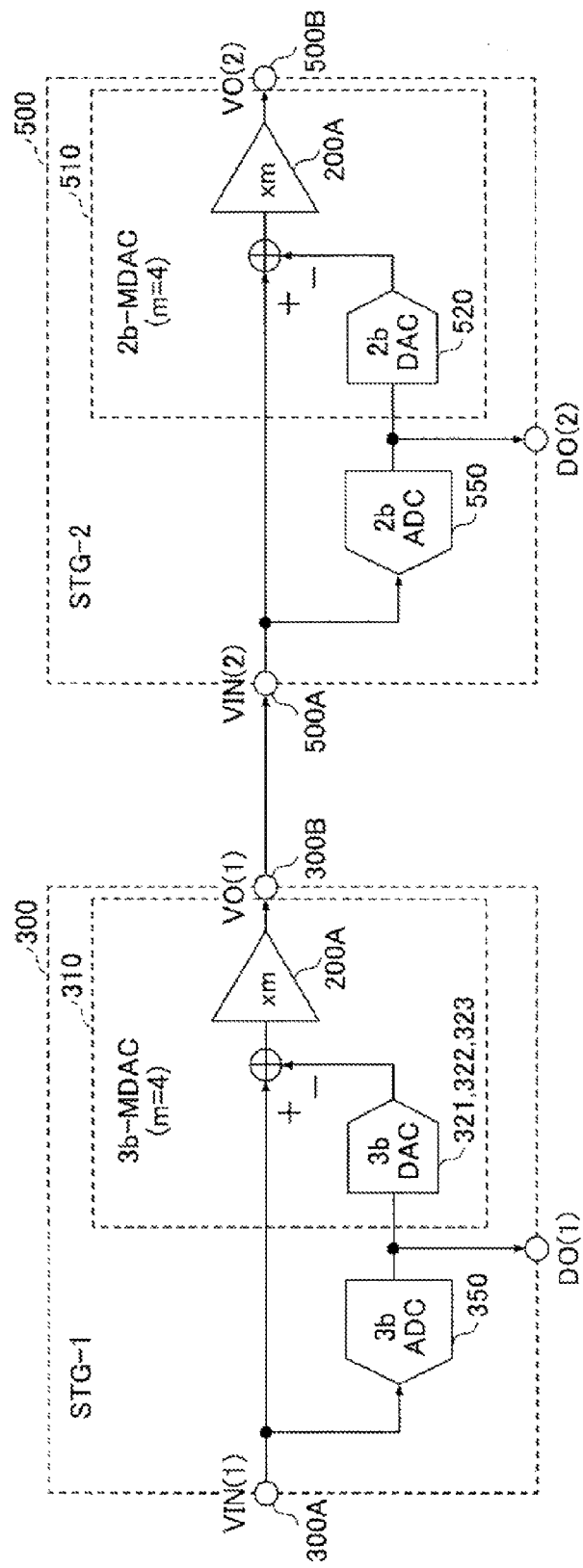
FIGS. 24A to 24E are diagrams illustrating an ADC cell 500 according to an embodiment having the ADC cell 300 according to an embodiment of a previous stage.
Figure 24B:
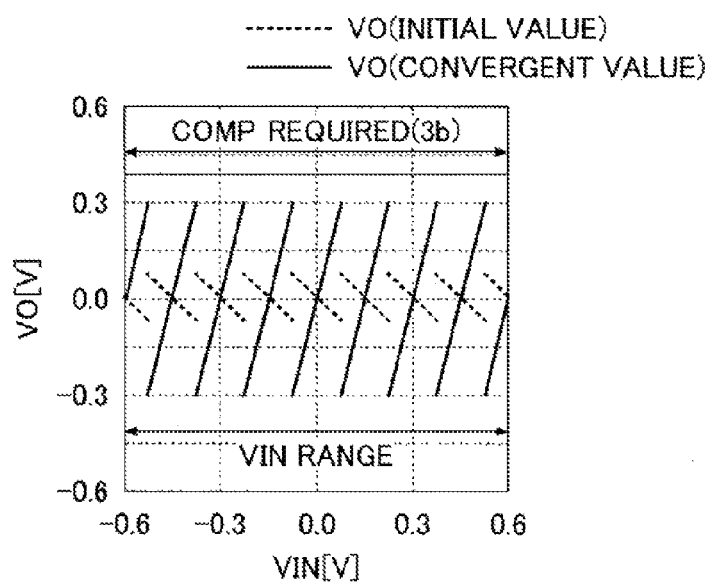
Figure 24C:
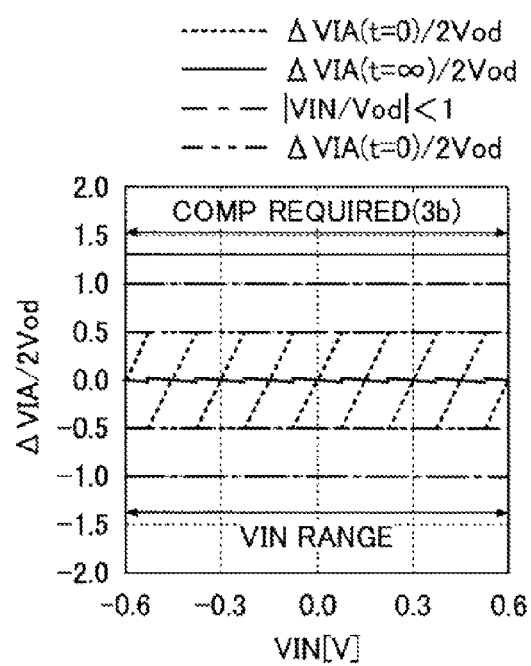
Figure 24D:
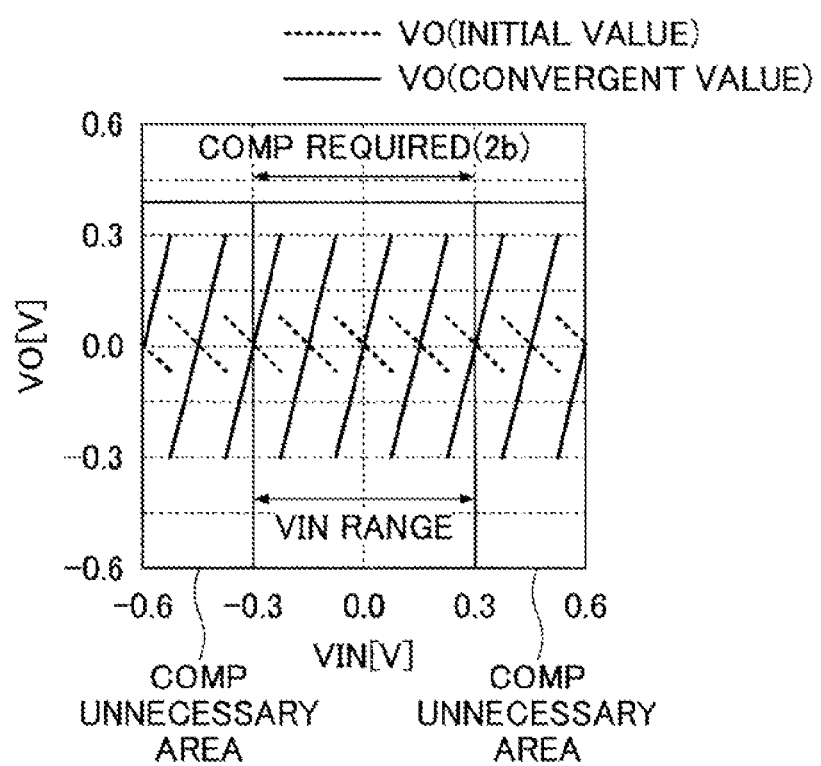
Figure 24E:
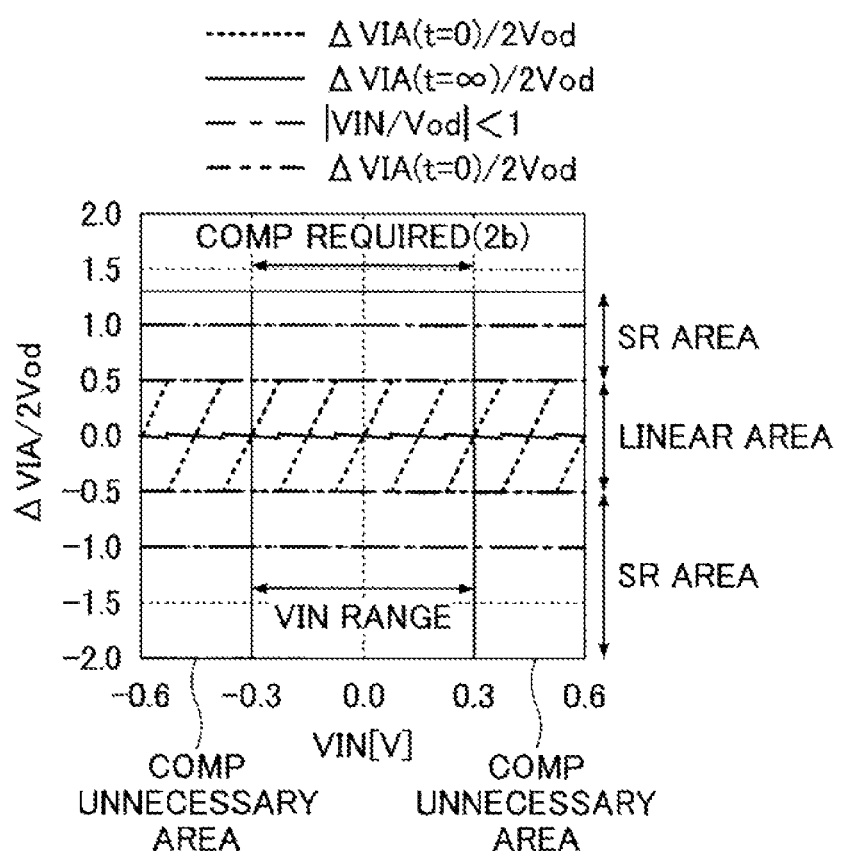

FIGS. 24A to 24E are diagrams illustrating applied examples of the ADC cell 300 according to the embodiments. FIG. 24A is a diagram illustrating a circuit configuration of the ADC cell 300, FIG. 24B illustrates input-output properties of the 3b-MDAC 310 according to the embodiment, and FIG. 24C illustrates ΔVIA/2 Vod properties corresponding to an analog input signal VIN of the 3b-MDAC 310 according to the embodiment. FIG. 24D illustrates input-output properties of the 2b-MDAC 510 contained in the ADC cell 500 connected to a subsequent stage of the ADC cell 300, and FIG. 24E illustrates ΔVIA/2 Vod properties corresponding to an analog input signal VIN of the 2b-MDAC 510.

As illustrated in FIG. 24A, an input terminal 500A of the ADC cell 500 is connected to an output terminal 300B of the ADC cell 300. The ADC cell 500 includes a 2b (2 bit)-MDAC 510, a 2b-DAC 520, a 2b-ADC 550, and an operational amplifier 200A.

As illustrated in FIG. 24B, an input range (a VIN range) of the MDAC 310 is −0.6 V to +0.6 V, and an output range (VO) is −0.3 V to +0.3 V. These ranges are properties identical to those illustrated in FIG. 22A. In order to acquire the output range (−0.3 V≤VO≤+0.3 V) from the input range (−0.6 V≤VIN≤+0.6 V), a 3b comparator (COMP(3b)) may be required.

Further, as illustrated in FIG. 24C, ΔVIA/2 Vod corresponding to the analog input signal VIN of the MDAC 310 has an input range (a VIN range) of −0.6 V to +0.6 V, and the ΔVIA/2 Vod is −0.5 V to +0.5 V. In order to acquire the output range (−0.5 V≤ΔVIA/2 Vod≤+0.5 V) from the input range (−0.6 V≤VIN+0.6 V), a 3b comparator (COMP(3b)) may be required.

Thus, in the stage 1 (STG-1) of the ADC cell 300, the output range (VO) is limited to −0.3 V to +0.3 V.

Then, the output of the ADC cell 300 is supplied from the output terminal 300B of the ADC cell 300 to the input terminal 500A of the ADC cell 500.

Accordingly, as illustrated in FIG. 24D, since the input-output properties of the 2b-MDAC 510 contained in the ADC cell 500 indicate that the input range (VIN range) is limited to a range of −0.3 V to +0.3 V, the input range (VIN range) of −0.3 V to +0.3 V may be converted by utilizing the 2b-comparator, and it may be unnecessary to consider input ranges −0.3 V<VIN and +0.3<VIN. This is because an input range (a VIN range) of the ADC cell 500 is limited to a range of −0.3 V to +0.3 V.

Thus, as illustrated in FIG. 24E, in the ΔVIA/2 Vod properties corresponding to the analog input signal VIN of the MDAC 510, an input range (a VIN range) may be limited to a range of −0.3 V≤ΔVIA/2 Vod≤+0.3 V, which may correspond to the linear area.

As described above, it may be satisfactory that a configuration of the stage 2 (STG-2) of the ADC cell 500 subsequently connected to the ADC cell 300 according to the embodiment include the 2b (2 bit)-MDAC 510, the 2b-DAC 520, the 2b-ADC 550, and an operational amplifier 200A.

According to the disclosed embodiments, there is provided an operational amplifier, an analog arithmetic circuit, and an analog to digital converter that are capable of reducing a size of an output stage.

So far, the preferred embodiments of the operational amplifier, the analog arithmetic circuit, and the analog to digital converter are described. However, the invention is not limited to those specifically described embodiments thereof, and various modifications and alteration may be made without departing from the scope of the inventions described in the claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A folded cascode operational amplifier comprising:
a constant current source configured to output constant current;
a differential input stage connected to the constant current source, the differential input stage being configured to output apart of the constant current output from the constant current source as a differential current based on a voltage difference between a voltage input to an inverting input terminal and a voltage input to a non-inverting input terminal; and
an output stage connected parallel to the differential input stage with respect to the constant current source, the output stage being configured to output a remaining current as an output stage current, the remaining current being obtained by subtracting the differential current from the constant current output from the constant current source.

2. The folded cascode operational amplifier as claimed in claim 1, wherein
where $\Delta V$ is the voltage difference of the differential input stage, Idiff is the differential current, Iout is the output stage current, and Vod is an overdrive voltage of an input transistor of the differential input stage, the output stage satisfies a condition represented by $Ka=Iout/Idiff<1$, and a condition represented by $|\Delta V/2\, Vod|<1$.

3. The folded cascode operational amplifier as claimed in claim 1, wherein
the output stage includes a transistor having a size determined corresponding to the input transistor of the differential input stage such that the output stage satisfies the condition represented by $Ka=Iout/Idiff<1$.

4. The folded cascode operational amplifier as claimed in claim 1, wherein
the output stage satisfies a condition represented by $|\Delta V/2\, Vod| \leq Ka$.

5. An analog arithmetic circuit comprising:
the folded cascode operational amplifier as claimed in claim 4;
a feedback element of the folded cascode operational amplifier; and
an input element having an input side and an output side, the input side receiving an analog signal and the output side being connected to an input terminal of the folded cascode operational amplifier.

6. An analog arithmetic circuit comprising:
an analog to digital converter element configured to convert an analog signal into a digital signal; and
the folded cascode operational amplifier as claimed in claim 1 to compare an output voltage of the analog to digital converter element with a reference voltage.

7. An analog to digital converter cell comprising:
a multiplying digital to analog converter having the folded cascode operational amplifier as claimed in claim 1; and
an analog to digital converter configured to convert an analog input signal into a digital signal to be supplied to the multiplying digital to analog converter.

8. A pipeline analog to digital converter comprising:
a plurality of the analog to digital converter cells as claimed in claim 6 are connected in a pipeline configuration.

* * * * *